(12) United States Patent
Wang et al.

(10) Patent No.: US 10,414,974 B2
(45) Date of Patent: Sep. 17, 2019

(54) CHEMICALLY CODED QUANTUM EMITTERS AND PHOTOCHEMICAL METHODS OF CREATING SAME

(71) Applicants: YuHuang Wang, Laurel, MD (US); Xiaojian Wu, College Park, MD (US); Hyejin Kwon, Greenbelt, MD (US); Mijin Kim, Silver Spring, MD (US)

(72) Inventors: YuHuang Wang, Laurel, MD (US); Xiaojian Wu, College Park, MD (US); Hyejin Kwon, Greenbelt, MD (US); Mijin Kim, Silver Spring, MD (US)

(73) Assignee: University of Maryland, College Park, College Park, MD (US)

( * ) Notice: Subject to any disclaimer, the term of this patent is extended or adjusted under 35 U.S.C. 154(b) by 0 days.

(21) Appl. No.: 15/990,648

(22) Filed: May 27, 2018

(65) Prior Publication Data

US 2018/0265779 A1 Sep. 20, 2018

Related U.S. Application Data

(63) Continuation-in-part of application No. 15/590,397, filed on May 9, 2017, now Pat. No. 9,983,058.

(60) Provisional application No. 62/333,372, filed on May 9, 2016, provisional application No. 62/595,368, filed on Dec. 6, 2017.

(51) Int. Cl.
| | |
|---|---|
| *C09K 11/65* | (2006.01) |
| *C09K 11/08* | (2006.01) |
| *C09K 11/06* | (2006.01) |
| *B82Y 10/00* | (2011.01) |
| *B82Y 15/00* | (2011.01) |
| *H01L 51/00* | (2006.01) |
| *B82Y 40/00* | (2011.01) |

(52) U.S. Cl.
CPC .............. *C09K 11/65* (2013.01); *B82Y 10/00* (2013.01); *B82Y 15/00* (2013.01); *C09K 11/06* (2013.01); *C09K 11/0827* (2013.01); *H01L 51/0048* (2013.01); *B82Y 40/00* (2013.01)

(58) Field of Classification Search
USPC ....................................................... 250/504 R
See application file for complete search history.

(56) References Cited

U.S. PATENT DOCUMENTS

| | | | |
|---|---|---|---|
| 8,803,094 B2 | 8/2014 | Leeds et al. | |
| 8,980,216 B2* | 3/2015 | Wang | C07C 57/40 |
| | | | 423/447.1 |
| 9,983,058 B2* | 5/2018 | Wang | G01J 3/108 |

OTHER PUBLICATIONS

Wilson; et.al, "Electrical Monitoring of sp3 Defect Formation in Individual Carbon Nanotubes", The Journal of Physical Chemistry C, Jan. 15, 2016, pp. 1971-1976 (Year: 2016).*
Aharonovich et al. (2016) "*Solid-State Single-Photon emitters*" Nature Photonics 10:631-641.
Akizuki, N. et al. (2015) "*Efficient near-infrared up-conversion photoluminescence in carbon nanotubes,*" Nat. Commun. 6:8920:1-6.

(Continued)

*Primary Examiner* — Phillip A Johnston
(74) *Attorney, Agent, or Firm* — William C. Schrot; AuerbachSchrot LLC

(57) ABSTRACT

The present invention relates to quantum emitters and photochemical methods of creating such emitters, including semiconductor hosts comprising chemically incorporated fluorescent defects.

27 Claims, 38 Drawing Sheets
(6 of 38 Drawing Sheet(s) Filed in Color)
Specification includes a Sequence Listing.

(56) References Cited

OTHER PUBLICATIONS

Alivisatos, A.P. (1996) "Semiconductor clusters, nanocrystals, and quantum dots," Science 271:933-937.
Ao, G. et al. (2014) "DNA-Controlled Partition of Carbon Nanotubes in Polymer Aqueous Two-Phase Systems," J. Am. Chem. Soc. 136(29):10383-10392.
Artem, R.C. et al. (1996)"The problem of the quantitative evaluation of the inductive effect: correlation analysis," Russ. Chem. Rev. 65:641 (Abstract Only).
Bachilo, S.M. (2002) "Structure Assigned Optical Spectra of Single-Walled Carbon Nanotubes," Science 298(5602):2361-2366.
Brozena, A.H. et al. (2014) "Controlled defects in semiconducting carbon nanotubes promote efficient generation and luminescence of trions," ACS Nano 8(5):4239-4247.
Capaz, R.B. et al. (2006) "Diameter and chirality dependence of exciton properties in carbon nanotubes," Phys. Rev. B 74, 121401 (2006).
Chan & Nie (1998) "Quantum dot bioconjugates for ultrasensitive nonisotopic detection," Science 281:2016-2018.
Charton et al. (1960) "The application of the hammett equation to ortho-substituted benzene reaction series" J. Chem. 38:2493.
Chiu, C.F. et al. (2017) "Defect-Induced Near-Infrared Photoluminescence of Single-Walled Carbon Nanotubes Treated with Polyunsaturated Fatty Acids" J. Am.Chem. Soc. 139(13):4859-4865.
Cognet et al. (2007) Stepwise Quenching of Exciton Fluorescence in Carbon Nanotubes by Single Molecule Reactions Science 316:1465-1468.
De Blauwe et al. (2010) Combined experimental and ab initio study of the electronic structure of narrow-diameter sing-wall carbon nanotubes with predominant (6,4),(6,5) Phys. Rev. 82:125444.
Deng, S. et al. (2011) "Confined propagation of covalent chemical reactions on single-walled carbon nanotubes," Nat. Commun. 2.
Dresselhaus, M.S. et al. (2007) "Raman Spectroscopy of Carbon Nanotubes in 1997 and 2007," J. Phys. Chem. C 111:17887-17893.
Erwin, S.C. et al. (2005) "Doping semiconductor nanocrystals," Nature 436:91-94.
Ghosh, S. et al. (2010) "Oxygen doping modifies near-infrared band gaps in fluorescent single-walled carbon nanotubes," Science 330:1656-1659.
Goldsmith et al. (2007) "Conductance-controlled point functionalization of single-walled carbon nanotubes," Science 315:77-81.
Gruber, A. et al. (1997) "Scanning confocal optical microscopy and magnetic resonance on single defect centers," Science 276:2012-2014.
Hansch et al. (1977) "Substituent constants for correlation analysis" J. Medi. Chem. 20:304-306.
Hansch, C. et al. (1991) "A survey of Hammett substituent constants and resonance and field parameters," Chem. Rev. 91:165-195.
Hartmann et al. (2016) "Photoluminescence Dynamics of Aryl sp(3) Defect States in Single-Walled Carbon Nanotubes" ACS Nano 10(9):8355-8365.
He et al. (2017) "Tunable room-temperature single photon emission at telecom wavelengths from sp3 defects in carbon nanotubes" Nat. Photonics 11:577-583.
He, X. et al. (2017) "Low-Temperature Single Carbon Nanotube Spectroscopy of sp3 Quantum Defects" ACS Nano 11(11):10785-10796.
Heller, D.A. et al. (2006) "Optical Detection of DNA Conformational Polymorphism on Single-Walled Carbon Nanotubes," Science 311:508-511.
Hertel et al. (2010) "Diffusion limited photoluminescence quantum yields in 1-D semiconductors: single-wall carbon nanotubes" ACS Nano 4(12): 7161-7168.
Hong et al. (2015) "Carbon Nanomaterials for Biological Imaging and Nanomedicinal Therapy" Chem Rev. 115(19):10816-10906.
Hong, G. et al. (2012) "Multifunctional in vivo vascular imaging using near-infrared II fluorescence," Nat. Med. 18:1841-1846.

Kamat, P.V. (2008) "Quantum dot solar cells. Semiconductor nanocrystals as light harvesters," J. Phys. Chem. C 112:18737-18753.
Koefoed et al. (2017) "Covalent Modification of Glassy Carbon Surfaces by Electrochemical Grafting of Aryl Lodides" Langmuir 33(13): 3217-3222.
Kropp, P.J. (1984) "Photobehavior of alkyl halides in solution: radical, carbocation, and carbene intermediates," Acc. Chem. Res. 17:131-137.
Kwon et al. (2015) "Optical Probing of Local pH and Temperature in Complex Fluids with Covalently Functionalized, Semiconducting Carbon Nanotubes" J. Phys. Chem. C.119(7):3733-3739.
Kwon et al. (2016) "Molceularly Tunable Fluoresent Quantum Defects," J. Am. Chem. Soc. 138(21):6878-6885.
Liang, F. et al. (2004) "A Convenient Route to Functionalized Carbon Nanotubes," Nano Lett. 4:1257-1260.
Liu, H. et al. (2011) "Large-scale single-chirality separation of single-wall carbon nanotubes by simple gel chromatography," Nat. Commun. 2:309:1-8.
Ma, X. et al.(2014) "Electronic structure and chemical nature of oxygen dopant states in carbon nanotbues" ACS Nano 8:10782.
Miyauchi et al. (2013) "Brightening of excitons in carbon nanotubes on demensionality modification" Nat. Photonics 7:715-719.
Ng, A.L. et al. (2017) "Laser Lithography of a Tube-in-a-Tube Nanostructure" ACS Nano 11(3): 3320-3327.
O'Connell, M.J. (2002) "Band Gap Fluorescence from Individual Single-Walled Carbon Nanotubes," Science 297:593-596.
Piao, Y.M. et al. (2013) "Brightening of carbon nanotube photoluminescence through the incoporation of sp3 defects," Nat. Chem. 5:840-845.
Powell et al. (2016) "Optical Excitation of Carbon Nanotubes Drives Localized Diazonium Reactions" J. Phys. Chem. Lett. 7(18):3690-3694.
Powell et al. (2017) "Chirality-Selective Functionalization of Semi-conducting Carbon Nanotubes with a Reactivity-Switchable Molecule" J. Am. Chem. Soc. 139(36): 12533-12540.
Rossetti, R. et al. (1983) "Quantum size effects in the redox potentials, resonance Raman spectra, and electronic spectra of cadmium sulfide crystallites in aqueous solution," J. Chem. Phys. 79:1086-1088.
Sanchez-Valencia, J.R. e et al. (2014) "Controlled synthesis of single-chirality carbon nanotubes," Nature 512:61-64.
Shiraki et al. (2016) "Near infrared photoluminescence modulation of single-walled carbon nanotubes based on a molecular recognition approach" Chem. Comm. Cambridge, England 52(88)12972-12975.
Shiraki et al (2017) "Near Infrared Photoluminescence Modulation by Defect Site Design Using Aryl Isomers in Locally Functionalized Single-Walled Carbon Nanotubes," Chem. Commun. 53:12544-12547.
Shirasaki, Y. et al. (2013) "Emergence of colloidal quantum-dot light-emitting technologies," Nat. Photon. 7:13-23.
Tomasi et al. (1999) The IEF version of the PCM solvation method: an overview of a new method addressed to sudy molecular solutes at the QM ab initio level 464(1-3):211-226.
Tu, X. et al. (2009) "DNA sequence motifs for structure-specific recognition and separation of carbon nanotubes," Nature 460:250-253.
Wang et al. (2007) "Temperature and pH-responsive single-walled carbon nanotube despersions" Nano Letters 7(6):1480-1484.
Wang et al. (2017) "Optically Triggered Melting of DNA on Individual Semiconducting Carbon Nanotubes" Angrew. Chem. Int. Engl. 56(32):9326-9330.
Wang, F. et al. (2005) "The Optical Resonances in Carbon Nanotubes Arise from Excitons" Science 308:838-841.
Wu et al. (2018) "Photochemical Creation of Fluorescent Quantum Defects in Semiconducting Carbon Nanotube Hosts" Angew. Chem. 130:656-661.
Xiao, Z. et al. (2013) "Radical Addition of Perfiuoroalkyl Iodides to Alkenes and Alkynes Initiated by Sodium Dithionite in an Aqueous Solution in the Presence of a Novel Fluorosurfactant," Chin. J. Chem. 31:939 (Abstract Only).

(56) References Cited

OTHER PUBLICATIONS

Yin, Y. & Alivisatos, A.P. (2005) "Colloidal nanocrystal synthesis and the organic-inorganic interface," Nature 437:664-670.
Zhang, C.P. et al. (2012) "Progress in fluoroalkylation of organic compounds via sulfinatodehalogenation initiation system," Chem. Soc. Rev. 41:4536-4559.
Zhang, Y. et al. (2013) "Propagative Sidewall Alkylcarboxylation that Induces Red-Shifted Near-IR Photoluminescence in Single-Walled Carbon Nanotubes," J. Phys. Chem. Lett. 4:826-830.
Zheng et al. (2004) "Solution Redox Chemistry of Carbon Nanotubes" J. Am. Chem. Soc. 126(47):15490-15494.

\* cited by examiner

| R-(6,5)-SWCNT | $E_{11}$ (nm) | $E_{11}^-$ (nm) | $E_{11}^- - E_{11}$ (meV) | $\sigma^*$ (ref) | $\sigma^*$ (calc) |
|---|---|---|---|---|---|
| I-CF$_3$ | 981 | 1158 | 193 | 0.44 | 4.4766 |
| I-CF$_2$CF$_2$CF$_2$CF$_3$ | 983 | 1158 | 191 | 0.44 | 4.4766 |
| I-CF$_2$CF$_2$CF$_2$CF$_2$CF$_2$CF$_3$ | 982 | 1158 | 192 | - | 4.8668 |
| I-CF$_2$CF$_2$CF$_2$CF$_2$CF$_2$CF$_2$CF$_2$CF$_3$ | 982 | 1156 | 190 | - | 5.1057 |
| I-CH$_2$CH$_2$CF$_2$CF$_2$CF$_2$CF$_2$CF$_2$CF$_3$ | 982 | 1133 | 168 | - | 1.0858 |
| I-CH$_2$CH$_2$CF$_2$CF$_2$CF$_2$CF$_2$CF$_2$CF$_2$CF$_2$CF$_3$ | 983 | 1137 | 171 | - | 1.3264 |
| I-CH$_2$CH$_2$CH$_2$CH$_3$ | 980 | 1093 | 131 | 0.01 | -0.6952 |
| I-CH$_2$CH$_2$CH$_2$CH$_2$CH$_2$CH$_3$ | 981 | 1096 | 133 | 0.03 | -0.7745 |

SEQUENCE LISTING

<160> NUMBER OF SEQ ID NOS: 5

<210> SEQ ID NO 1

```
<211> LENGTH: 12
<212> TYPE: DNA
<213> ORGANISM: Artificial Sequence
<220> FEATURE:
<223> OTHER INFORMATION: synthetically generated polynucleotide

<400> SEQUENCE: 1
ttatattata tt                                                              12

<210> SEQ ID NO 2
<211> LENGTH: 12
<212> TYPE: DNA
<213> ORGANISM: Artificial Sequence
<220> FEATURE:
<223> OTHER INFORMATION: synthetically generated polynucleotide (n is
      5-iododexoyuridine (5I-dU))
<220> FEATURE:
<221> NAME/KEY: misc_feature
<223> OTHER INFORMATION: n is 5-IododexoyUridine (5I-dU)

<400> SEQUENCE: 2
ttanatnata tt                                                              12

<210> SEQ ID NO 3
<211> LENGTH: 10
<212> TYPE: DNA
<213> ORGANISM: Artificial Sequence
<220> FEATURE:
<223> OTHER INFORMATION: synthetically generated polynucleotide (n is
      5-iododexoyuridine (5I-dU))
<220> FEATURE:
<221> NAME/KEY: misc_feature
<223> OTHER INFORMATION: n is 5-IododexoyUridine (5I-dU)

<400> SEQUENCE: 3 gttgtngtng                                                                 10

<210> SEQ ID NO 4
<211> LENGTH: 13
<212> TYPE: DNA
<213> ORGANISM: Artificial Sequence
<220> FEATURE:
<223> OTHER INFORMATION: synthetically generated polynucleotide (n is
      5-iododexoyuridine (5I-dU))
<220> FEATURE:
<221> NAME/KEY: misc_feature
<223> OTHER INFORMATION: n is 5-IododexoyUridine (5I-dU)

<400> SEQUENCE: 4
ttnatttant tat                                                             13

<210> SEQ ID NO 5
<211> LENGTH: 14
<212> TYPE: DNA
<213> ORGANISM: Artificial Sequence
<220> FEATURE:
<223> OTHER INFORMATION: synthetically generated polynucleotide (n is
      5-iododexoyuridine (5I-dU))
<220> FEATURE:
<221> NAME/KEY: misc_feature
<223> OTHER INFORMATION: n is 5-IododexoyUridine (5I-dU)

<400> SEQUENCE: 5
tnattatnat tgtt                                                            14
```

CHEMICALLY CODED QUANTUM EMITTERS AND PHOTOCHEMICAL METHODS OF CREATING SAME

CROSS-REFERENCE TO RELATED APPLICATIONS AND CLAIM TO PRIORITY

This application is based on U.S. Provisional Patent Application Ser. No. 62/595,368, filed Dec. 6, 2017, and a continuation-in-part of U.S. application Ser. No. 15/590,397, filed May 9, 2017, which application is based on U.S. Provisional Patent Application Ser. No. 62/333,372, filed May 9, 2016, titled "Molecularly Tunable Near-Infrared Emitters and Methods of Creating the Same," all of which applications are incorporated herein by reference in their entireties and to which priority is claimed.

STATEMENT REGARDING FEDERALLY SPONSORED RESEARCH OR DEVELOPMENT

This invention was made with government support by the National Science Foundation (NSF) under CHE1507974 and CHE1055514; by the National Institutes of Health (NIH) under 1R01GM114167; and by the Air Force Office of Scientific Research (AFOSR) under FA95501610150. The United States government has certain rights in this invention.

REFERENCE TO SEQUENCE LISTING

This application includes one or more Sequence Listings pursuant to 37 C.F.R. 1.821 et seq., which are disclosed in computer-readable media (file name: 2105_0066US2_SeqList_ST25.txt, created May 25, 2018, and having a size of 1,839 bytes), which file is herein incorporated by reference in its entirety.

FIELD OF THE INVENTION

The present invention relates to quantum emitters and photochemical methods of creating such emitters, including semiconductor hosts comprising chemically incorporated fluorescent defects.

BACKGROUND OF THE INVENTION

The excited states of many semiconducting nanostructures, such as carbon nanotubes (CNTs), are characterized by excitons, electron-hole pairs bound by Coulomb interactions (Wang, F. et al. (2005) "*The Optical Resonances in Carbon Nanotubes Arise from Excitons*" Science 308:838-841). Excitons are hydrogen-atom-like quasi-particles, each carrying a quantum of electronic excitation energy. An exciton can return to the ground state by emitting a photon, producing photoluminescence (PL), or by falling into a "dark" state from which the energy is lost as heat. The ability to control the fate of excitons and their energy is crucial to imaging (Hong, G. et al. (2012) "*Multifunctional in vivo vascular imaging using near-infrared II fluorescence*," Nat. Med. 18:1841-1846; Chan, W. C. W. & Nie, S. (1998) "*Quantum dot bioconjugates for ultrasensitive nonisotopic detection*," Science 281:2016-2018), sensing (Heller, D. A. et al. (2006) "*Optical Detection of DNA Conformational Polymorphism on Single-Walled Carbon Nanotubes*," Science 311:508-511), photovoltaics (Kamat, P. V. (2008) "*Quantum dot solar cells. Semiconductor nanocrystals as light harvesters*," J. Phys. Chem. C 112:18737-18753), lighting and display (Shirasaki, Y. et al. (2013) "*Emergence of colloidal quantum-dot light-emitting technologies*," Nat. Photon. 7:13-23), and many other electronic applications.

Over the last few decades, two primary approaches have been developed to tailor the exciton properties within a nanocrystal—quantum confinement and doping. Quantum confinement has motivated the development of many synthetic approaches that control the size and shape of nanocrystals, and consequently their electronic and optical properties (Rossetti, R. et al. (1983) "*Quantum size effects in the redox potentials, resonance Raman spectra, and electronic spectra of cadmium sulfide crystallites in aqueous solution*," J. Chem. Phys. 79:1086-1088; Alivisatos, A. P. (1996) "*Semiconductor clusters, nanocrystals, and quantum dots*," Science 271:933-937; Yin, Y. & Alivisatos, A. P. (2005) "*Colloidal nanocrystal synthesis and the organic-inorganic interface*," Nature 437:664-670). Doping modifies the electronic structure of the host crystal and the examples include nitrogen-vacancy in diamond (Gruber, A. et al. (1997) "*Scanning confocal optical microscopy and magnetic resonance on single defect centers*," Science 276:2012-2014) and metal ion-doped nanocrystals (Erwin, S. C. et al. (2005) "*Doping semiconductor nanocrystals*," Nature 436:91-94).

In the case of single-walled carbon nanotubes (SWCNTs), the excitonic properties depend on both the diameter and chiral angle of each nanotube crystal, collectively known as chirality, which may be denoted by a pair of integers (n,m) (see O'Connell, M. J. (2002) "*Band Gap Fluorescence from Individual Single-Walled Carbon Nanotubes*," Science 297:593-596; Bachilo, S. M. (2002) "*Structure Assigned Optical Spectra of Single-Walled Carbon Nanotubes*," Science 298:2361-2366). It has recently been demonstrated that the optical properties of SWCNTs can be modified by doping with oxygen (Ghosh, S. et al. (2010) "*Oxygen doping modifies near-infrared band gaps in fluorescent single-walled carbon nanotubes*," Science 330:1656-1659) or by the incorporation of defects through diazonium chemistry (Piao, Y. et al. (2013) "*Brightening of carbon nanotube photoluminescence through the incorporation of sp3 defects*," Nat. Chem. 5:840-845). These defects can induce a new near-infrared emission (Ghosh, S. et al. (2010) "*Oxygen doping modifies near-infrared band gaps in fluorescent single-walled carbon nanotubes*," Science 330:1656-1659), brighten dark excitons (Piao, Y. et al. (2013) "*Brightening of carbon nanotube photoluminescence through the incorporation of sp3 defects*," Nat. Chem. 5:840-845), facilitate up conversion (anti-stoke shift) (Akizuki, N. et al. (2015) "*Efficient near-infrared up-conversion photoluminescence in carbon nanotubes*," Nat. Commun. 6), and stabilize trions at room temperature (Brozena, A. H. et al. (2014) "*Controlled defects in semiconducting carbon nanotubes promote efficient generation and luminescence of trions*," ACS Nano 8:4239-4247), thus making them particularly interesting for emergent photonic applications. However, these conventional methods for defect creation have thus far been bound by the extremely limited chemical and optical tunability. In particular, oxygen doping leads to mixed ether and epoxide structures, and diazonium chemistry works only for specific aryl groups and monovalent bonding, and has relatively low reaction rates. Moreover, it has been demonstrated that diazonium chemistry and oxidative reactions occur on a SWCNT sidewall at completely random atomic sites (see Goldsmith et al. (2007) "*Conductance-controlled point functionalization of single-walled carbon nanotubes*," Science 315:77-81); Cognet et al. (2007) "*Stepwise quenching of exciton fluorescence in carbon nanotubes by single-molecule reactions*," Science 316:

1465-1468). The covalent modification of even a single site utilizing such methodologies results in a substantial drop of electrical conductance (Goldsmith et al. (2007), *Conductance-controlled point functionalization of single-walled carbon nanotubes,*" Science 315:77-81) and stepwise quenching of exciton fluorescence in semiconducting nanotubes (Cognet et al. (2007), *Stepwise quenching of exciton fluorescence in carbon nanotubes by single-molecule reactions,*" Science 316:1465-1468). As such, prior methodologies utilizing defects pale in comparison with the large number of quantum dots that have been synthesized based on the quantum confinement effect. The use of defects for materials engineering has therefore not been achieved by such prior methodologies.

Accordingly, there is a need for new near-infrared emitters and synthetic approaches for creating such emitters that overcome some or all of the difficulties and limitations of conventional approaches.

SUMMARY OF THE INVENTION

The present invention relates to a new series of near-infrared emitters and a versatile new synthetic approach for creating near-infrared emitters from a single SWCNT material through molecular engineering of covalently attached surface functional groups. In accordance with disclosed methodologies, the synthesis of more than thirty new fluorescent nanostructures is demonstrated from SWCNTs of the same crystal structure by creating molecularly tunable fluorescent quantum defects in the $sp^3$ carbon lattice. Each of the new synthetic nanostructures may be viewed as a diamond-in-graphene structure reminiscent of an island in an electron sea.

In accordance with disclosed embodiments, the present invention relates to a method of synthesizing a near infrared emitter comprising the steps of: reacting a carbon nanostructure with a halogen-containing hydrocarbon precursor and thereby creating $sp^3$ defects in said carbon nanostructure, wherein covalent functionalization produces fluorescent defects that emit near-infrared radiation having wavelengths between about 800 nm and about 2500 nm. In some implementations, the $sp^3$ defects are created in a pristine carbon nanostructure during said reacting step.

In some embodiments, the carbon nanostructure is a carbon nanotube (CNT), e.g., a single-walled CNT (SWCNT). In some implementations, the CNT has a diameter of between about 0.5 nm and about 1.6 nm.

In some embodiments, the halogen-containing hydrocarbon precursor is a chlorine, a bromide, an iodide or a di-halide alkyl precursor. In some embodiments, the halogen-containing hydrocarbon precursor is a polymer containing the reactive halogen. In some implementations, the halogen-containing precursor is a polyoligonucleotide containing the reactive halogen.

In some embodiments, the halogen-containing hydrocarbon precursor is an alkyl halide. In some implementations, said reacting step further comprises combining said carbon nanostructure with sodium dithionite ($Na_2S_2O_4$), wherein the sodium dithionite activates the alkyl precursor.

In some embodiments, the halogen-containing hydrocarbon precursor is an iodide or di-halide aryl precursor. In some implementations, the method provides for exposing the carbon nanostructure and the aryl precursor to electromagnetic radiation having a wavelength(s) of between about 300 nm and about 1200 nm, wherein the wavelength(s) is resonant with the carbon nanostructures. The electromagnetic radiation activates the aryl precursor.

In some embodiments, the created $sp^3$ defects are selected from the group consisting of monovalent alkyl defects, divalent alkyl defects, monovalent aryl defects, and divalent aryl defects. In some implementations, the covalently functionalized carbon nanostructure is functionalized with an alkyl group or an aryl group. In some implementations, the covalently functionalized carbon nanostructure is functionalized with $—(CH_2)_n(CF_2)_mCF_3$, wherein n is an integer between 0 and 10, and wherein m is an integer between 0 and 10. In some implementations, the covalently functionalized carbon nanostructure is functionalized with $—(CH_2)_nCH_3$, wherein n is an integer between 0 and 17.

The present invention also relates to synthesized near-infrared emitters. In accordance with some embodiments, a synthetic near-infrared emitter comprises a carbon nanostructure comprising $sp^3$ defects in a carbon lattice thereof, which are created via reaction with a halogen-containing hydrocarbon precursor. A functional group(s) is covalently bonded to the $sp^3$ defects to produce fluorescent defects that emit near-infrared radiation having wavelengths between about 800 nm and about 2500 nm.

In some embodiments, the carbon nanostructure is a carbon nanotube (CNT), e.g., a SWCNT. In some embodiments, the CNT has a diameter of between about 0.5 nm and about 1.6 nm.

In some embodiments, the near-infrared emitter comprises a functional group is selected from the group consisting of a monovalent alkyl group, a divalent alkyl group, a monovalent aryl group, and a divalent aryl group. In some implementations, the functional group is $—(CH_2)_n(CF_2)_mX$, wherein n is an integer between 0 and 17, and wherein m is an integer between 0 and 17, and wherein X is CH3, CF3, NH2, N+(CH2CH3)2, or COOH. In some implementations, the functional group is $—(CH_2)_nCH_3$, wherein n is an integer between 0 and 10.

The present invention also relates to a quantum emitter comprising: a semiconductor host; and a fluorescent quantum defect incorporated into the semiconductor host via optically reacting the semiconductor host with a molecule comprising a photochemically activatable moiety that generates a radical that covalently bonds to the semiconductor host. In preferred embodiments, the quantum emitter comprises a plurality of fluorescent quantum defects that are spatially, chemically and/or electronically correlated in the semiconductor host.

In some embodiments, the semiconductor host is selected from the group consisting of a carbon nanotube (CNT), a graphene nanoribbon, and a carbon nitride. The carbon nanotube may be a single-walled carbon nanotube (SWCNT) or a double-walled carbon nanotube (DWCNT). The carbon nanotube may be a SWCNT selected from the group consisting of a (6,5)-SWCNT, a (10,6)-SWCNT, a (10,9)-SWCNT, a (10, 3)-SWCNT, a (6,4)-SWCNT, and a (7,5)-SWCNT.

In some embodiments, the molecule comprising a photochemically activatable moiety is a halide-containing molecule. The halide may iodine, bromine, or chlorine. In some embodiments, the molecule is an oligonucleotide, e.g., such as a DNA molecule or an RNA molecule. In preferred embodiments, the oligonucleotide comprises at least one 5-IododexoyUridine (5I-dU). In some implementations, the oligonucleotide comprises between 1 and about 1000 nucleotide residues, more preferably between 3 and about 100 nucleotide residues, e.g., between about 5 and about 20 nucleotide residues. In some embodiments the oligonucleotide comprises a sequence selected from the group consisting of: 5'-TTA (5I-dU)AT (5I-dU)AT ATT-3' (SEQ ID NO: 2); 5'-GTT GT(5I-dU) GT(5I-dU) G-3' (SEQ ID NO: 3); 5'-TT(5I-dU) ATT TA(5I-dU) TTA T-3' (SEQ ID NO: 4); or 5'-T(5I-dU)A TTA T(5I-dU) A TTG TT-3' (SEQ ID NO: 5).

The present invention is also directed to a photochemical method of synthesizing a quantum emitter, comprising the step of: irradiating a solution comprising a semiconductor host and a molecule comprising a photochemically activatable moiety, thereby exciting the semiconductor host and reducing the molecule to generate a radical, wherein the radical covalently bonds to the semiconductor host to create a fluorescent quantum defect thereon.

In some embodiments, the irradiation step comprises exposing the solution to radiation having a wavelength of between about 100 nm and about 1400 nm. In some implementations, the solution is irradiated with visible light. The visible light may have a wavelength of 565 nm, 765 nm, 892 nm, or 644 nm. In some implementations, solution is irradiated with radiation having a wavelength that resonates with an electronic transition(s) of the semiconductor host. In some implementations, the solution is irradiated with ultraviolet radiation or near-infrared radiation.

In some embodiments, the quantum emitter synthesized in accordance with disclosed methods comprises a plurality of fluorescent quantum defects in the semiconductor host. In some embodiments, the photochemical method comprises the step of exposing the solution to patterned radiation, thereby creating a spatially patterned array of fluorescent quantum defects in the semiconductor host.

In some embodiments, the molecule comprising a photochemically activatable moiety utilized in accordance with disclosed methods comprises at least one halide and aromatic moieties, and wherein the at least one halide is directly bonded to at least one of the aromatic moieties. In some implementations, the at least one halide is iodine, bromine, or chlorine. In some implementations, the aromatic moieties are benzene, aniline, nitrobenzene, or benzene sulfonic acid.

In some implementations, the molecule comprising a photochemically activatable moiety utilized in accordance with disclosed methods comprises at least one halide and aromatic heterocycles, and wherein the at least one halide is bonded to at least one of the aromatic heterocycles. In some implementations, the halide is iodine, bromine, or chlorine.

BRIEF DESCRIPTION OF THE DRAWINGS

The patent or application file contains at least one drawing/photograph executed in color. Copies of this patent or patent application publication with color drawing(s) will be provided by the Office upon request and payment of the necessary fee.

DETAILED DESCRIPTION OF EMBODIMENTS OF THE INVENTION

Figure 1:
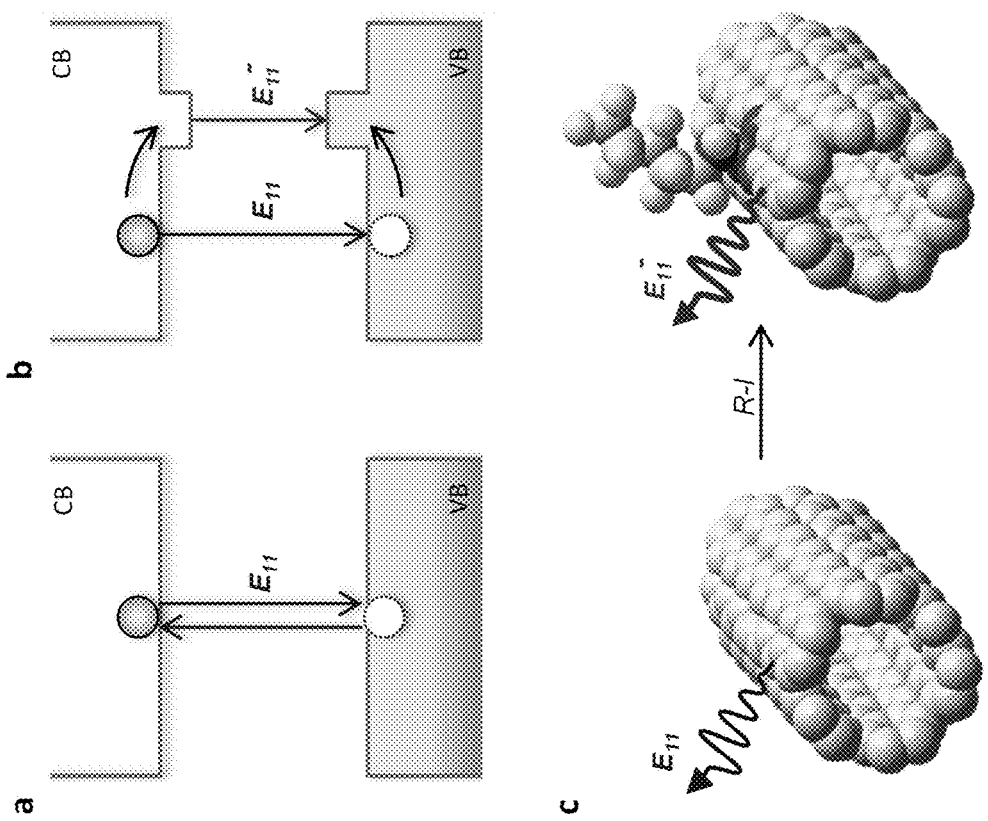
FIG. 1 illustrates a fluorescent quantum defect approach to material engineering as compared to a quantum confinement approach. Panel a illustrates a quantum confinement system, wherein the exciton wavefunction is confined as the particle size reaches the Bohr radius of the quasi-particle, lending the capability to control optical properties by size engineering. Panel b illustrates a quantum defect system in accordance with the present invention, wherein the mobile excitons are trapped and their optical properties controlled by molecular engineering of the trap. Panel c illustrates the creation of a fluorescent quantum defect by reacting a SWCNT semiconductor with an exemplary alkyl iodide (R-I).

The present invention relates to a new series of near-infrared emitters and a versatile new synthetic approach for creating near-infrared emitters from a single carbon nanostructure material, e.g., SWCNT, through molecular engineering of covalently attached surface functional groups (FIG. 1). Utilizing the disclosed methodologies, the synthesis of more than thirty new exemplary fluorescent nanostructures was achieved from SWCNTs of the same crystal structure by creating molecularly tunable fluorescent quantum defects in the sp³ carbon lattice. Each of the new synthetic nanostructures may be viewed as a diamond-in-graphene structure reminiscent of an island in an electron sea.

The present invention also relates to a class of quantum emitters, each of which contains a plurality of fluorescent defect sites that are incorporated into a semiconductor host with spatial, chemical and/or electronical correlations. Also disclosed are methods of synthesizing these light-emitting polymers by incorporating halide moieties within their structure and reacting them with carbon nanotube semiconductor hosts.

Fluorescent quantum defects are a new class of synthetic single-photon emitters with vast potential, e.g., for near-infrared imaging, chemical sensing, materials engineering, and quantum information processing. Such emitters can be synthetically created in solid-state hosts, such as semiconducting single-walled carbon nanotubes (SWCNTs), by covalently attaching organic functional groups (Piao, Y. et al. (2013) "*Brightening of carbon nanotube photoluminescence through the incorporation of sp3 defects,*" Nat. Chem 5(10):840-845; Kwon, H. et al. (2016) "*Molecularly Tunable Fluorescent Quantum Defects,*" J. Am. Chem. Soc. 138:6878-6885). These quantum defects produce localized potential wells that can efficiently capture mobile excitons and enable them to recombine radiatively (Piao, Y. et al. (2013) "*Brightening of carbon nanotube photoluminescence through the incorporation of sp3 defects,*" Nat. Chem 5(10): 840-845). It has recently been demonstrated that quantum defect emission energies are molecularly tunable depending on the chemical nature and bonding configuration of the covalently attached group (Kwon, H. et al. (2016) "*Molecularly Tunable Fluorescent Quantum Defects,*" J. Am. Chem. Soc. 138:6878-6885; Ma, X. et al. (2014) "*Electronic structure and chemical nature of oxygen dopant states in carbon nanotubes,*" ACS Nano 8:10782-10789; He, X. et al. (2017) "Low-Temperature Single Carbon Nanotube Spectroscopy of sp3 Quantum Defects." ACS Nano 10.1021/acsnano.7b03022).

As demonstrated herein, the synthetic creation of molecularly tunable fluorescent quantum defects in semiconducting single-walled carbon nanotube hosts may be optically directed via photochemical reactions. By exciting the host semiconductor with light that resonates with its electronic transition, halide-containing aryl groups covalently bond to the sp² carbon lattice. The introduced quantum defects generate bright photoluminescence that allows tracking of the reaction progress in situ. The reaction is independent of temperature but correlates strongly with the photon energy used to drive the reaction, indicating a photochemical mechanism rather than photo-thermal effects. The disclosed photochemical reactions provide for control of the synthesis of fluorescent quantum defects using light, and enable lithographic patterning of quantum emitters with electronic and molecular precision.

Beyond presenting a new class of tunable quantum light sources, these synthetic defects can also brighten dark excitons (Piao, Y. et al. (2013) "*Brightening of carbon nanotube photoluminescence through the incorporation of sp3 defects,*" Nat. Chem 5(10):840-845), facilitate upconversion (Akizuki, N. et al. (2015) "*Efficient near-infrared up-conversion photoluminescence in carbon nanotubes,*" Nat. Commun. 6:8920), stabilize trions (Brozena, A. H. et al. (2014) "*Controlled defects in semiconducting carbon nanotubes promote efficient generation and luminescence of trions,*" ACS Nano 8:4239-4247), and produce high purity single photons at telecomm wavelengths at room temperature (He, X. et al. (2017) "*Tunable room-temperature single photon emission at telecom wavelengths from sp3 defects in carbon nanotubes,*" Nat. Photonics 11:577-582). Fluorescent quantum defects therefore hold vast potential for near-infrared (IR) imaging (Hong, G. et al. (2015) "*Carbon Nanomaterials for Biological Imaging and Nanomedicinal Therapy,*" Chem. Rev. 115(19):10816-10906), optical sensing (Kwon, H. et al. (2015) "*Optical Probing of Local pH and Temperature in Complex Fluids with Covalently Func-* tionalized, Semiconducting Carbon Nanotubes," J. Phys. Chem. 119(7):3733-3739; Shiraki, T. et al. (2016) "*Near infrared photoluminescence modulation of single-walled carbon nanotubes based on a molecular recognition approach*," Chem. Commun. (Camb.) 52(88):12972-12975), and quantum information processing (Aharonovich, I. et al. (2016) "*Solid-state single photon emitters*," Nat. Photonics 10:631-641).

Developing ways to controllably introduce or pattern fluorescent quantum defects is thus important for such applications. Recent experiments have demonstrated that optical excitation of SWCNTs can induce local heating (Powell, L. R. et al. (2016) "*Optical Excitation of Carbon Nanotubes Drives Localized Diazonium Reactions*," J. Phys. Chem. Lett. 15(7):3690-3694; Chiu, C. F. et al. (2017) "*Defect-Induced Near-Infrared Photoluminescence of Single-Walled Carbon Nanotubes Treated with Polyunsaturated Fatty Acids*," J. Am. Chem. Soc. 139:4859; Wang, C. et al. (2017) "*Optically Triggered Melting of DNA on Individual Semiconducting Carbon Nanotubes*," Angew. Chem. Int. Ed. Engl. 56(32):9326-9330; Powell, L. R. et al. (2017) "*Chirality-Selective Functionalization of Semiconducting Carbon Nanotubes with a Reactivity-Switchable Molecule*," J. Am. Chem. Soc. 139(36):12533-12540; Ng. A. L. et al. (2017) "*Laser Lithography of a Tube-in-a-Tube Nanostructure*," ASC Nano. 11(3):3320-3327). This photothermal effect can significantly accelerate chemical reactions (Powell, L. R. et al. (2016) "*Optical Excitation of Carbon Nanotubes Drives Localized Diazonium Reactions*," J. Phys. Chem. Lett. 15(7):3690-3694), de-functionalize surface functional groups (Ng. A. L. et al. (2017) "*Laser Lithography of a Tube-in-a-Tube Nanostructure*," ASC Nano. 11(3):3320-3327) and makes it possible to selectively react a specific nanotube within a mixture (Powell, L. R. et al. (2017) "*Chirality-Selective Functionalization of Semiconducting Carbon Nanotubes with a Reactivity-Switchable Molecule*," J. Am. Chem. Soc. 139(36):12533-12540). However, because it is difficult to spatially confine the thermal effect, it is challenging to use this thermal effect for precise control of the reaction site at the molecular level.

Figure 24:
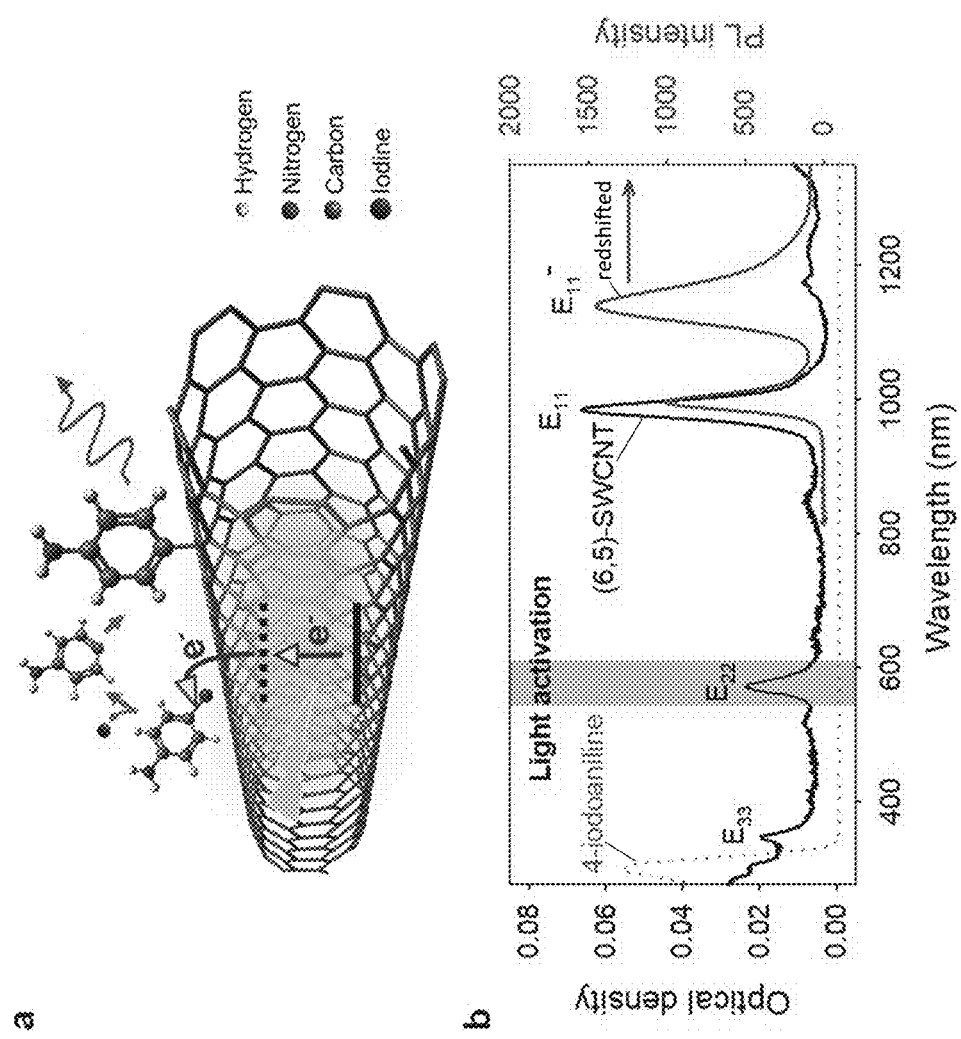
FIG. 24 illustrates fluorescent aryl defects in semiconducting SWCNTs. Panel a: Schematic representation of light activated arylation in a (6,5)-SWCNT. Absorption of light by the SWCNT generates a hot electron, which subsequently transfers to a 4-iodoaniline molecule, yielding an aryl radical that can bond to the carbon nanotube surface. Panel b: UV-vis-NIR absorption spectra of 4-iodoaniline (dotted line) and the pristine (6,5)-SWCNTs (solid line) in 1% sodium dodecyl sulfate-D$_2$O shows that the nanotube can be excited to the exclusion of 4-iodoaniline at the E$_{22}$ van Hove transition (~565 nm). The photoluminescence spectrum (gray line) of (6,5)-SWCNTs with aryl quantum defects features a redshifted emission, E$_{11}^-$.

In accordance with disclosed embodiments, a photochemical reaction is provided for creating molecularly tunable fluorescent quantum defects in semiconducting hosts (e.g., SWCNTs) with electronic controls. As demonstrated herein, reactions between an aryl halide and the nanotube can be triggered photochemically. The semiconducting nanotube is optically excited, reducing the aryl halide to a radical that covalently bonds to the nanotube host to create the fluorescent quantum defect (FIG. 24, Panel a). This photochemical reaction is nearly independent of solution temperature, but correlates strongly with the photon energy and fluence used to drive the reaction.

As used herein, the term "carbon nanostructure" refers to allotropic forms of carbon, with or without impurities, in the form of a single-walled or multi-walled tube, cylinder, sphere, crystal, sheet, rod, or other structure. In some embodiments, the carbon nanostructure is a carbon nanotube (CNT) having a generally cylindrical nanostructure. CNTs may be differentiated according to their chirality, diameter, wall number, and/or electrical properties. In some implementations, the CNT is a single-walled CNT (SWCNT). In other implementations, the CNT is a multi- or double-walled CNT (e.g., DWCNT). In some implementations, the CNT is a small diameter CNT (e.g., having a diameter of less than about 1 nm, or less than about 0.5 nm). In other implementations, that CNT is a large diameter CNT (e.g., having a diameter of more than about 1 nm, or more than about 2.0 nm). In some implementations, the CNT has a diameter of between about 0.5 nm and about 1.6 nm. A "covalently functionalized CNT" refers to a CNT having a surface functional group(s) attached to the carbon sidewall or lattice via a covalent bond.

The term "pristine carbon nanostructure" refers to a carbon nanostructure, e.g., a CNT, that has no observable surface modifications (except, e.g., at the nanotube ends of a CNT, as determined by Raman spectroscopy or other methods known in the art).

The term "substantially pure CNT" as used herein refers to a CNT or covalently functionalized CNT comprising more than about 80% of one type, and/or chirality and less than about 20% of other types and/or chiralities as established using conventional analytical methods, e.g., UV-vis-Near Infrared Spectroscopy, routinely used by those of skill in the art. In one embodiment, the amount of other types and/or chiralities in a substantially pure CNT or covalently functionalized CNT is less than about 20%, less than about 10%, less than about 5%, less than about 2%, less than about 1%, or less than about 0.5%.

The term "defect" as used herein refers to an irregularity in the bonding network or lattice of a carbon nanostructure. In some embodiments, the defect is a $sp^3$ defect.

The term "alkylating agent" as used herein refers to reagent capable of placing an alkyl group onto a nucleophilic site, including, but not limited to, organic halides.

In the case of semiconducting nanotubes with fluorescent defects, such structures can be viewed as hybrid quantum systems that allow excitation energy (carried by the exciton) to be channeled along a one-dimensional (1D) antenna and then harvested using a zero-dimensional (0D) funnel. Compared with quantum confinement, which controls the optical and electronic gap by size engineering, the fluorescent defects in SWCNTs create local potential wells that can be chemically tailored with superior molecular-control as shown herein. To recognize their molecular nature and the fact that the local potential well is a result of defect-induced splitting of frontier orbitals, the defects may be referred to herein as fluorescent quantum defects. Furthermore, unlike atomic color-center dopants, the defect-inducing surface functional groups are themselves non-emitting and readily accessible chemically, thereby affording unprecedented molecular control and engineering flexibility as compared to prior methodologies.

In accordance with disclosed embodiments, the molecularly tunable fluorescent quantum defects are achieved by a versatile new chemistry that allows covalent attachment of bromine or iodine-containing hydrocarbon precursors to the $sp^2$ carbon lattice through highly predictable C—C bonding. The reaction occurs in aqueous solution upon mixing an alkyl halide with nanotubes in the presence of sodium dithionite ($Na_2S_2O_4$) which acts as a mild reductant (see Zhang, C.-P. et al. (2012) "*Progress in fluoroalkylation of organic compounds via sulfinatodehalogenation initiation system*," Chem. Soc. Rev. 41:4536-4559). We note that sidewall alkylation can occur under extreme conditions, such as in the Billups-Birch reaction in which solvated electrons in liquid ammonia are required (Liang, F. et al. (2004) "*Convenient Route to Functionalized Carbon Nanotubes*," Nano Lett. 4:1257-1260; Deng, S. et al. (2011) "*Confined propagation of covalent chemical reactions on single-walled carbon nanotubes*," Nat. Commun. 2). In contrast, the disclosed methodologies are significantly more versatile because molecularly tunable fluorescent quantum defects can be created with highly predictable C—C bonding points from virtually any iodine-containing hydrocarbon precursor. Notably, this exciton-tailoring chemistry is not limited to the creation of monovalent alkyl defects. Rather, both monovalent and divalent defects can be created by reacting SWCNTs with respective iodide or di-iodide alkyl or aryl precursors. In contrast to alkyl iodides, which provide for activation by sodium dithionite, aryl iodides alone can react with SWCNTs by resonantly exciting the nanotubes with visible light. Furthermore, the aqueous medium allows for in situ probing of the evolution of sidewall alkylation and provides a level of control that was previously unattainable (Ghosh, S. et al. (2010) "*Oxygen doping modifies near-infrared band gaps in fluorescent single-walled carbon nanotubes*," Science 330:1656-1659; Piao, Y. M. et al. (2013) "*Brightening of carbon nanotube photoluminescence through the incorporation of sp3 defects*," Nat. Chem. 5:840-845).

Figure 3:
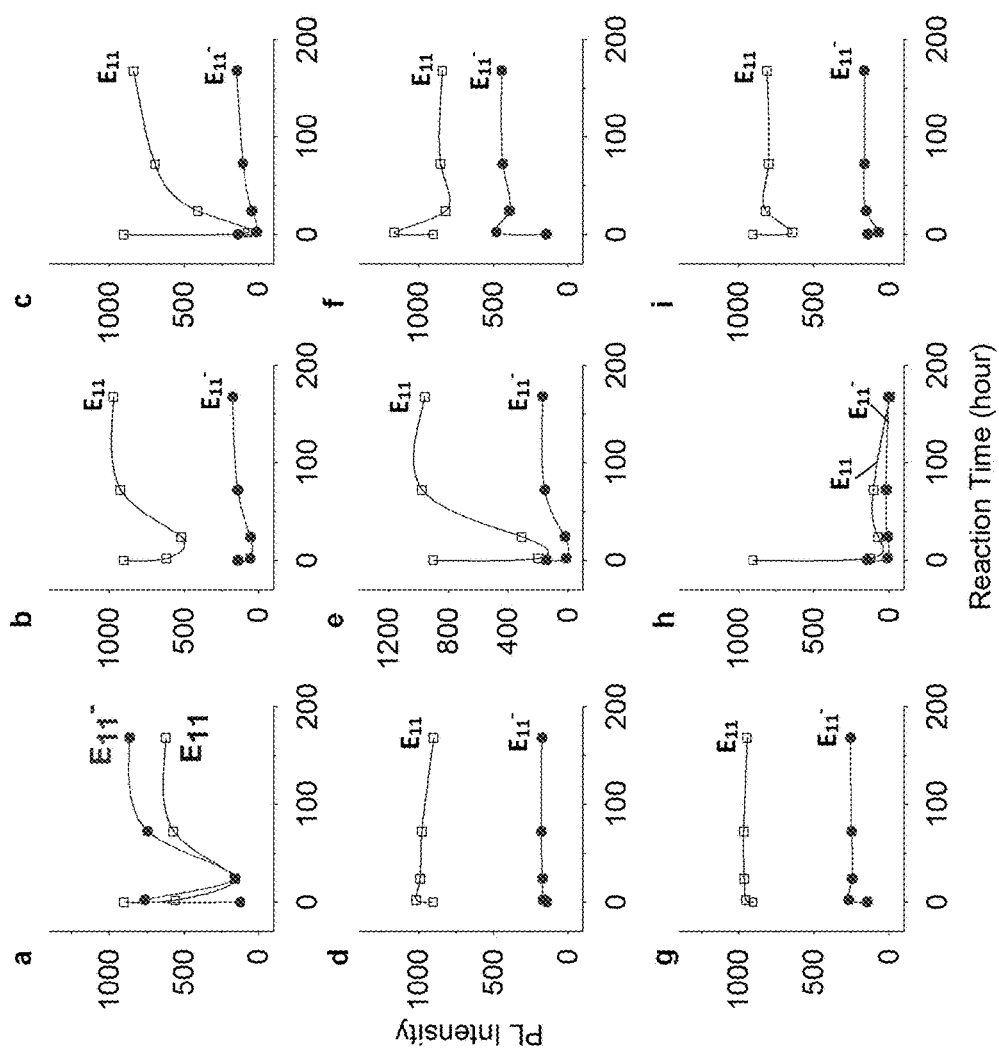
FIG. 3 illustrates graphically control reactions with different reagent conditions (set forth in Table 1). Emission spectra are monitored with 565 nm excitation at 0 h, 2 h, 24 h, 3 days and 7 days. Only the reaction condition shown in Panel a exhibits the strong defect PL (En).

In accordance with one embodiment, a new exciton-tailoring reaction is provided, which occurs in aqueous solution upon mixing an alkyl halide with nanotubes in the presence of the mild reductant sodium dithionite (FIG. 3 and Table 1). Alkyl halides alone cannot generate alkyl radicals that covalently attach to the carbon lattice (FIG. 3, Panel c and Panel i). Control experiments indicated that the reaction is facilitated by acetonitrile, which acts as a co-solvent for the alkyl halides, not required to generate defect photoluminescence (FIG. 3, Panel b and Panel f). Sodium bicarbonate serves as a base to balance acidic byproducts of sodium dithionite (FIG. 3, Panel d and Panel h) as explained with organic small molecules (Zhang, C.-P. et al. (2012) "*Progress in fluoroalkylation of organic compounds via sulfinatodehalogenation initiation system*," Chem. Soc. Rev. 41:4536-4559; Xiao, Z. et al. (2013) "*Radical Addition of Perfluoroalkyl Iodides to Alkenes and Alkynes Initiated by Sodium Dithionite in an Aqueous Solution in the Presence of a Novel Fluorosurfactant*," Chin. J. Chem. 31:939-944).

TABLE 1

Control reactions with different reagent conditions

| Reaction | SWCNT | $CH_3CN$ | $C_6F_{13}I$ | $NaHCO_3$ | $Na_2S_2O_4$ | $E_{11}^-$ |
|---|---|---|---|---|---|---|
| a | 1 | 0.2 | 10 | 20 | 10 | strong |
| b | 1 | 0.2 | — | — | — | — |
| c | 1 | — | 10 | — | — | — |
| d | 1 | — | — | 20 | — | — |
| e | 1 | — | — | — | 10 | — |
| f | 1 | — | 10 | 20 | 10 | weak |
| g | 1 | 0.2 | — | 20 | 10 | — |
| h | 1 | 0.2 | 10 | — | 10 | — |
| i | 1 | 0.2 | 10 | 20 | — | — |

Figure 4:
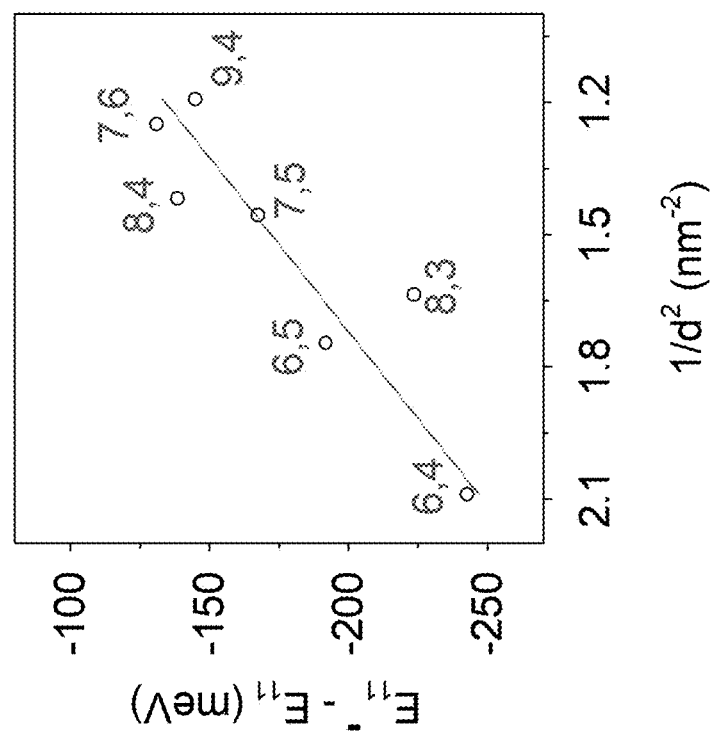
FIG. 4 illustrates graphically that emission energy of defect photoluminescence is dependent on nanotube diameter. Chirality enriched carbon nanotubes were used and functionalized with —$CF_2(CF_2)_4CF_3$ groups.
Figure 5:
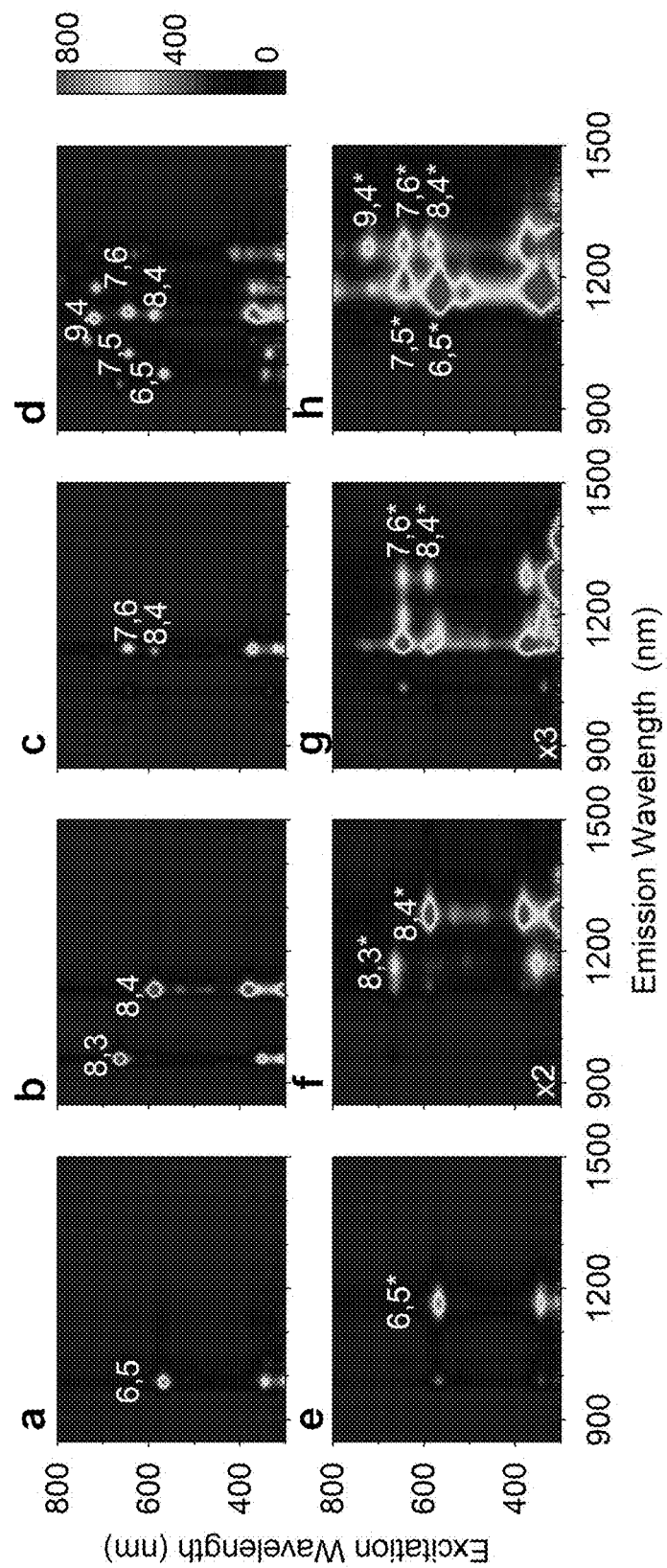
FIG. 5 illustrates nanotube structure-dependent defect photoluminescence. The excitation-emission maps of (6,5)-SWCNT (Panel a); (8,3)- and (8,4)-SWCNT (Panel b); (7,6)- and (8,4)-enriched SWCNTs (Panel c); and the mixed chirality of HiPco SWCNT (Panel d). Controlled sidewall alkylation induces new PL peaks in (6,5)-SWCNT-$CF_2(CF_2)_4$ $CF_3$ (Panel e); (8,3)/(8,4)-SWCNT-$CF_2(CF_2)_4CF_3$ (Panel f); (7,6)/(8,4)-SWCNT-$CF_2(CF_2)_4CF_3$ (Panel g); and HiPco-SWCNT-$CF_2(CF_2)_4CF_3$ (Panel h). The nanotubes were stabilized in $D_2O$ by 1 wt. % sodium dodecyl sulfate ($CH_3(CH_2)_{11}SO_4Na$).
Figure 6:
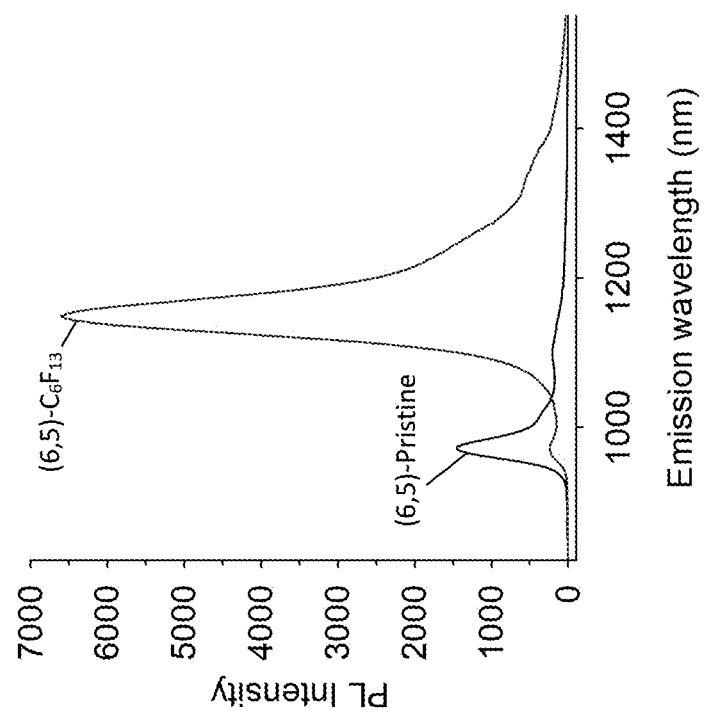
FIG. 6 illustrates graphically emission spectra of (6,5)-pristine and (6,5)-SWCNT-$CF_2(CF_2)_4CF_3$ and showing the brightening PL by more than an order of magnitude.

The emission energy of the alkylated carbon nanotubes showed a strong dependence on nanotube diameter, d, by $\Delta E = A/d^2 + B$ with $A = -126.8$ meV nm$^2$ and $B = 18.1$ meV, suggesting that the new emission peak arises from brightening of dark excitons (FIGS. 4 and 5) (Piao, Y. et al. (2013) "*Brightening of carbon nanotube photoluminescence through the incorporation of sp3 defects*," Nat. Chem. 5:840-845; Capaz, R. B. et al. (2006) "*Diameter and chirality dependence of exciton properties in carbon nanotubes*," Phys. Rev. B 74, 121401). Notably, the (6,5)-SWCNT-$CF_2(CF_2)_4CF_3$ exhibits PL that is brighter than that of the parent nanotube by more than an order of magnitude (FIG. 6).

Figure 7:
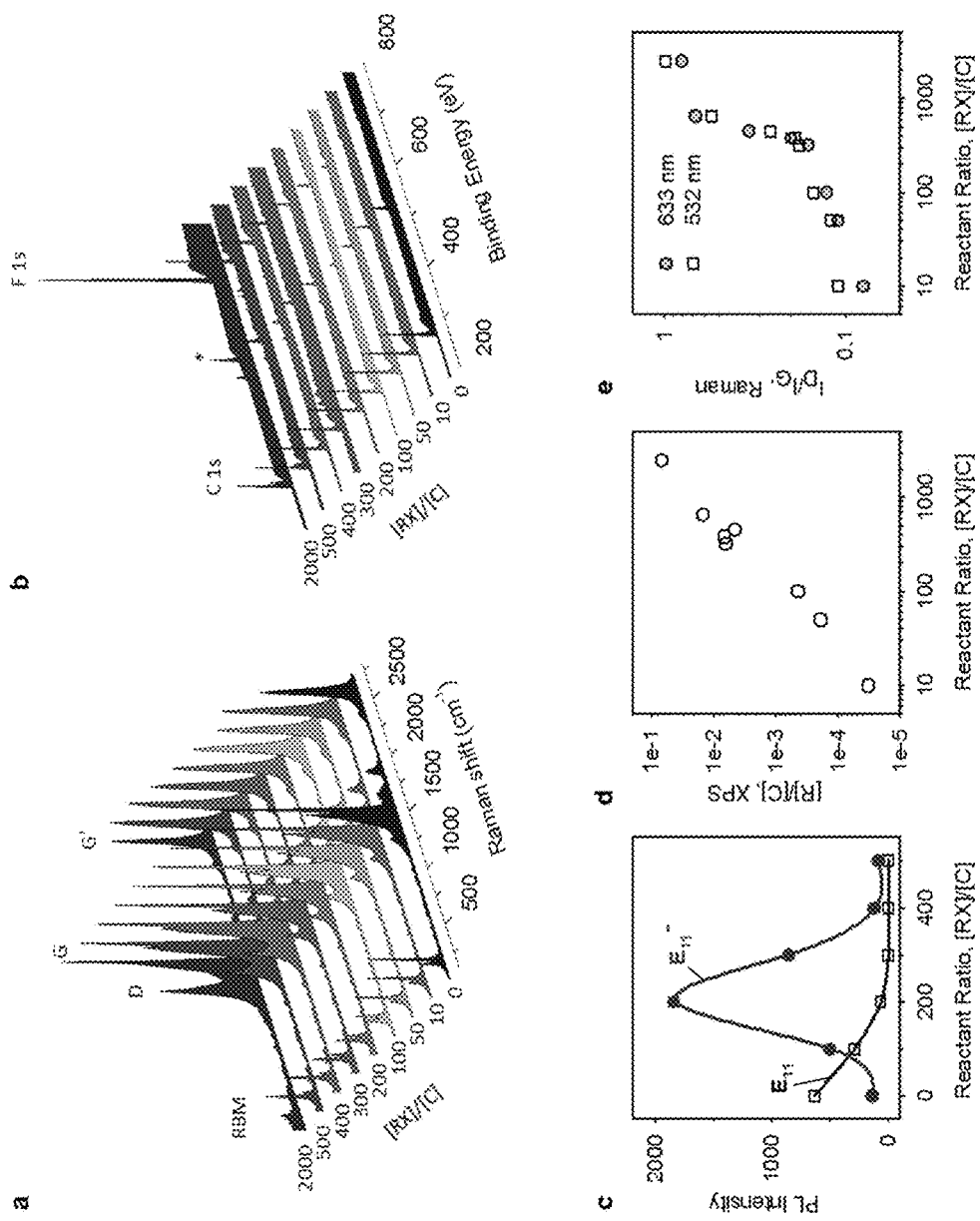
FIG. 7 illustrates correlated spectral characterization of functionalized SWCNTs at increasing molar reactant ratios of $CF_3(CF_2)_4CF_2I$ (RX) to the mixed chirality of HiPco SWCNT carbon, including: Raman scattering (Panel a), wherein the excitation line is 532 nm; and X-ray photoelectron spectroscopy (XPS) taken at 25° C. (Panel b), wherein the O1s peak is marked with an asterisk (*). PL is illustrated graphically in Panel c. The ratio of covalently attached function group to nanotube carbon, [R]/[C], as determined from XPS, increases linearly with the reactant ratio, [RX]/[C], as shown in Panel d. Raman D/G ratio of SWCNT-$CF_2(CF_2)_4CF_3$ at increasing [RX]/[C] is illustrated in Panel e.
Figure 8:
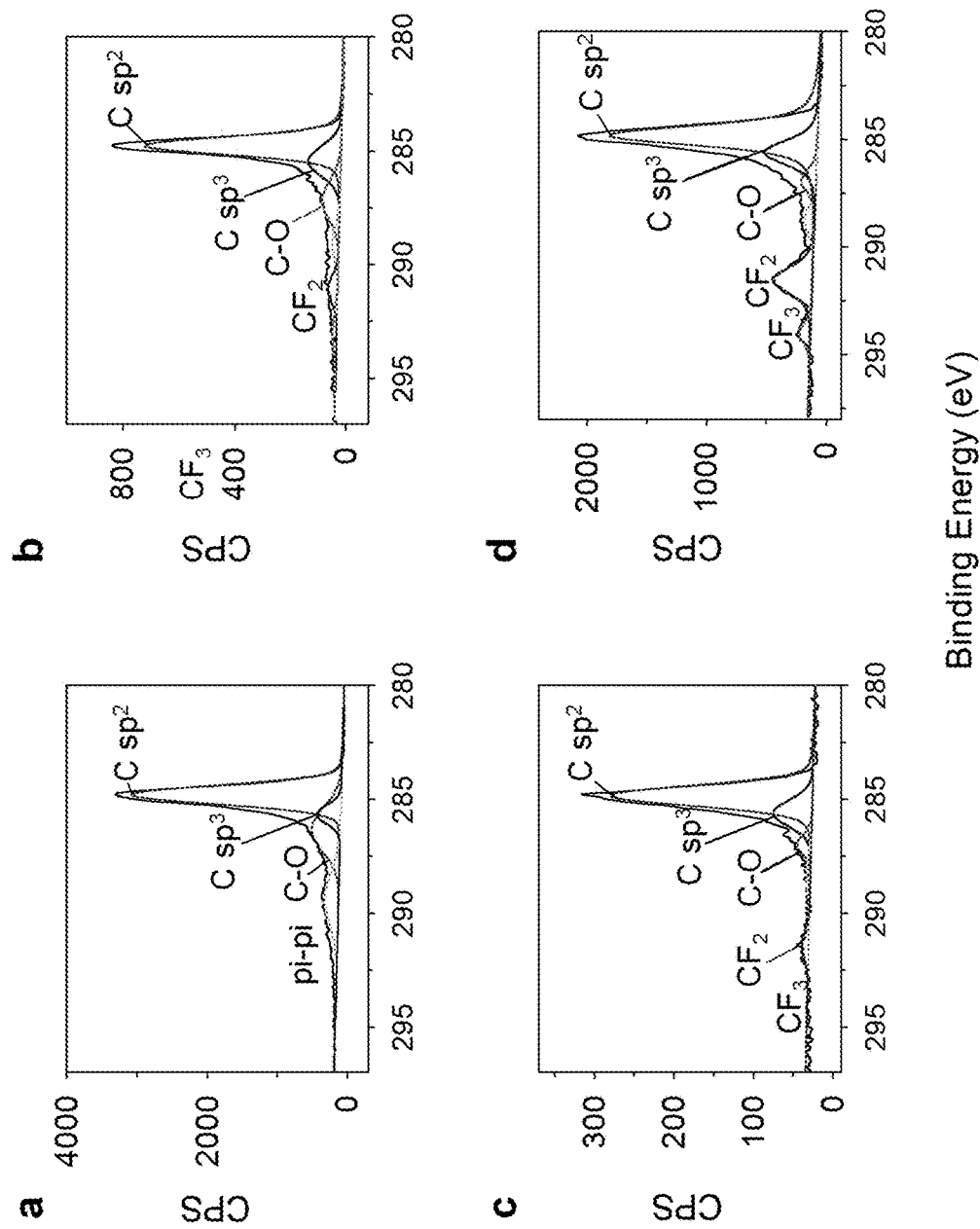
FIG. 8 illustrates high resolution XPS of C is at 175° C. for SWCNT-$CF_2(CF_2)_4CF_3$. Panel a: non-functionalized control; Panel b: [C]:[RX]=1:50; Panel c: 1:500; and Panel d: 1:2500. The nanotubes used were a sample of mixed chirality HiPco SWCNTs.
Figure 9:
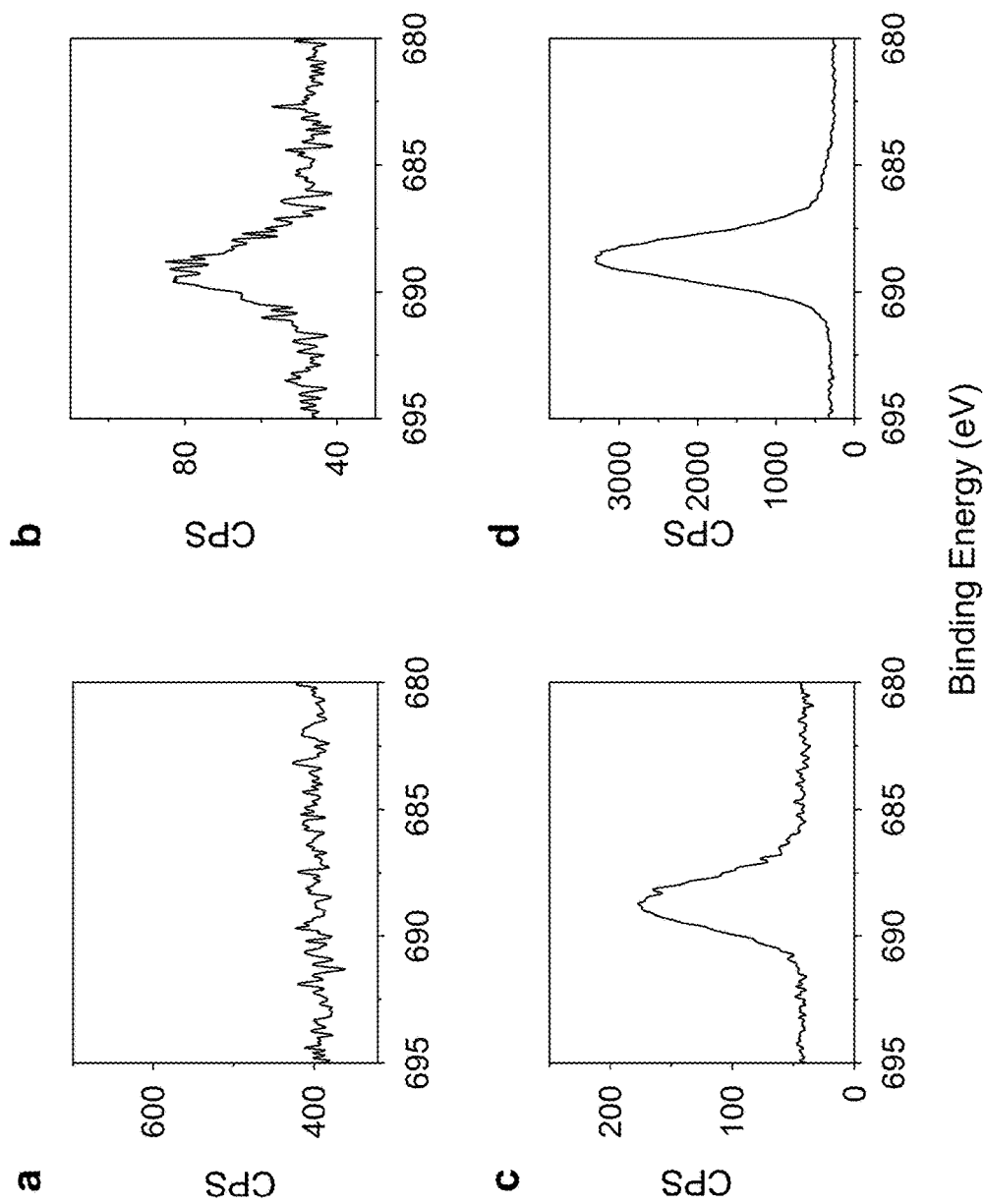
FIG. 9 illustrates high resolution XPS of F is at 175° C. for SWCNT-$CF_2(CF_2)_4CF_3$. Panel a: Non-functionalized control; Panel b: [C]:[RX]=1:50; Panel c: 1:500; and Panel d: 1:2500.
Figure 10:
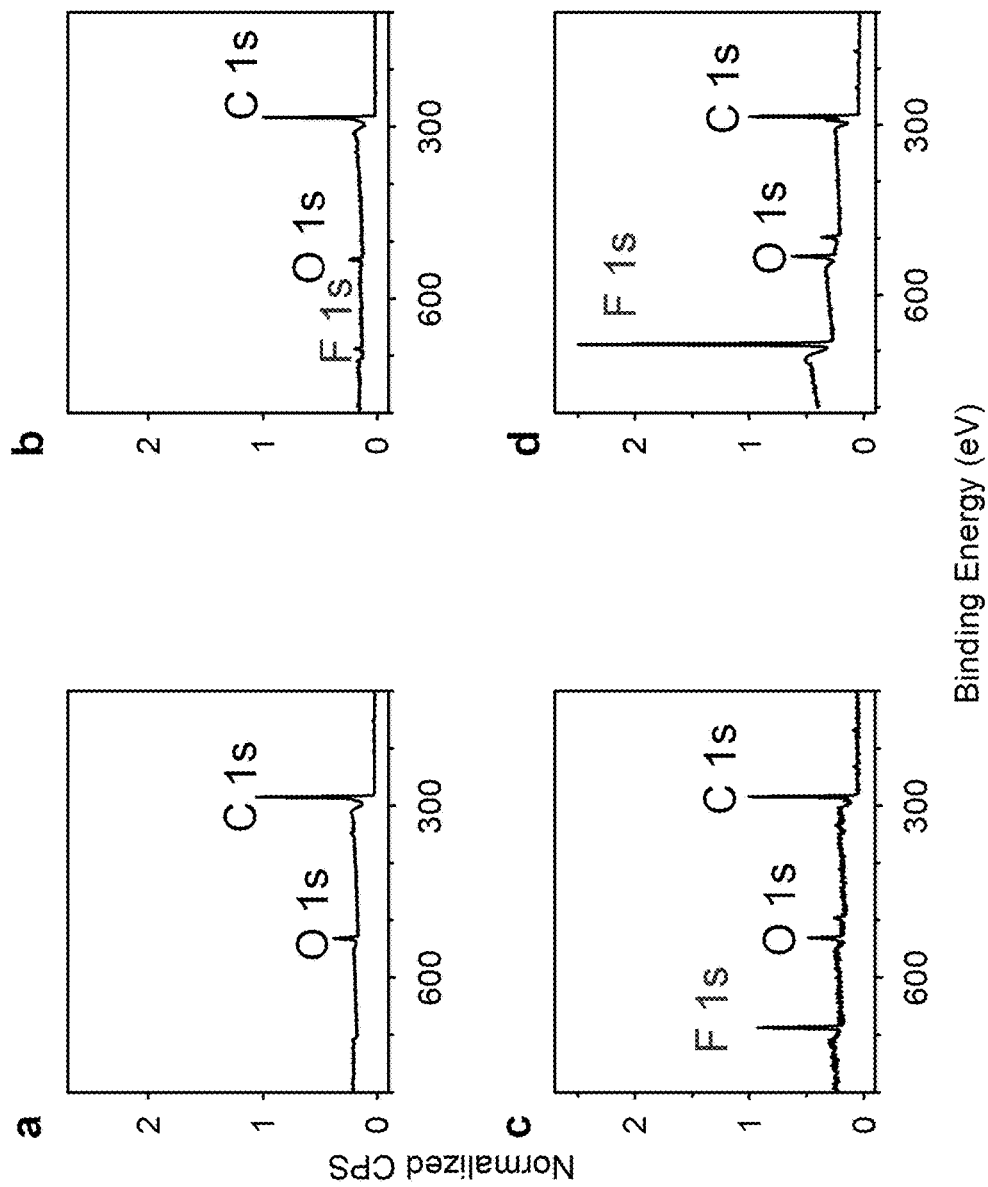
FIG. 10 illustrates high resolution XPS of full spectra at 175° C. for SWCNT-$CF_2(CF_2)_4CF_3$. Panel a: Non-functionalized control; Panel b: [C]:[RX]=1:50; Panel c: 1:500, and Panel d: 1:2500.

Correlated measurement of PL, Raman scattering, and X-ray photoelectron spectroscopy (XPS) unambiguously confirmed that the new PL originates from sp$^3$ quantum defects due to the covalent attachment of a small number of the alkyl groups to the sp$^2$ carbon lattice (FIG. 7). The formation of a covalent C—C bond between the alkyl group and the carbon nanotube is evidenced by the rise of the symmetry-breaking, defect-induced Raman scattering of the D phonon (~1,300 cm$^{-1}$) (Dresselhaus, M. S. et al. (2007) "*Raman Spectroscopy of Carbon Nanotubes in 1997 and 2007*," J. Phys. Chem. C 111:17887-17893). The intensity of this Raman band with respect to the in-plane stretching mode ($E_{2g}$) of the sp$^2$ bonded carbon lattice (G band, ~1590 cm$^{-1}$) increased from 0.10 to 0.98 in highly functionalized nanotubes (FIG. 7, Panel a). Both the Raman D/G ratio and the XPS intensity of the perfluoroalkyl group increased in proportion to the relative concentration of alkyl halide (FIG. 7, Panels a and b, and FIG. 9). High resolution XPS of SWCNT-$CF_2(CF_2)_4CF_3$ shows the growth of the sp$^3$ C1s peak at 285 eV as a shoulder to the sp$^2$ C1s peak (284.7 eV), resulting in substantial peak broadening of the C1s peak (FWHM of 1.46 eV versus 0.83 eV for the starting nanotubes) (FIG. 8). The fluorine (F1s) signal of the functional group remained constant at high temperature (e.g., 175° C.) in ultrahigh vacuum (<1×10$^{-8}$ torr), in which there are no physisorbed molecules (FIG. 10).

Figure 11:
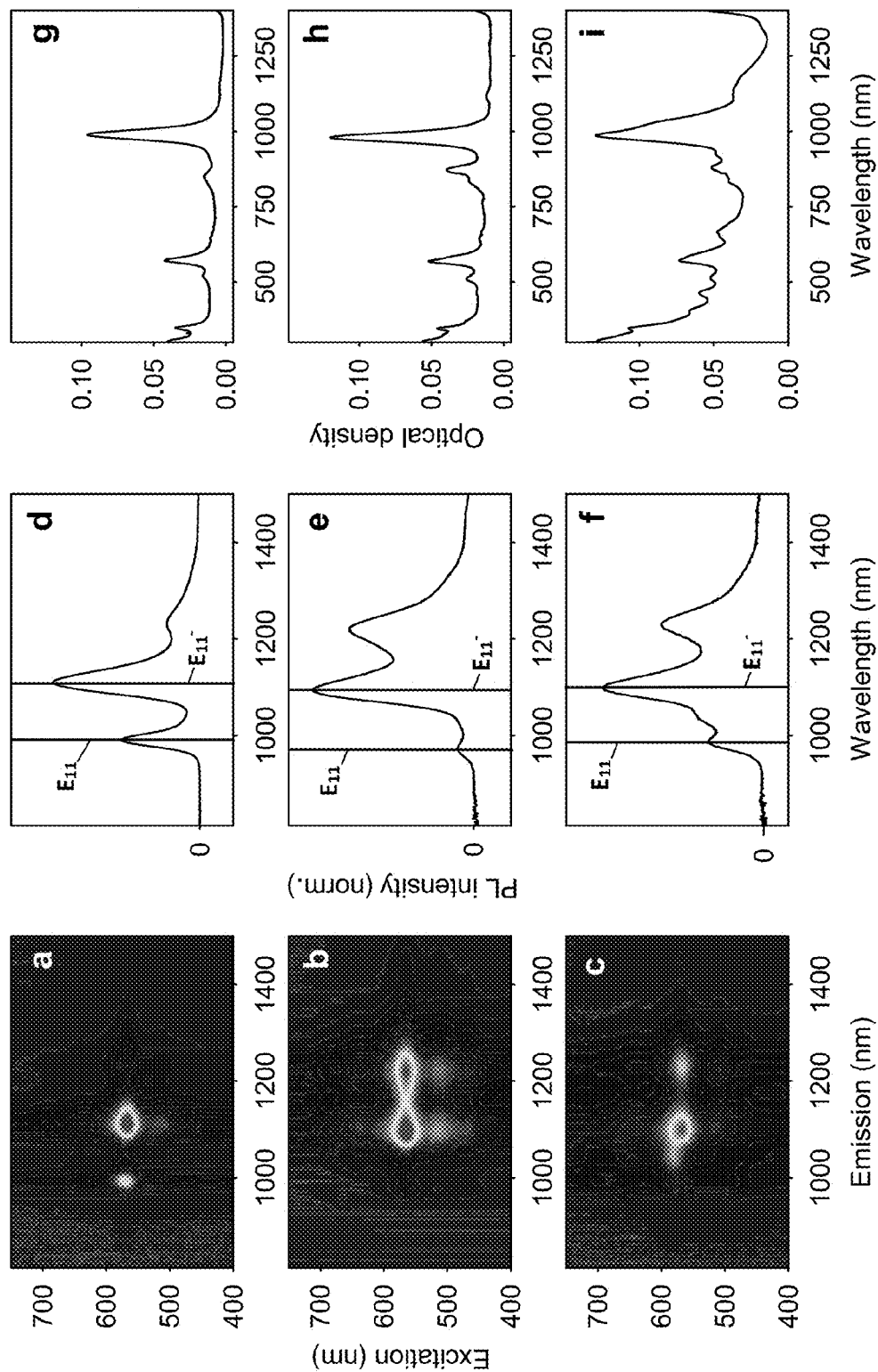
FIG. 11 illustrates the spectroscopic characterization of (6,5)-SWCNT-$CH_2(CH_2)_4CH_3$ stabilized in 1 wt./v % SDS-$D_2O$. Defect PL from the chemically tailored (6,5)-SWCNT is identified in the same emission energy regardless of the source of raw nanotube materials: two phase separation isolated CoMoCAT SG65i (Panel a, Panel d and Panel g), gel purified HiPco (Panel b, Panel e and Panel h), and unpurified CoMoCAT SG65i (Panel c, Panel f and Panel i). Panel a, Panel b, and Panel c: The excitation-emission PL map (coded in accordance with key of FIG. 5). Panel d, Panel e, and Panel f: 565 nm single excitation PL spectra. Panel g, Panel h, and Panel i: UV-vis-NIR absorption spectra.
Figure 12:
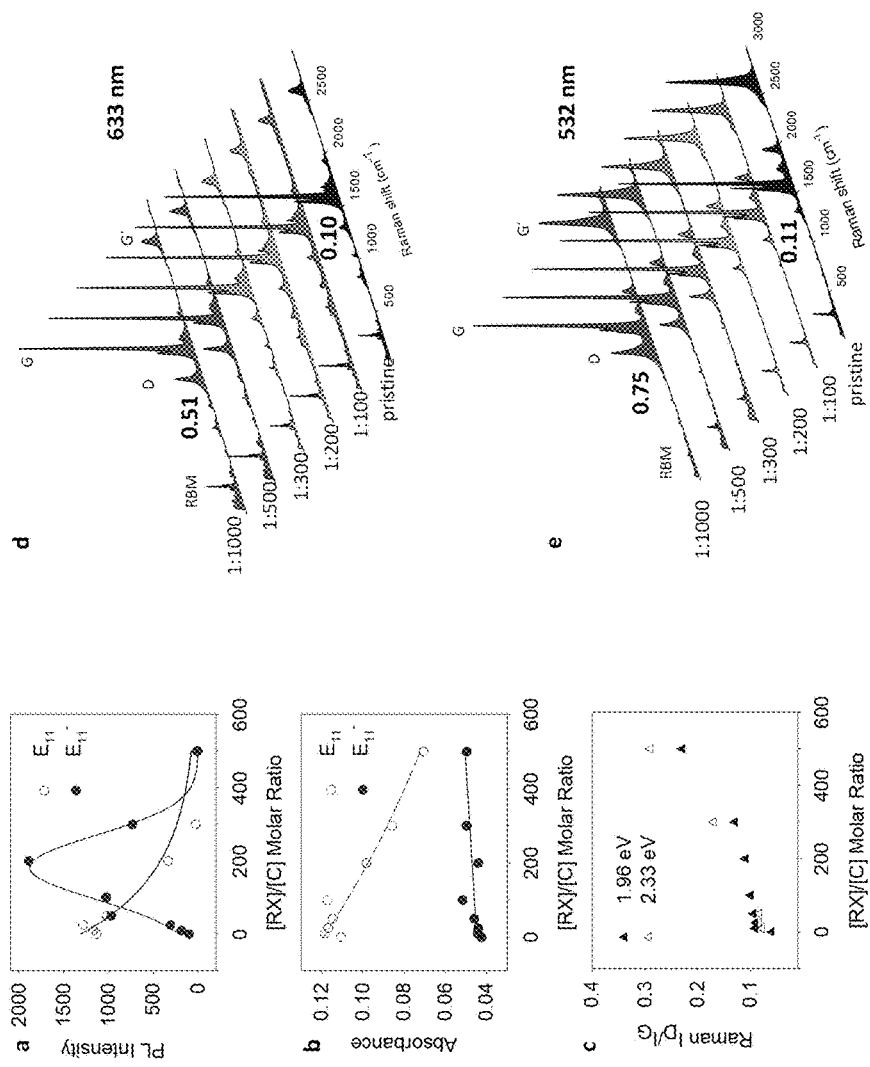
FIG. 12 illustrates the correlated spectral characterization of functionalized CoMoCAT SWCNTs at an increasing ratio of —CF$_2$(CF$_2$)$_4$CF$_3$ groups. Panel a: PL; Panel b: absorption; and Panel c: Raman D/G ratio as a function of [RX]/[C] molar ratio. Raman spectra with 632.8 nm and 532 nm excitation laser are illustrated in Panel d and Panel e, respectively.

The new defect PL was further investigated with different SWCNT samples such as HiPco ensemble, CoMoCAT ensemble, the aqueous two phase-assisted SWCNTs (Ao, G. et al. (2014) "*DNA-Controlled Partition of Carbon Nanotubes in Polymer Aqueous Two-Phase Systems*," J. Am. Chem. Soc. 136:10383-10392) and the column-purified SWCNTs to rule out the possibility of impurity effects (see FIG. 11). FIG. 11 illustrates the spectroscopic characterization of (6,5)-SWCNT-$CH_2(CH_2)_4CH_3$ stabilized in 1 wt./v % SDS-$D_2O$. Defect PL from the chemically tailored (6,5)-SWCNT can be clearly identified in the same emission energy regardless of the source of raw nanotube materials: two phase separation isolated CoMoCAT SG65i (FIG. 11, Panels a, d and g), gel purified HiPco (FIG. 11, Panels b, e, and h), and unpurified CoMoCAT SG65i (FIG. 11, Panels c, f and i). FIG. 11, Panels a, b and c: The excitation-emission PL map. FIG. 11, Panels d, e and f: 565 nm single excitation PL spectra ($E_{11}$ and $E_{11}^-$ PL positions marked). FIG. 11, Panels g, h and i: UV-vis-NIR absorption spectra. These results demonstrate the defect PL is unique with new properties incorporated through the chemical modification. All showed the consistent $\Delta E$ of defect PL for the (6,5) chirality tubes for all tested samples. Furthermore, the correlated emission, absorption and Raman with (6,5)-CoMoCAT-$CF_2(CF_2)_4CF_3$ showed identical results of close relationship between covalent attachment and defect PL brightening (FIG. 12).

Figure 2:
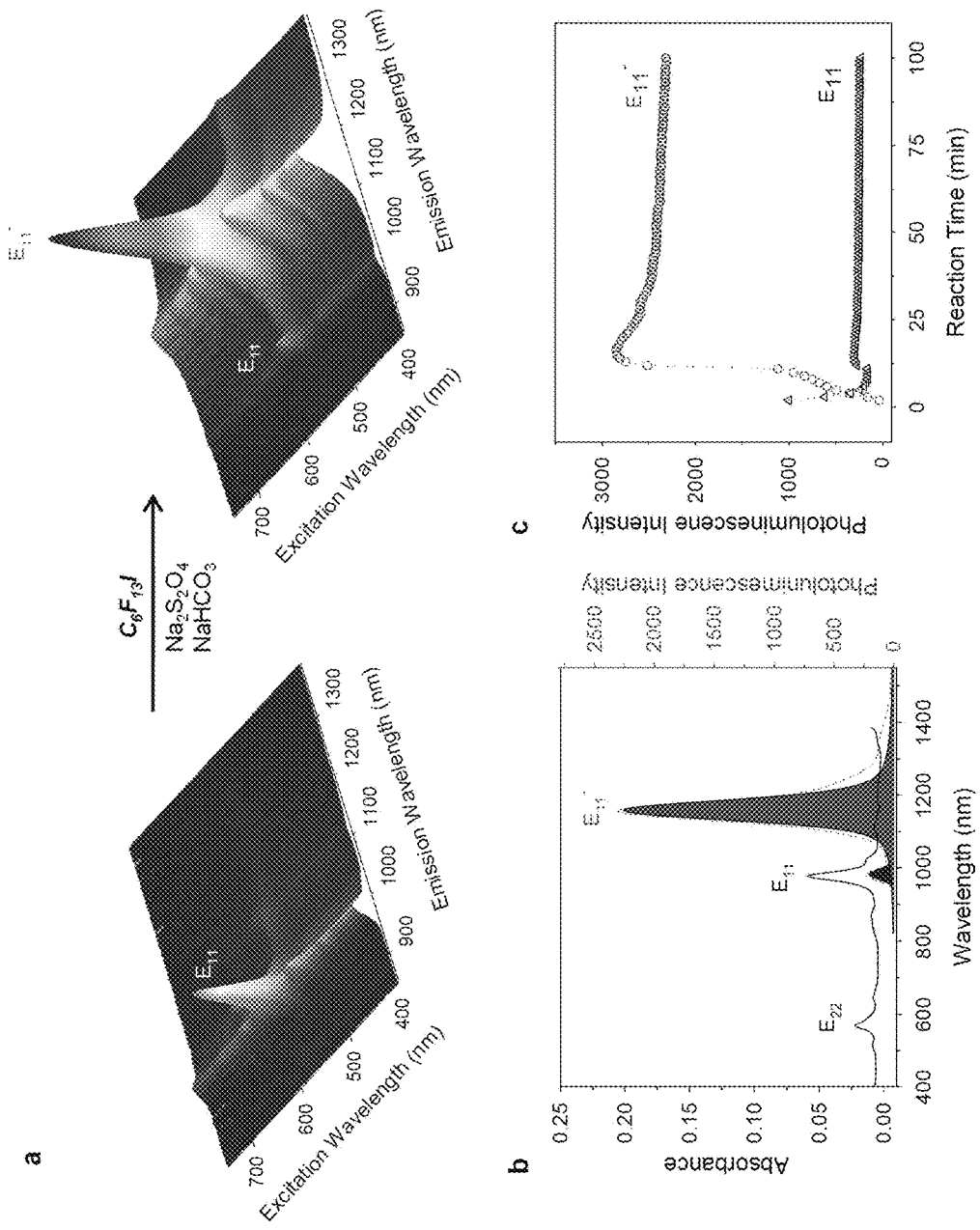
FIG. 2 illustrates graphically the chemical creation of fluorescent (6,5)-SWCNT-$CF_2(CF_2)_4CF_3$. As shown in Panel a, defect photoluminescence arises farther in the near-infrared, 190 meV to the red of the parent nanotube excitonic emission. Correlated visible near-infrared absorption (black line) and PL (red line) spectra for (6,5)-SWCNT-$CF_2(CF_2)_4CF_3$ are illustrated graphically in Panel b, wherein the SWCNTs are excited at the $E_{22}$ transition (565 nm). Evolution of $E_{11}$ and $E_{11}^-$ emission is illustrated graphically in Panel c.

By changing the concentrations of the reagents, the intensity of the defect PL was controlled. The $E_{11}^-$ intensity of (6,5)-SWCNT-$CF_2(CF_2)_4CF_3$ peaks at a carbon-to-alkyl halide reactant molar ratio of 1 to 0.4 (FIG. 2). Correspondingly, the Raman D/G ratio increased from 0.10 to 0.18, indicating that a small amount of alkyl groups were covalently attached on the nanotubes. Consistent with Raman scattering, the visible near-infrared absorption barely decreased. Based on XPS (FIGS. 2 and 7), the attached —$CF_2(CF_2)_4CF_3$ groups were estimated to be at a density of one group per 166 carbons or 1.8 nm of nanotube length on average. This density is much higher than that produced by diazonium salts (see Piao, Y. et al. (2013) "*Brightening of carbon nanotube photoluminescence through the incorporation of sp3 defects*," Nat. Chem. 5:840-845) and may suggest distinct reaction propagation (Zhang, Y. et al. (2013) "*Propagative Sidewall Alkylcarboxylation that Induces Red-*

Shifted Near-IR Photoluminescence in Single-Walled Carbon Nanotubes," J. Phys. Chem. Lett. 4:826-830).

Tunable Fluorescent Quantum Defects with Alkylation

Figure 13:
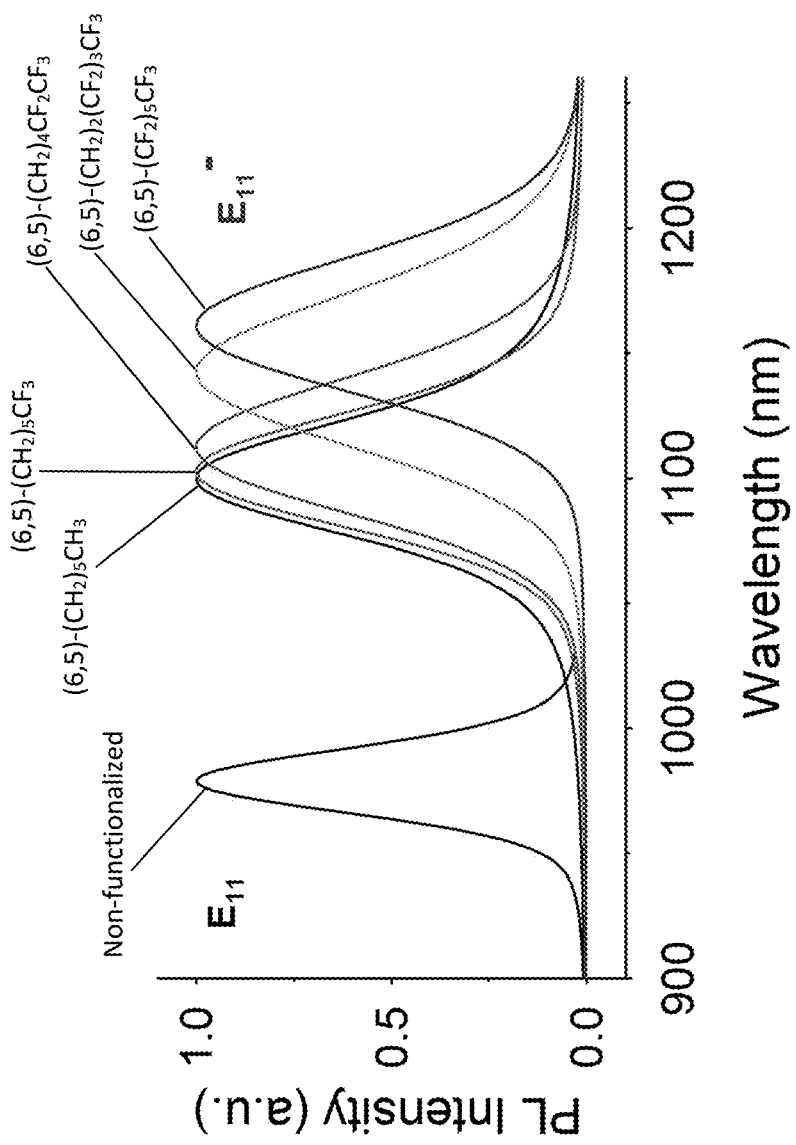
FIG. 13 illustrates tunable near-infrared PL from quantum defect-tailored (6,5)-SWCNTs with six-carbon alkyl chains with an increasing numbers of fluorine substituents.
Figure 15:
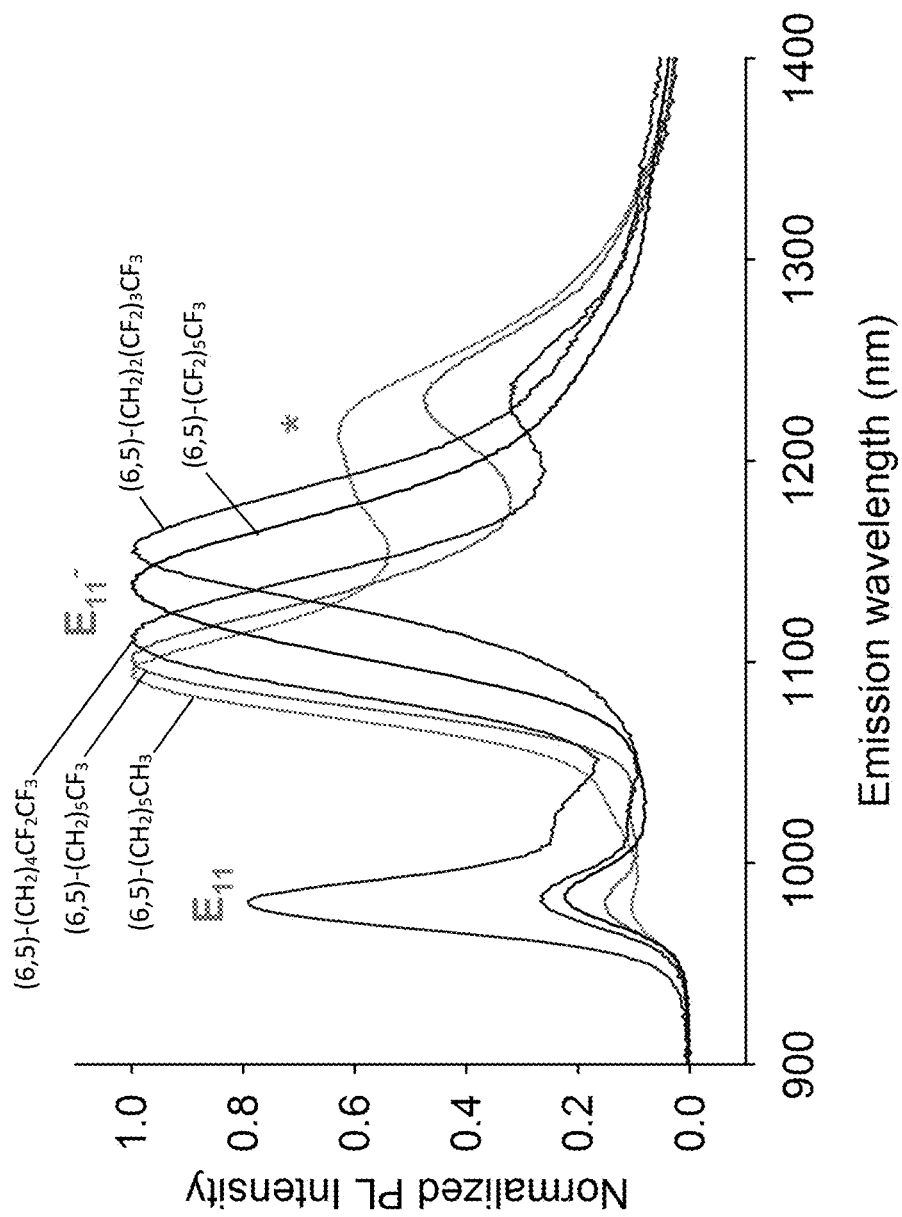
FIG. 15 illustrates the emission spectra of (6,5)-SWCNTs with six carbon alkyl chains before peakfitting. Additional satellite peaks were observed and marked with asterisk (*) arising from a charged exciton (trion).

The disclosed synthetic quantum systems provide exceptional chemical tunability of the near-infrared PL energy (FIGS. 13 and 15). Continuous red-shift of the $E_{11}^-$ emission was achieved simply by increasing the number of fluorine atoms along a six-carbon alkyl backbone (FIG. 13 Panel b, and FIG. 16 Panel a, and Table 2). The energy shift moved from 133 meV for —$CH_2(CH_2)_4CH_3$ to 190 meV for —$CF_2(CF_2)_4CF_3$. A consistent trend was observed in a series of partially fluorinated groups in which the distance between the electron withdrawing moiety (—$CF_3$) and the defect site was varied by the chain length, —$(CH_2)_nCF_3$ (n=0-5), (see FIG. 16 Panel b, and Table 2), resulting in the energy shift from 137 meV to 194 meV. When the first carbon of alkyl chains that is directly attached to a SWCNT was fluorinated, it significantly affected the energy separation, indicating strong distance effect.

Figure 17:
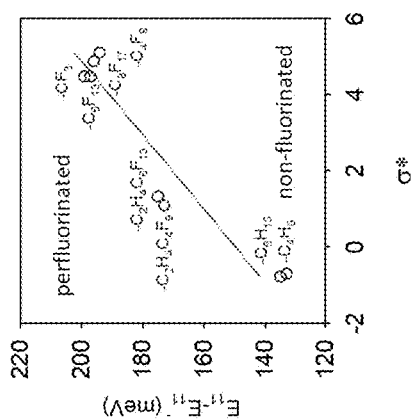
FIG. 17 illustrates the energy shift versus calculated inductive constant with non-, partially-, and per-fluorinated alkyl groups and tabulates their emission wavelength and energy shifts.

Consistent with this inductive picture, all perfluorinated alkyl defects in (6,5)-SWCNTs, including —$CF_3$, —$(CF_2)_3CF_3$, —$(CF_2)_5CF_3$, and —$(CF_2)_7CF_3$, produced similarly redshifted $E_{11}^-$ peaks (by 190-194 meV), indicating comparable inductive constants regardless of the carbon chain length (FIG. 17). For $CF_3$-terminated alkyl defects, the defect PL energy decreased exponentially with chain length (or approximately, the distance from the defect site) (Table 2).

Quantitatively, the inductive constants can be calculated from the following equation proposed by Cherkasov et al. (see Artem, R. C. et al. (1996) "The problem of the quantitative evaluation of the inductive effect: correlation analysis," Russ. Chem. Rev. 65:641):

$$\sigma^* = 7.840 \Sigma_i \Delta\chi_i R_i^2 / r_i^2$$

where $\Delta\chi_i$ is the difference between the electronegativities of i-th atom in the substituent and the reaction center, $R_i$ is the covalent radius of the i-th atom, and $r_i$ is the distance from

TABLE 2

Spectral characteristics of alkyl fluorescent quantum defects in (6,5) SWCNTs and calculated inductive constants of the covalently bonded alkyl groups.

| (6,5)-SWCNT-R | $E_{11}$ (nm) | $E_{11}$ FWHM (meV) | $E_{11}^-$ (nm) | $E_{11}^-$ FWHM (meV) | $\Delta E$ (meV) | $\sigma^*$ (calc) |
|---|---|---|---|---|---|---|
| Non-functionalized | 979 | 37 | — | — | 0 | — |
| —$CH_2CH_2CH_2CH_2CH_2CH_3$ | 981 | 45 | 1096 | 56 | 133 | −0.774 |
| —$CH_2CH_2CH_2CH_2CH_2CF_3$ | 980 | 45 | 1099 | 56 | 137 | −0.462 |
| —$CH_2CH_2CH_2CH_2CF_2CF_3$ | 980 | 38 | 1107 | 59 | 146 | −0.127 |
| —$CH_2CH_2CF_2CF_2CF_2CF_3$ | 983 | 40 | 1137 | 76 | 170 | 1.086 |
| —$CF_2CF_2CF_2CF_2CF_2CF_3$ | 981 | 42 | 1155 | 69 | 190 | 4.867 |
| —$CH_2CH_2CH_2CH_2CH_2CF_3$ | 980 | 45 | 1099 | 56 | 137 | −0.462 |
| —$CH_2CH_2CH_2CH_2CF_3$ | 979 | 40 | 1104 | 59 | 143 | −0.287 |
| —$CH_2CH_2CH_2CF_3$ | 980 | 42 | 1101 | 55 | 140 | −0.034 |
| —$CH_2CH_2CF_3$ | 980 | 42 | 1110 | 59 | 147 | 0.310 |
| —$CH_2CF_3$ | 982 | 42 | 1114 | 67 | 150 | 1.244 |
| —$CF_3$ | 980 | 45 | 1158 | 63 | 194 | 3.961 |

Figure 14:
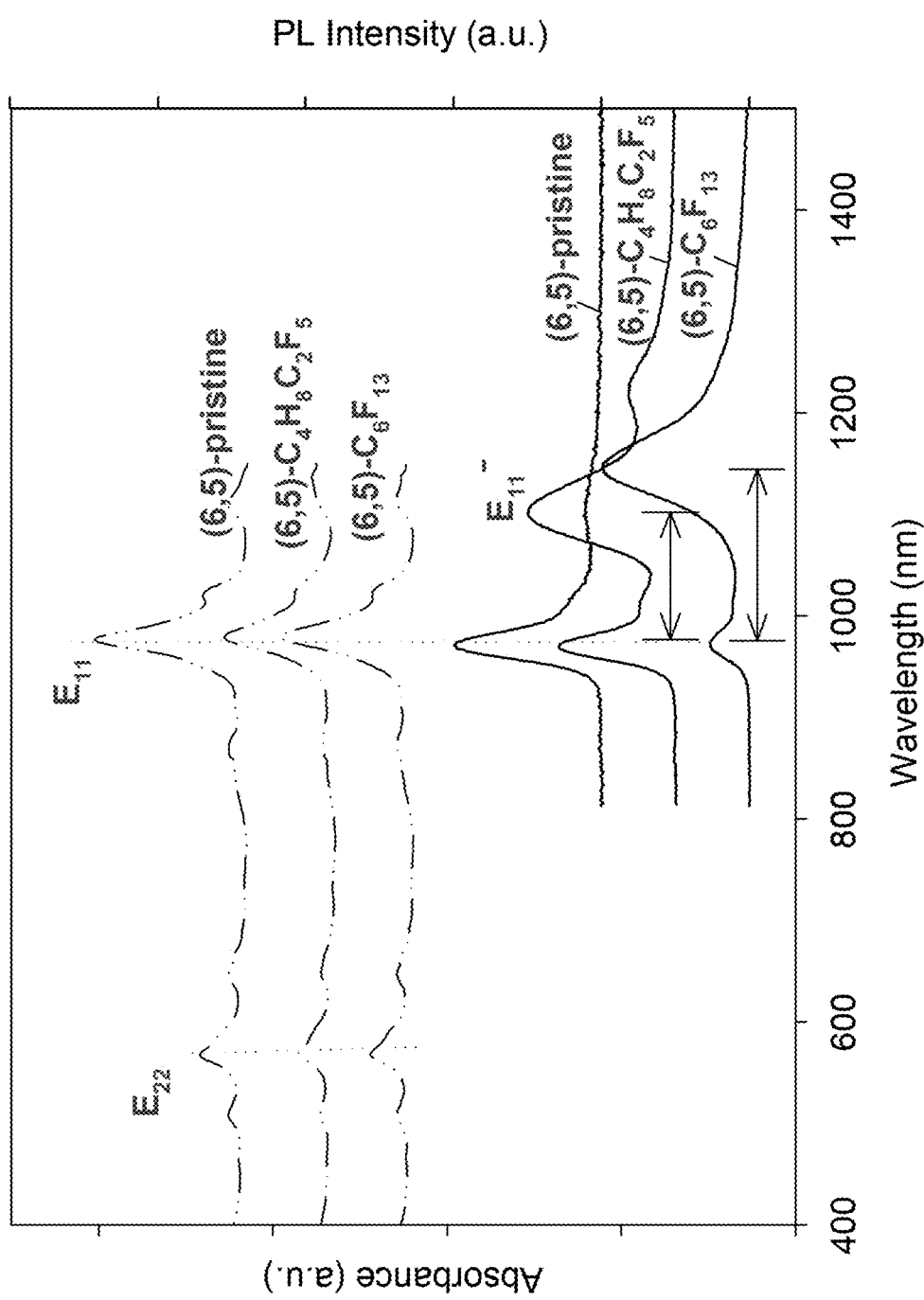
FIG. 14 illustrates correlated UV-Vis-NIR absorption and PL of (6,5)-SWCNTs with different functional groups.

The optical properties of tunable fluorescent quantum defects with alkyl groups are strikingly different from those of nanocrystals. The size engineering of nanoparticles results in significant change in band gaps and thus both absorption and emission are size-dependent. However, the disclosed alkylation method on the same size nanotube at low defect density can modulate emissions that are created at defect center while retaining similar absorption characteristics through chemical engineering of the surface (FIG. 14). Using this technique, the absorption of functionalized SWCNTs are comparable with that of pristine SWCNTs while their emissions can be efficiently tuned by changing functionality.

Inductive Effects of Alkyl Defects

Figure 16:
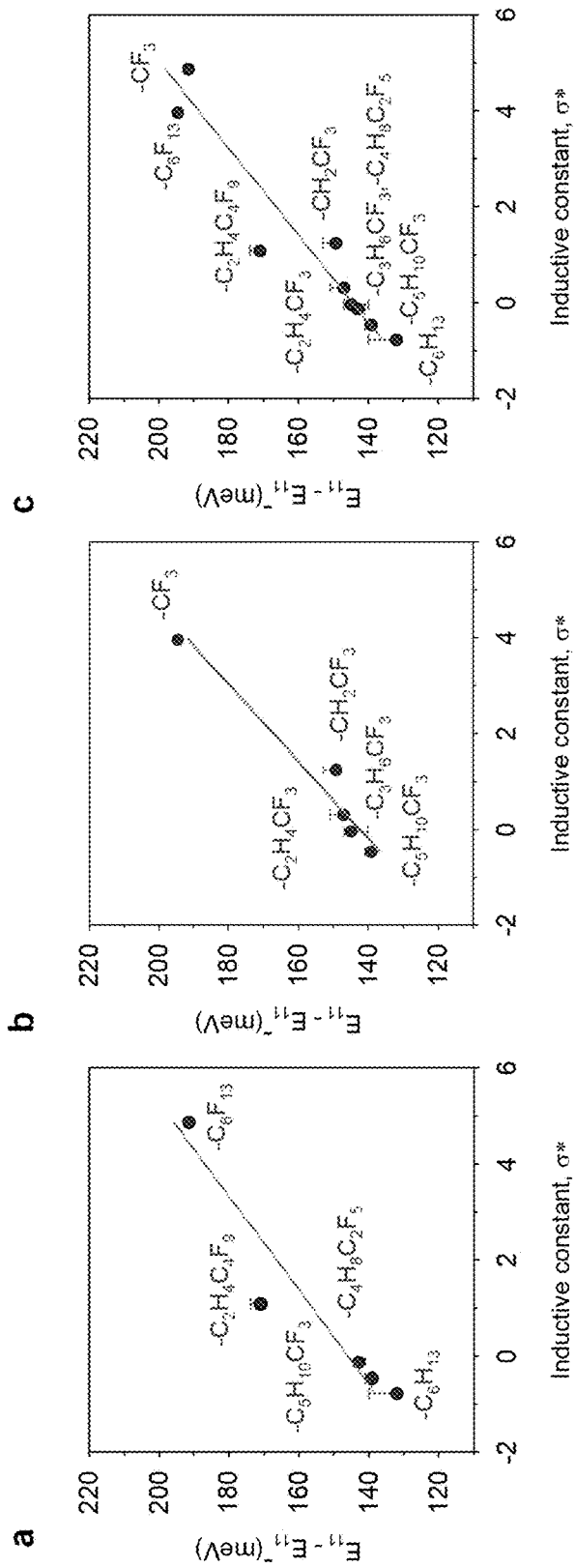
FIG. 16 illustrates the linear correlation between energy shift and calculated inductive constant of non-, partially-, and per-fluorinated alkyl groups. Panel a: Fluorination effects in hexyl functionalized (6,5)-SWCNTs; Panel b: Effects of chain length in (6,5)-SWCNT-(CH$_2$)$_n$CF$_3$; Panel c: Summary of inductive effects in the energy shifts.

Experimental results and quantum chemical theory consistently indicated that this tunability originates from inductive electronic effects associated with the covalently attached functional group (FIG. 16). These inductive electronic effects can be described by the empirical Taft constant or inductive constant ($\sigma^*$), which quantifies the electronic influence of a substituent through sigma bonding in alkyl chains, excluding resonance effects that also occur in conjugated moieties (Artem, R. C. et al. (1996) "The problem of the quantitative evaluation of the inductive effect: correlation analysis," Russ. Chem. Rev. 65:641; Hansch, C. et al. (1991) "A survey of Hammett substituent constants and resonance and field parameters," Chem. Rev. 91:165-195).

this atom to the defect site on a SWCNT. The PL energy shifts are linearly correlated with the calculated inductive constants ($\sigma^*_{calc}$) (FIG. 16). This linear correlation confirms that the inductive effects associated with the alkyl groups on the fluorescent quantum defects are responsible for the observed energy shifts. It is noted that more than twenty different types of scales exist for inductive constants reported, which all correlate well with one another. It was found that reported inductive constants from literature for alkyl groups used matched with the calculated results herein.

Creation of Extended Fluorescent Quantum Defects: Aryl and Divalent Defects

Figure 18:
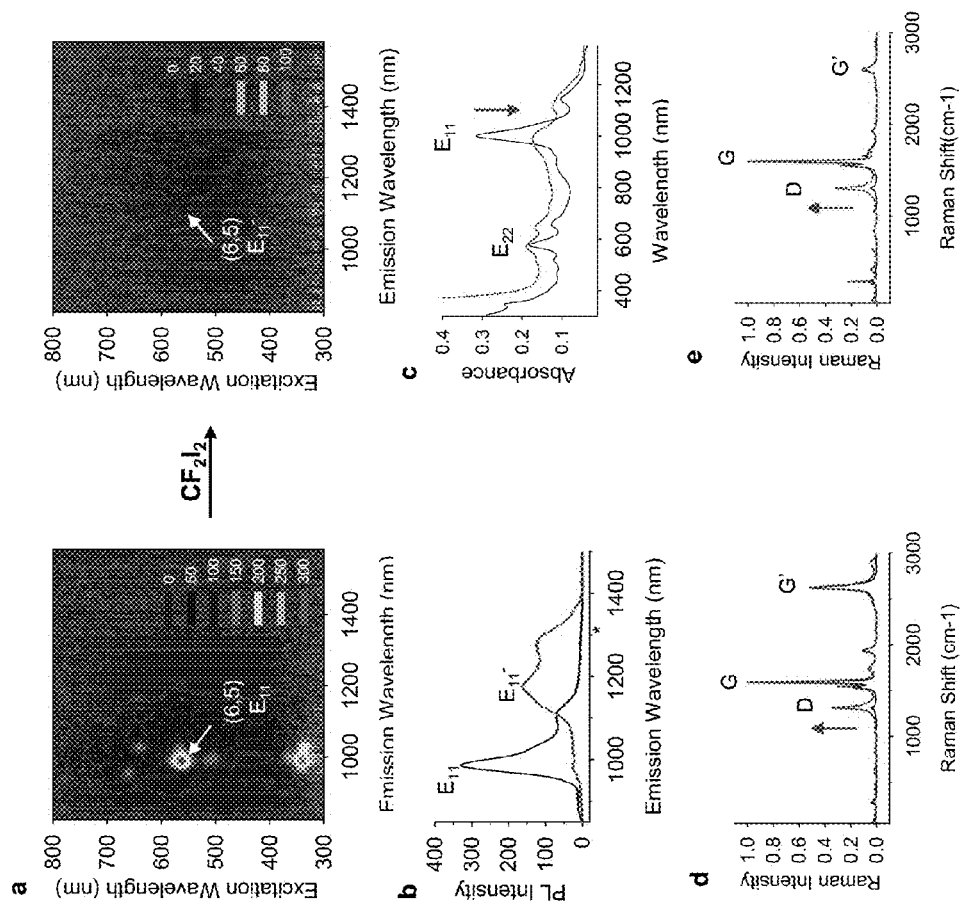
FIG. 18 illustrates (6,5)-SWCNT>CF$_2$. Panel a: PL maps of pristine SWCNTs (left) and divalent alkyl-functionalized SWCNTs (right); Panel b: 565 nm excitation emission spectra; Panel c: UV-Vis-NIR Absorption spectra; Panel d: Raman spectra with 532 nm laser; and Panel e: Raman spectra with 632.8 nm laser. The pristine is black solid and the functionalized SWCNTs are red solid line.

The disclosed methodologies of creating fluorescent quantum defects are not limited to creating monovalent alkyl defects (—R), but also extend to divalent alkyl defects (>R) with di-iodide precursors (FIG. 18). The diiodo reactions do not typically occur in organic molecular systems (Zhang, C.-P. et al. (2012) "Progress in fluoroalkylation of organic compounds via sulfinatodehalogenation initiation system," Chem. Soc. Rev. 41:4536-4559), while only few conjugated structures with highly substituted π-bonds are reported to yield carbene-like products (Kropp, P. J. (1984) "Photobehavior of alkyl halides in solution: radical, carbocation, and carbene intermediates," Acc. Chem. Res. 17:131-137). Divalent alkyl defects are characterized by PL, UV-Vis-NIR absorption and Raman spectra showing distinct different optical properties from monovalent defects including further redshifted defect PL at 1164 nm.

Figure 19:
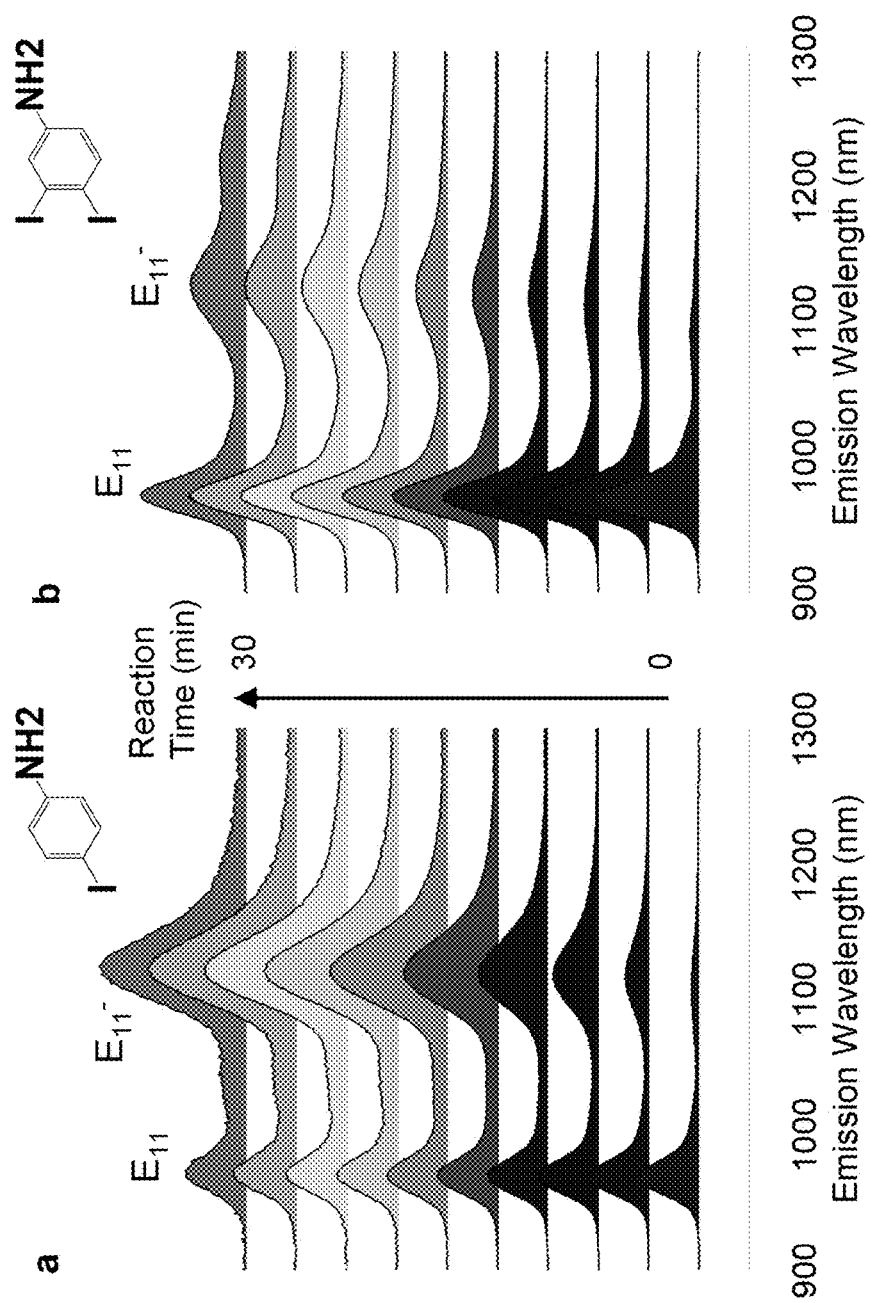
FIG. 19 illustrates the creation of monovalent (Panel a) and divalent (Panel b) aryl defects of aminobenzene-(6,5)-SWCNTs. The aryl defect was created by excitation light (300-1200 nm) without sodium dithionite. Single emission spectra are obtained with 565 nm excitation light and normalized by E$_{11}$.

In contrast to alkyl iodides, which provide for activation by sodium dithionite, aryl iodides alone can react with SWCNTs by electromagnetic radiation or excitation light activation (FIG. 19). The wavelength(s) of the electromagnetic radiation is resonant with the SWCNTs for activation. By shining excitation light, e.g., having a wavelength(s) from 300 nm to 1200 nm with 5 nm increment, the wavelength resonant with the SWCNTs, we observed the development of defect photoluminescence with 159 meV energy shift for mono-aminobenzene defect and 171 meV shift for divalent aminobenzene defects starting from with 4-iodoaniline and 3,4-diiodoaniline, respectively. It is believed that high π-π interaction between aryl groups and carbon nanotubes leads to physisorption of aryl groups as a first step, followed by creating aryl radicals with incident light to form a covalent bond. Once the first iodide on the benzene ring reacts, there is a high possibility that the second iodide at ortho-positions will interact with SWCNTs, leading to subsequent reactions on an adjacent carbon of the defect center on the rigid SWCNT structures.

Tunable Fluorescent Quantum Defects Through Aryl and Divalent Groups

Figure 20:
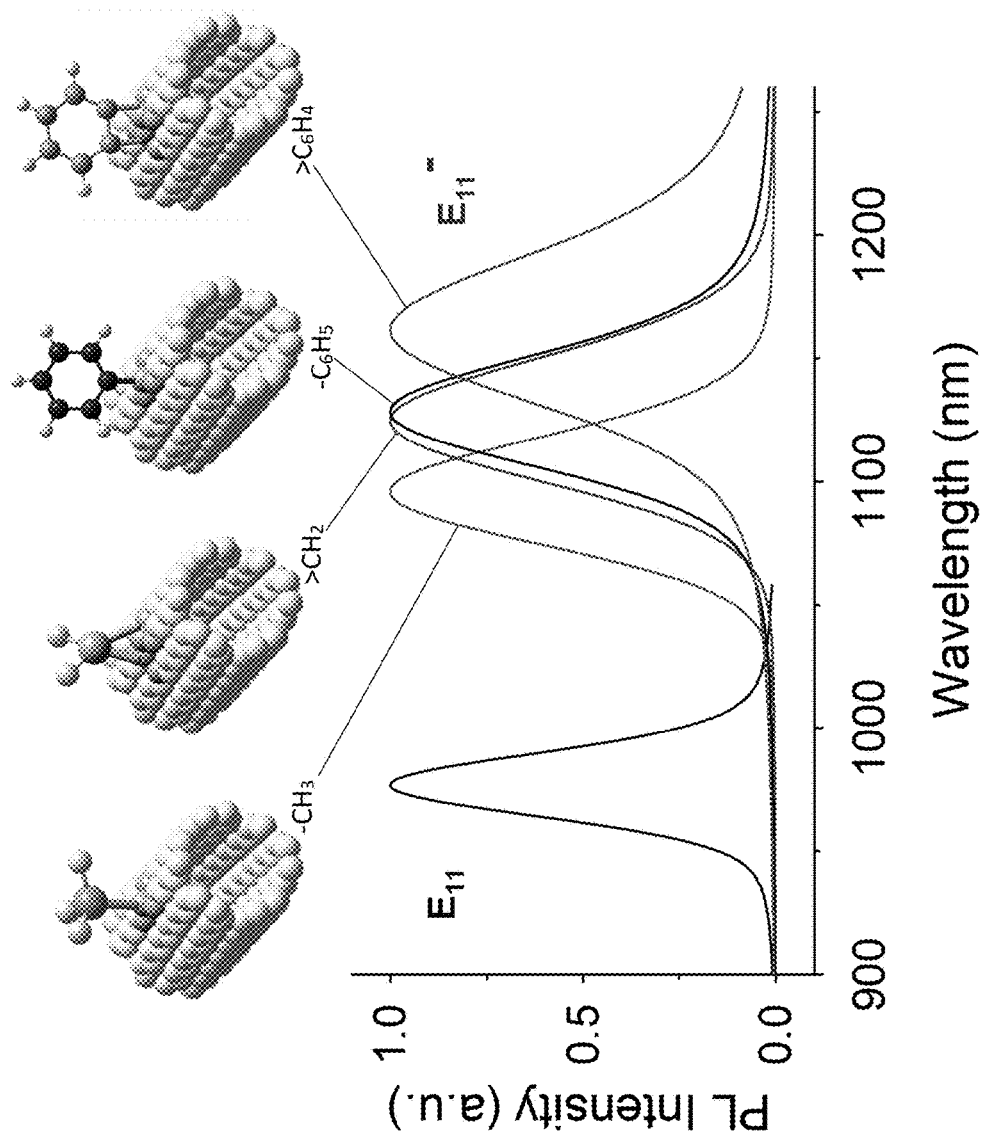
FIG. 20 illustrates a comparison of monovalent and divalent fluorescent quantum defects. The nanotubes were excited at 565 nm. The parent exciton PL occurs at 979 nm while emission from the quantum defects are systematically tunable by changing the functional group including —CH$_3$, >CH$_2$, —C$_6$H$_5$, and >C$_6$H$_4$. The spectra are fitted with Voigt functions.

Larger optical tunability can be achieved by applying diiodo-containing precursors to produce cycloaddition adducts. The divalent quantum defects fluoresce even further into the infrared than do the monovalent defects (FIG. 20). For instance, PL of (6,5)-SWCNT>$CH_2$ occurred at 1125 nm, which was red-shifted by 31 meV more than its monovalent counterpart, (6,5)-SWCNT-$CH_3$. In (6,5)-SWCNT>$CF_2$, the defect PL was further shifted to 1164 nm, 200 meV to the red of the parent nanotube PL. Divalent aryl defects, created by reaction with o-diiodoaniline and o-diiodobenzene for instance, also produced new PL peaks that redshifted farther from the parent nanotube, in comparison with their monovalent counterparts, by 171 meV and 190 meV, respectively (FIG. 20 and Table 3).

Figure 21:
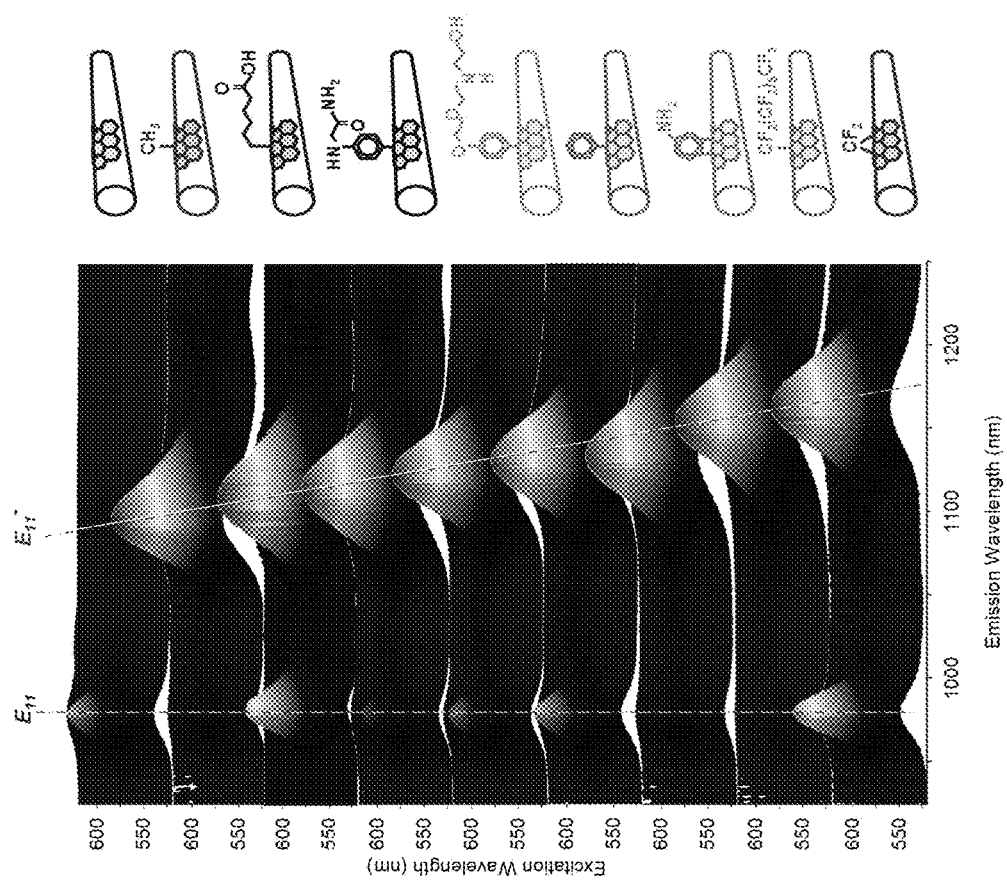
FIG. 21 illustrates excitation-emission maps of (6,5)-SWCNTs with chemically tailored fluorescent quantum defects.
Figure 22:
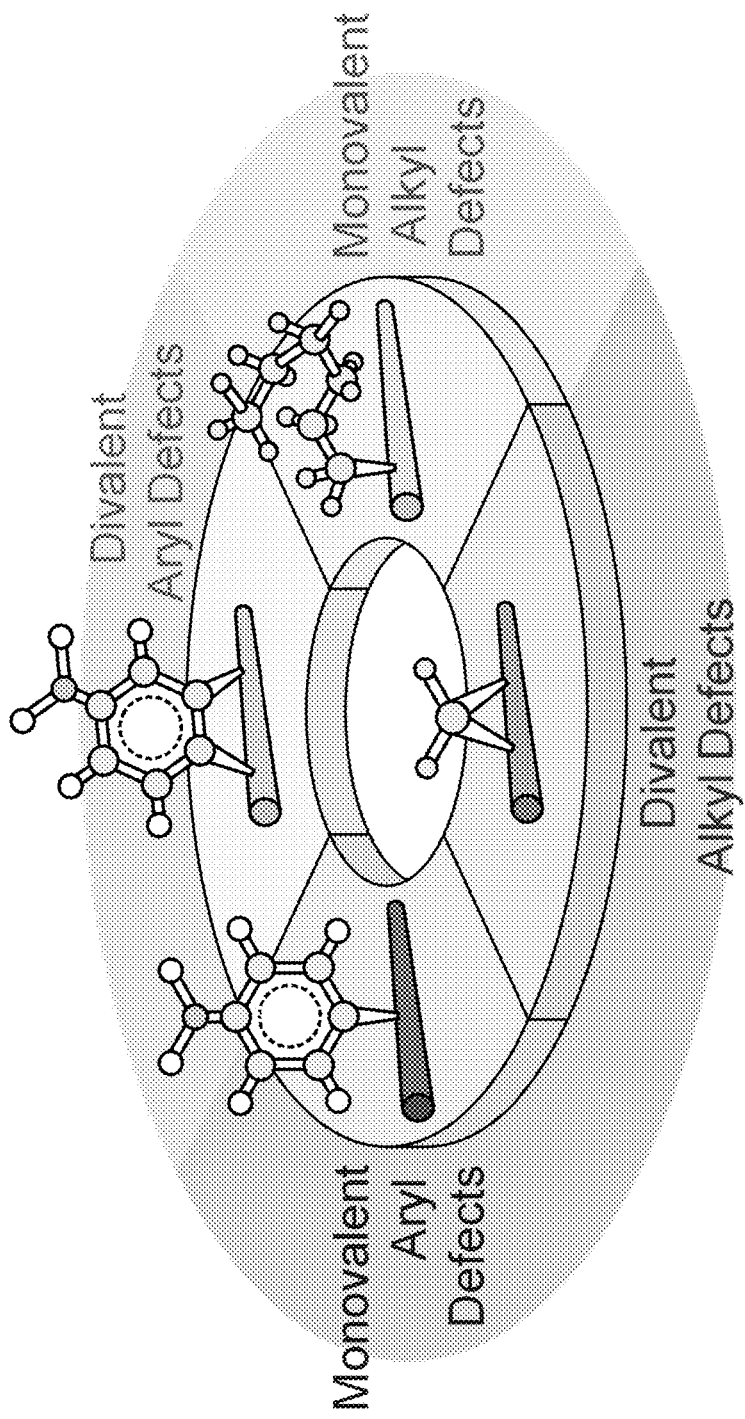
FIG. 22 illustrates schematically four classes of quantum defects.

This novel chemistry allows molecularly tunable fluorescent quantum defects to be created with highly predictable C—C bonding points from a halogen-containing hydrocarbon precursor, including monovalent and divalent alkyl defects and monovalent and divalent aryl defects (FIGS. 21 and 22). In preferred embodiments, the halogen-containing hydrocarbon precursor is a chlorine, a bromide, an iodide or a di-halide alkyl precursor. For example, in some implementations, the halogen-containing hydrocarbon precursor is an alkyl halide. In some embodiments, the halogen-containing hydrocarbon precursor is a polymer containing the reactive halogen. For example, in some implementations the halogen-containing hydrocarbon precursor is a polyoligonucleotide containing the reactive halogen.

This highly controllable, tunable property was unattainable with prior techniques, which are limited to specific types of functional groups. Moreover, exciton properties with well-defined divalent defects have not been previously investigated due to issues relating to the reactivity and stability of precursors (see Piao, Y. et al. (2013) "Brightening of carbon nanotube photoluminescence through the incorporation of sp3 defects," Nat. Chem. 5:840-845; see also Ghosh, S. et al. (2010) "Oxygen doping modifies near-infrared band gaps in fluorescent single-walled carbon nanotubes," Science 330:1656-1659; Zhang, Y. et al. (2013) "Propagative Sidewall Alkylcarboxylation that Induces Red-Shifted Near IR Photoluminescence in Single-Walled Carbon Nanotubes," J. Phys. Chem. Lett. 4:826-830). In FIG. 21, nine exemplary fluorescent quantum defect systems with continuously tunable near-infrared PL and surface functionalities are shown. In some implementations, the $sp^3$ defects were created in a pristine carbon nanostructure during the reacting process. Additional exemplary structures that were synthesized in accordance with disclosed methodologies are listed in Table 4, demonstrating the superior chemical and optical tunability of the disclosed synthetic quantum system.

Figure 23:
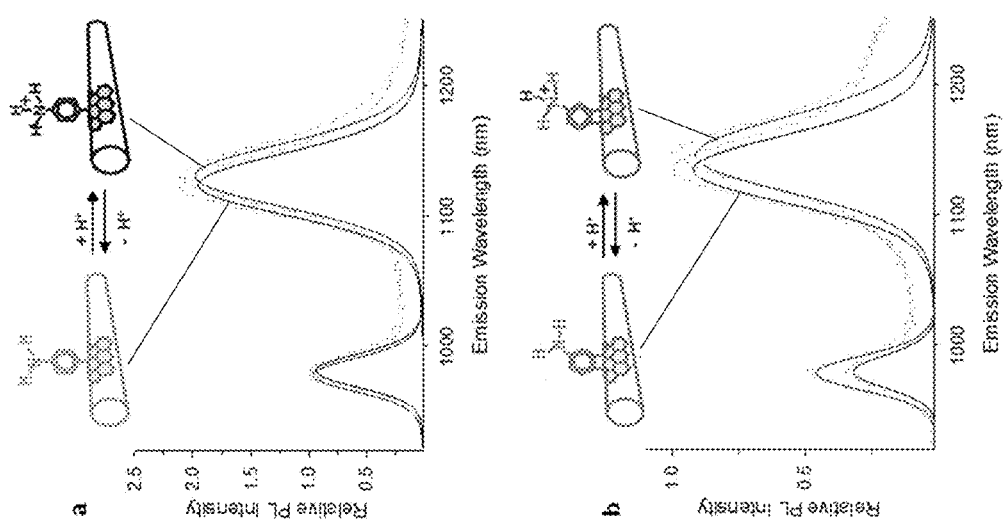
FIG. 23 illustrates pH-responsive defect photoluminescence of monovalent (Panel a) and divalent (Panel b) aminobenzene-functionalized (6,5)-SWCNTs.

By trapping excitons at localized potential wells due to the quantum defects, it is believed that the excitons respond sensitively to chemical events occurring at the defect site due to the amplification effects of the nanotube acting as an antenna (FIG. 23). The nanotube antenna harvests light efficiently and channels the generated excitons to the defect

TABLE 3

PL spectral characteristics of (6,5)-SWCNTs covalently functionalized with different monovalent and divalent groups.

| | monovalent | | | | divalent | | |
|---|---|---|---|---|---|---|---|
| (6,5)-SWCNT-R | | $E_{11}$ (nm) | $E_{11}$- (nm) | Δ E (meV) | (6,5)-SWCNT-R | $E_{11}$ (nm) | $E_{11}$- (nm) | Δ E (meV) |
| —$CH_3$ | H—C(H)(H)— | 980 | 1094 | 132 | >$CH_2$ | 980 | 1125 | 163 |
| —$CF_3$ | F—C(F)(F)— | 980 | 1158 | 194 | >$CF_2$ | 980 | 1164 | 200 |
| —$C_6H_5$ | phenyl | 979 | 1129 | 168 | >$C_6H_4$ | 986 | 1162 | 190 |
| —$C_6H_4NH_2$ | —C6H4—NH2 | 980 | 1121 | 159 | >$C_6H_3NH_2$ | 980 | 1133 | 171 | site, where the excitons recombine to produce near-infrared PL encoding the chemical information at the functional groups. This conclusion is supported by titration experiments in which H+ is detected with both monovalent (6,5)-SWCNT-$C_6H_4NH_2$, and divalent (6,5)-SWCNT>$C_6H_3NH_2$ defects. We find that, as the amine moiety switches between the protonated and deprotonated states, the defect PL was shifted by ~13 meV. This pH switching was not observed in defects that do not contain amines, including —$C_6H_5$ and >$C_6H_4$, confirming the localized nature and the high chemical selectivity of the fluorescent quantum defects.

The near-infrared emitters synthesized in accordance with the disclosed methodologies include a carbon nanostructure (e.g, SWCNTs) comprising $sp^3$ defects in a carbon lattice thereof (created via reaction with a halogen-containing hydrocarbon precursor), and a functional group covalently bonded to the $sp^3$ defects to produce fluorescent defects that emit near-infrared radiation (e.g., having wavelengths between about 800 nm and about 2500 nm). In accordance with disclosed embodiments, the near-infrared emitters may be functionalized with a monovalent alkyl group, a divalent alkyl group, a monovalent aryl group, or a divalent aryl group. For example, in some embodiments, the functional group is —$(CH_2)_n(CF_2)_mX$, wherein n is an integer between 0 and 17, and wherein m is an integer between 0 and 17, and wherein X is CH3, CF3, NH2, N+(CH2CH3)2, or COOH. In other embodiments, the functional group is —$(CH_2)_nCH_3$, wherein n is an integer between 0 and 10.

TABLE 4

Alkyl/aryl halides used in this study and their defect photoluminescence.

(6,5)-SWCNT —RX or RX₂→ (6,5)-SWCNT-R

| (6,5)-SWCNT-R | $E_{11}$ (nm) | $E_{11^-}$ (nm) | ΔE (meV) | Source of Precursor | —X |
|---|---|---|---|---|---|
| Non-functionalized | 979 | — | — | — | |
| —$CH_3$ | 980 | 1094 | 132 | Sigma Aldrich | I |
| —$CH_2CH_2CH_2CH_3$ | 984 | 1099 | 132 | Sigma Aldrich | I |
| —$CH_2CH_2CH_2CH_2CH_2CH_3$ | 981 | 1096 | 133 | Sigma Aldrich | I |
| —$CH_2CH_2CH_2CH_2CH_2CH_3$ | 980 | 1097 | 135 | Sigma Aldrich | Br |
| —$CH_2CH_2CH_2CH_2CH_2CF_3$ | 980 | 1099 | 137 | Oakwood chemical | I |
| —$CH_2CH_2CH_2CH_2CH_2COOH$ | 980 | 1102 | 140 | Sigma Aldrich | Br |
| —$CH_2CH_2CH_2CF_3$ | 981 | 1101 | 140 | Santa Cruz Biotech. | I |
| —$CH_2CH_2CH_2CH_2CF_3$ | 979 | 1104 | 143 | Aurum Pharmatech LLC. | I |
| —$CH_2CH_2CF_3$ | 981 | 1110 | 147 | Sigma Aldrich | I |
| —$CH_2CH_2CH_2CH_2CF_2CF_3$ | 980 | 1107 | 146 | Matrix Scientific | I |
| —$CH_2CF_3$ | 982 | 1114 | 150 | Sigma Aldrich | I |
| —$CH_2CF_2CF_2CF_3$ | 980 | 1114 | 152 | Pfaltz and bauer | I |
| —C₆H₄—NH₂ | 980 | 1121 | 159 | Sigma Aldrich | I |
| —C₆H₄—N(CH₃)₂ | 984 | 1127 | 160 | AstaTech, Inc. | I |
| —C₆H₄—NHCH₂CH₂C(O)NH₂ | 979 | 1121 | 160 | Enamine LLC | I |
| >$CH_2$ ($^{12}C$) | 979 | 1125 | 164 | Sigma Aldrich | $I_2$ |
| >$CH_2$ ($^{13}C$) | 980 | 1125 | 163 | Cambrige Isotope | $I_2$ |
| —C₆H₄—O—CH₂CH₂—O—CH₂CH₂—NH—CH₂CH₂OH | 979 | 1125 | 164 | Hit2lead | I |
| —C₆H₄—H | 979 | 1129 | 168 | Sigma Aldrich | I |
| —C₆H₄—I | 980 | 1131 | 169 | TCI | I |

TABLE 4-continued

Alkyl/aryl halides used in this study and their defect photoluminescence.

(6,5)-SWCNT —RX or RX₂→ (6,5)-SWCNT-R

| (6,5)-SWCNT-R | $E_{11}$ (nm) | $E_{11^-}$ (nm) | $\Delta E$ (meV) | Source of Precursor | —X |
|---|---|---|---|---|---|
| 3,4-dimethylaniline (—C₆H₃(CH₃)₂-NH₂) | 980 | 1133 | 171 | Spectra Group Limited Inc | $I_2$ |
| —CH₂CH₂CF₂CF₂CF₂CF₃ | 983 | 1137 | 170 | Sigma Aldrich | I |
| —CH₂CH₂CF₂CF₂CF₂CF₂CF₂CF₃ | 983 | 1139 | 173 | Sigma Aldrich | I |
| —CHF₃ | 979 | 1138 | 177 | Sigma Aldrich | I |
| 3,4-dimethylpyridine | 980 | 1145 | 182 | Combiphos catalysts, INC | I |
| —CF₂CF₂CF₂CF₂CF₂CF₂CF₂CF₃ | 979 | 1152 | 190 | Sigma Aldrich | I |
| 3,4-dimethylphenyl (—C₆H₃(CH₃)₂-H) | 986 | 1162 | 190 | Sigma Aldrich | $I_2$ |
| —CF₂CF₂CF₂CF₂CF₂CF₃ | 981 | 1155 | 190 | Sigma Aldrich | I |
| —CF₂CF₂CF₂CF₃ | 979 | 1155 | 193 | Sigma Aldrich | I |
| —CF₃ | 980 | 1158 | 194 | Sigma Aldrich | I |
| >CF₂ | 980 | 1164 | 200 | SynQuest Lab | $I_2$ |

EXPERIMENTAL METHODS

Example 1

Aqueous Dispersions of Individual SWCNT Crystals

SWCNTs (HiPco batch #194.3 (Rice University; or CoMoCAT SG65i Lot #000-0036, SouthWest NanoTechnologies, Inc.) were stabilized by 1 wt. % sodium dodecyl sulfate (Sigma Aldrich, ≥98.5%) in deuterium oxide ($D_2O$, Cambridge Isotope Laboratories, Inc., 99.8%) by tip ultrasonication (Misonix) at 35 W, 10° C. in a stainless steel beaker for 2 hours, followed by ultracentrifugation with an Optima LE-80K Ultracentrifuge (Beckman Coulter) at 170,499 g for 2 hours to remove bundled nanotubes and residual catalysts. The individually dispersed SWCNTs were sorted for high purity (6,5)-SWCNTs using gel chromatography (Liu, H. et al. (2011) "Large-scale single-chirality separation of single-wall carbon nanotubes by simple gel chromatography," Nat. Commun. 2), or using the aqueous two phase-assisted separation (Ao, G. et al. (2014) "DNA-Controlled Partition of Carbon Nanotubes in Polymer Aqueous Two-Phase Systems," J. Am. Chem. Soc. 136:10383-10392). The samples were diluted to an optical density of 0.1 at the $E_{11}$ absorption peak of (6,5)-SWCNTs in 1 wt. % SDS in $D_2O$. The concentrations of HiPco and CoMoCAT were determined with a calibration curve from correlated optical density and thermogravimetric analysis. The concentration of chirality-enriched solutions was calculated based on the extinction coefficient previously determined by Zheng et al. (Zheng, M. & Diner, B. A. (2004) "Solution Redox Chemistry of Carbon Nanotubes," J. Am. Chem. Soc. 126:15490-15494).

Synthetic Creation of Fluorescent Quantum Defects in SWCNTs

Sodium bicarbonate (EMP Chemicals, ACS grade), acetonitrile (Signal Aldrich, 99.9%) and alkyl halides were added sequentially to each SWCNT solution, which was kept in a capped glass vial covered by aluminum foil. Acetonitrile was used as a co-solvent for the alkyl halide. Sodium dithionite (Sigma Aldrich, 85%) was then added to the mixture and stirred with a magnetic stir bar at room temperature. For aryl defects, only aryl-containing iodides are utilized and the reaction was triggered by optically exciting the $E_{22}$ transition of the nanotubes for single valent groups. The degree of functionalization was controlled by adjusting the relative amounts of reagents. The reaction was monitored at various times by UV-Vis-NIR absorption and fluorescence spectroscopy.

In Situ UV-Vis-NIR Absorption and Photoluminescence Spectroscopy

The reactions were monitored in situ using a Lambda 1050 UV-Vis-NIR spectrophotometer (Perkin Elmer), which is equipped with both a PMT detector and an extended InGaAs detector, and a NanoLog spectrofluorometer (Horiba Jobin Yvon). For fluorescence spectroscopy, the samples were excited with a 450 W Xenon source dispersed by a double-grating monochromator. Excitation-emission maps and fluorescence spectra were collected using a liquid-$N_2$ cooled linear InGaAs array detector on a 320 mm imaging spectrometer. The spectrofluorometer was calibrated against NIR emission lines of a pencil-style neon spectral calibration lamp (Newport).

Resonant Raman Scattering and X-Ray Photoelectron Spectroscopy

The SWCNTs were precipitated out from solution and deposited on glass slides for Raman scattering or gold-coated silicon substrates for XPS measurement. XPS was taken with Kratos Axis 165 at 25° C. and 175° C. under an ultrahigh vacuum (<1×10$^{-8}$ Torr). Raman spectra were measured on a LabRAM ARAMIS Raman microscope (Horiba Scientific). The samples were excited with a He—Ne (632.8 nm) laser or a 532 nm laser at a power density of 0.014-0.14 mW μm$^{-2}$. Each spectrum was obtained by averaging the data collected from three different spots. Absorption and PL spectra were fitted with Voigt functions using PeakFit software v4.12. No baseline correction was applied during the fitting for PL while a linear background correction was used for the $E_{22}$ absorption.

Creation of Alkylated Fluorescent Quantum Defects

Our starting material was (6,5)-SWCNTs approximately 0.75 nm in diameter and 500 nm in length (or 125 unit cells) on average. Note that our chemistry readily extends to other nanotube chiralities. However, (6,5)-SWCNT was chosen for some testing due to its synthetic abundance and established literature.

The (6,5)-SWCNTs have intrinsic absorption and photoluminescence peaks at 979 nm ($E_{11}$) and 568 nm ($E_{22}$), which arise from their excitonic transitions (FIG. 2) (O'Connell, M. J. (2002) "Band Gap Fluorescence from Individual Single-Walled Carbon Nanotubes," Science 297: 593-596). Covalent attachment of perfluorinated hexyl groups to the nanotubes produced a bright defect PL peak ($E_{11}^-$) at 1155 nm. The observed peak was redshifted from the parent nanotube PL ($E_{11}$) by 177 nm (ΔE=190 meV), and the full width at half-maximum (FWHM) of the peak increased from 37 meV to 69 meV. This new feature arose within minutes of the start of the reaction, and reached the maximum after about 12 minutes and then plateaued in about 25 minutes. The bright feature remained stable over at least nine months under ambient conditions (FIG. 2, Panel c).

Utilizing the disclosed system and methodologies, the chemical synthesize of a new series of quantum emitters was demonstrated from semiconducting SWCNTs of the same chirality through molecular engineering of covalently attached functional groups.

As noted above, (6,5)-SWCNTs were utilized in various embodiments and testing. However, the disclosed methodologies readily extend to various SWCNT species. For example, ΔE data of twelve SWCNT species functionalized with perfluorinated hexyl group is provided in Table 5:

TABLE 5

Quantum defect near-infrared emitters synthesized from —CF$_2$(CF$_2$)$_4$CF$_{13}$ tailored SWCNTs of different chiralities. The energy difference between $E_{11}$ and $E_{11}^-$ emission is denoted as ΔE.

| Chirality | Chiral angle (deg) | diameter (nm) | $E_{11}$ (nm) | $E_{11}^-$ (nm) | ΔE (meV) |
|---|---|---|---|---|---|
| (5,4) | 26.3 | 0.62 | 842 | 1027 | 265 |
| (6,4) | 23.4 | 0.69 | 879 | 1082 | 264 |
| (7,3) | 17 | 0.71 | 999 | 1190 | 198 |
| (9,1) | 5.21 | 0.76 | 926 | 1127 | 239 |
| (6,5) | 27 | 0.76 | 979 | 1152 | 190 |
| (8,3) | 15.3 | 0.78 | 955 | 1169 | 238 |
| (7,5) | 24.5 | 0.83 | 1032 | 1206 | 173 |
| (8,4) | 19.1 | 0.84 | 1112 | 1284 | 149 |
| (7,6) | 27.5 | 0.90 | 1133 | 1291 | 134 |
| (9,4) | 17.48 | 0.916 | 1114 | 1270 | 137 |
| (11,1) | 4.32 | 0.916 | 1277 | 1487 | 137 |
| (10,3) | 12.73 | 0.936 | 1260 | 1445 | 126 |

This new class of synthetic quantum systems shows molecular-specific optical and electronic properties that are distinctly different from existing nanostructures. Given the rich molecular moieties and recent experimental advances in synthesis and sorting of single-chirality SWCNTs (Tu, X. et al. (2009) "DNA sequence motifs for structure-specific recognition and separation of carbon nanotubes," Nature 460: 250-253; Sanchez-Valencia, J. R. e et al. (2014) "Controlled synthesis of single-chirality carbon nanotubes," Nature 512: 61-64), a large variety of near-infrared quantum emitters may be readily designed and chemically created for numerous applications, such as in vivo bioimaging and sensing applications.

Example 2

Purification of (6,5)-SWCNTs.

(6,5)-SWCNT enriched samples were isolated from CoMoCAT SWCNTs (SG65i, lot no. SG65i-L39, Southwest Nanotechnologies) by aqueous two-phase separation (ATP) (Ao, G. et al. (2014) "DNA-Controlled Partition of Carbon Nanotubes in Polymer Aqueous Two-Phase Systems," J. Am. Chem. Soc. 136:10383-10392) using single-stranded DNA (TCT(CTC)$_2$TCT, Integrated DNA Technologies). The DNA was precipitated from solution by sodium thiocyanate (Sigma Aldrich, 98%) and removed after ATP. The remaining SWCNTs were then suspended in 1 wt/v % sodium dodecyl sulfate (Sigma Aldrich, ≥98.5%) in D$_2$O (Cambridge Isotope Laboratories, Inc., 99.8%). The optical density of the solution was adjusted to 0.06 at the (6,5) $E_{11}$ transition for subsequent optical studies. The concentration of the SWCNT solutions was calculated based on the molar absorptivity of (6,5)-SWCNTs, determined by Zheng et al. (Zheng, M. & Diner, B. A. (2004) "Solution Redox Chemistry of Carbon Nanotubes," J. Am. Chem. Soc. 126:15490-15494).

Light Activated Arylation.

A small aliquot of aryl halide in 0.16% v/v acetonitrile (Acros organics, HPLC grade, 99.9%) was added to the chirality-enriched SWCNTs in a molar ratio of 10:1 (SWCNT carbon). In order to avoid the potential PL fluctuation by pH change, the solution pH was adjusted to 8 by adding 7.6 mM NaHCO$_3$ (EMD chemicals, HPLC grade). The SWCNT solutions were irradiated with monochromator-selected light (10 nm slit width) from a 450 W Xenon arc lamp. The power density was measured with an optical power meter (Newport 1916-C) and silicon detector (Newport 918-SL-OD3). The reactions were protected from ambient light throughout the experiments. The evolution of defect PL was monitored through a NanoLog spectrofluorometer (Horiba Jobin Yvon) using a liquid-N$_2$ cooled InGaAs array. The spectral resolution corresponded to 10 nm for the emission detection channel.

Spectroscopic Characterization.

The SWCNT PL was characterized with a NanoLog spectrofluorometer. The SWCNTs were excited at their $E_{22}$ transition (565 nm) at a power of 7.5 mW to obtain the PL spectra with an integration time of 0.5 s. UV-Vis-NIR absorption spectra were obtained with a spectrophotometer equipped with a broadband InGaAs detector (Lambda 1050, PerkinElmer). The path length of absorption measurements was 10 mm. The Raman spectra were obtained under 532 nm excitation using a confocal Raman microscope (LabRAM ARAMIS, Horiba Jobin Yvon). Duo scan mode guaranteed that the measured spectra were averaged data from a 20×20 µm² area rather than using only a single point. For each sample, 10 data scans were taken at different regions of the sample.

Density Functional Theory Calculations.

Geometry optimization was performed for a 10 nm (6,5)-SWCNT and iodobenzene using DFT at the B3LYP/3-21G level of theory, implemented in the Gaussian 09 software package. Solvent effects were included by creating a solute cavity via a set of overlapping spheres in the framework of the polarizable continuum model using the integral equation formalism variant (IEFPCM) (Tomasi, J. et al. (1999) "*The IEF version of the PCM solvation method: an overview of a new method addressed to study molecular solutes at the QM ab initio level*," J. Mol. Struct.: THEOCHEM 464:211-226). Water (ε=78.3553) was chosen as the solvent media. To study the electronic coupling effects between (6,5)-SWCNT and physisorbed iodobenzene with 3.3 Å intermolecular distance, single point calculation was performed using the same functional and basis set. The density of states was plotted using the Multiwfn software.

Light-Triggered Creation of Fluorescent Quantum Defects.

The light-activated chemistry was conducted by mixing aqueous suspensions of (6,5)-SWCNTs with 4-iodoaniline dissolved in acetonitrile, adjusting the pH to 8 using sodium bicarbonate, and then irradiating the solution with 565 nm light. (6,5)-SWCNTs feature three sharp absorption peaks at 980 nm, 565 nm, and 345 nm, known as the first ($E_{11}$), second ($E_{22}$), and third ($E_{33}$) excitonic transitions between the van Hove singularities (Bachilo, S. M. (2002) "*Structure Assigned Optical Spectra of Single-Walled Carbon Nanotubes*," Science 298:2361-2366). In this system, only (6,5)-SWCNTs absorb the 565 nm light due to the $E_{22}$ electronic transition, while the 4-iodoaniline is transparent at this wavelength, as shown by the respective absorption spectra of these materials (FIG. 24, Panel b).

The progress of this light-induced reaction was monitored using in situ photoluminescence (PL) spectroscopy. To minimize the effect of PL measurement on the reaction, a short integration time (0.5 s) was used to obtain the single excitation PL spectra. While pristine (6,5)-SWCNTs fluoresce at 980 nm ($E_{11}$), exposure to the aryl iodide reactant and 565 nm light induces a new PL peak (Etc) at 1130 nm arising from the implanted quantum defects (FIG. 24, Panel b) (Piao, Y. et al. (2013) "*Brightening of carbon nanotube photoluminescence through the incorporation of sp3 defects*," Nat. Chem 5(10):840-845; Kwon, H. et al. (2016) "*Molecularly Tunable Fluorescent Quantum Defects*," J. Am. Chem. Soc. 138:6878-6885). This new emission feature is attributed to the radiative recombination of trapped excitons at local aryl quantum defects (Piao, Y. et al. (2013) "*Brightening of carbon nanotube photoluminescence through the incorporation of sp3 defects*," Nat. Chem 5(10): 840-845; Hartmann, N. F. et al. (2016) "*Photoluminescence Dynamics of Aryl sp3 Defect States in Single-Walled Carbon Nanotubes*," ACS Nano 10(9):8355-8365).

Figure 25:
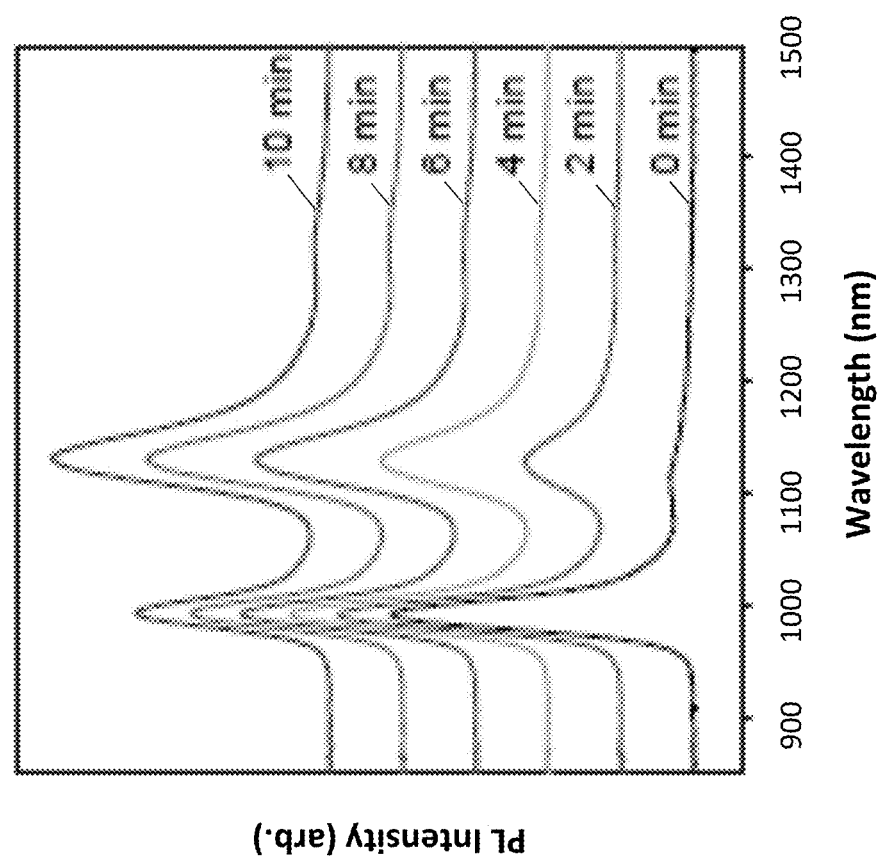
FIG. 25 illustrates PL emission spectra of (6,5)-SWCNTs during the first 10 min of the continuous irradiation at 565 nm (at minutes 0, 2, 4, 6, 8 and 10).
Figure 26:
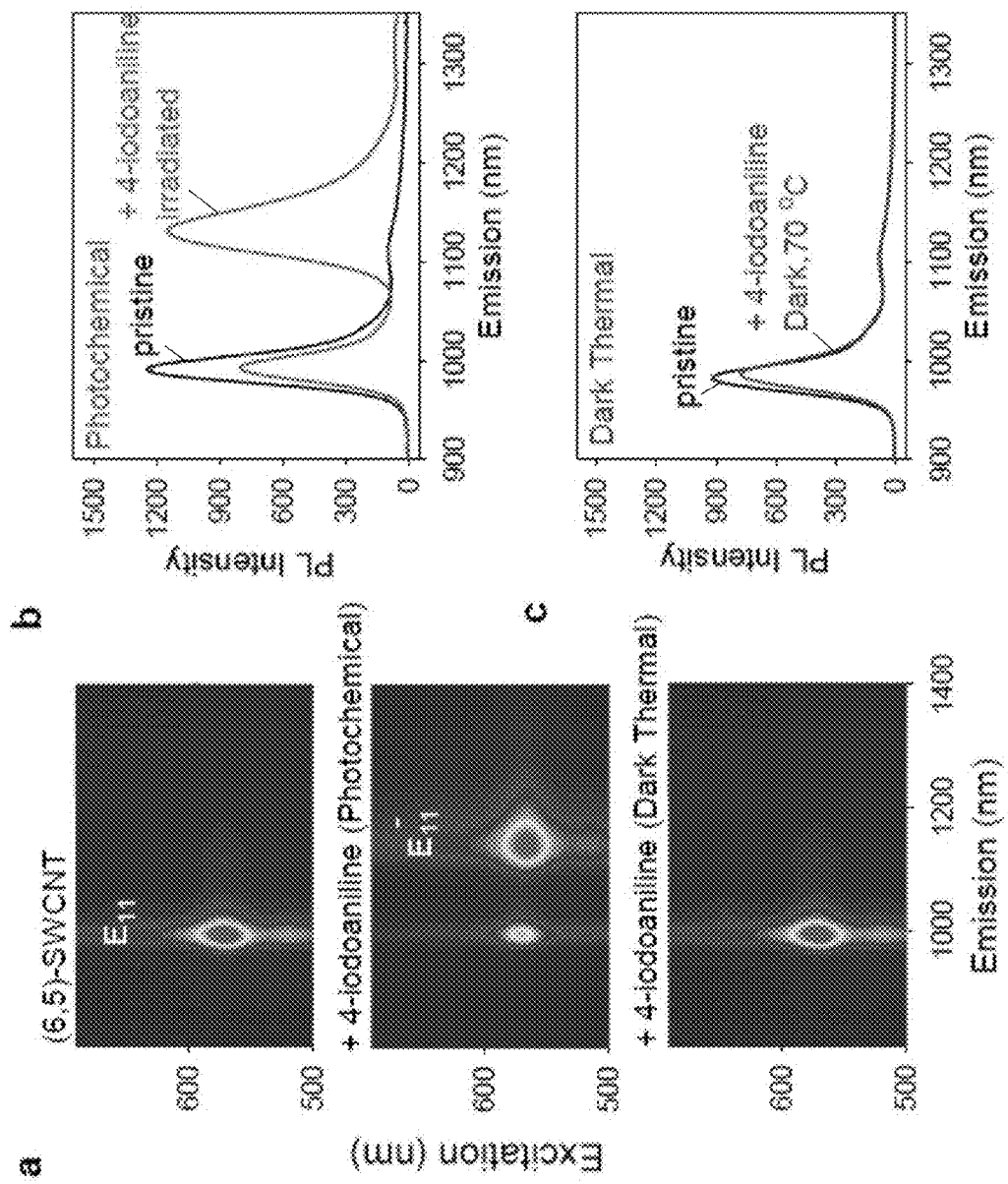
FIG. 26 illustrates the photochemical nature of the light activated reaction. Panel a: The excitation-emission PL maps of the pristine (6,5)-SWCNTs (top), (6,5)-SWCNTs that exposed to 4-iodoaniline under dark, thermal (70° C. for 1 h) (middle), and photochemical (565 nm excitation for 10 min) (bottom) conditions. The PL spectra of the (6,5)-SWCNT suspension before and after it was exposed to 4-iodoaniline mixture and the solution was then (Panel b) protected from light and the temperature was elevated to 70° C. for 1 h, or (Panel c) under 10 min of continuous irradiation at 565 nm.
Figure 27:
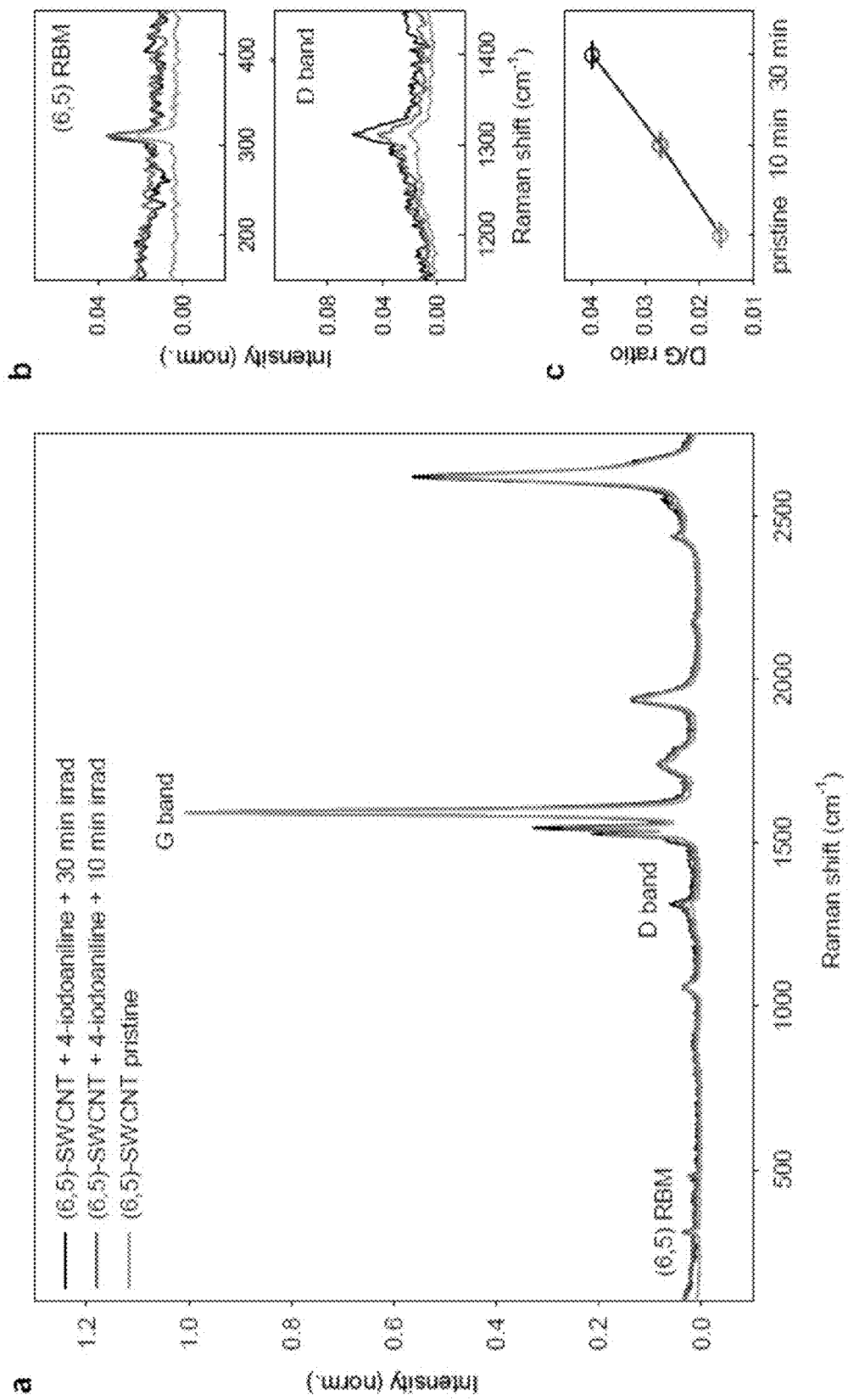
FIG. 27 illustrates Raman spectra of (6,5)-SWCNTs. Panel a: Raman spectra of (6,5)-SWCNTs plus 4-iodoaniline after 30 min and 10 min irradiation at 565 nm (black and red) and the pristine control (green). The intensity is normalized to the G band. Raman spectra were collected with 532 nm excitation in duo scan mode that averages spectra from a 20×20 µm$^2$ area. Panel b: Enlarged Raman spectra of the radial breathing mode (RBM) and D band. Panel c: The integrated intensity ratio of the D band (1250-1350 cm$^{-1}$) to G band (1475-1650 cm$^{-1}$). The D/G ratio increased from 0.016 to 0.040 after 30 min irradiation in the presence of 4-iodoaniline. Error bars are standard deviations of the D/G ratio values for 10 Raman scans.
Figure 28:
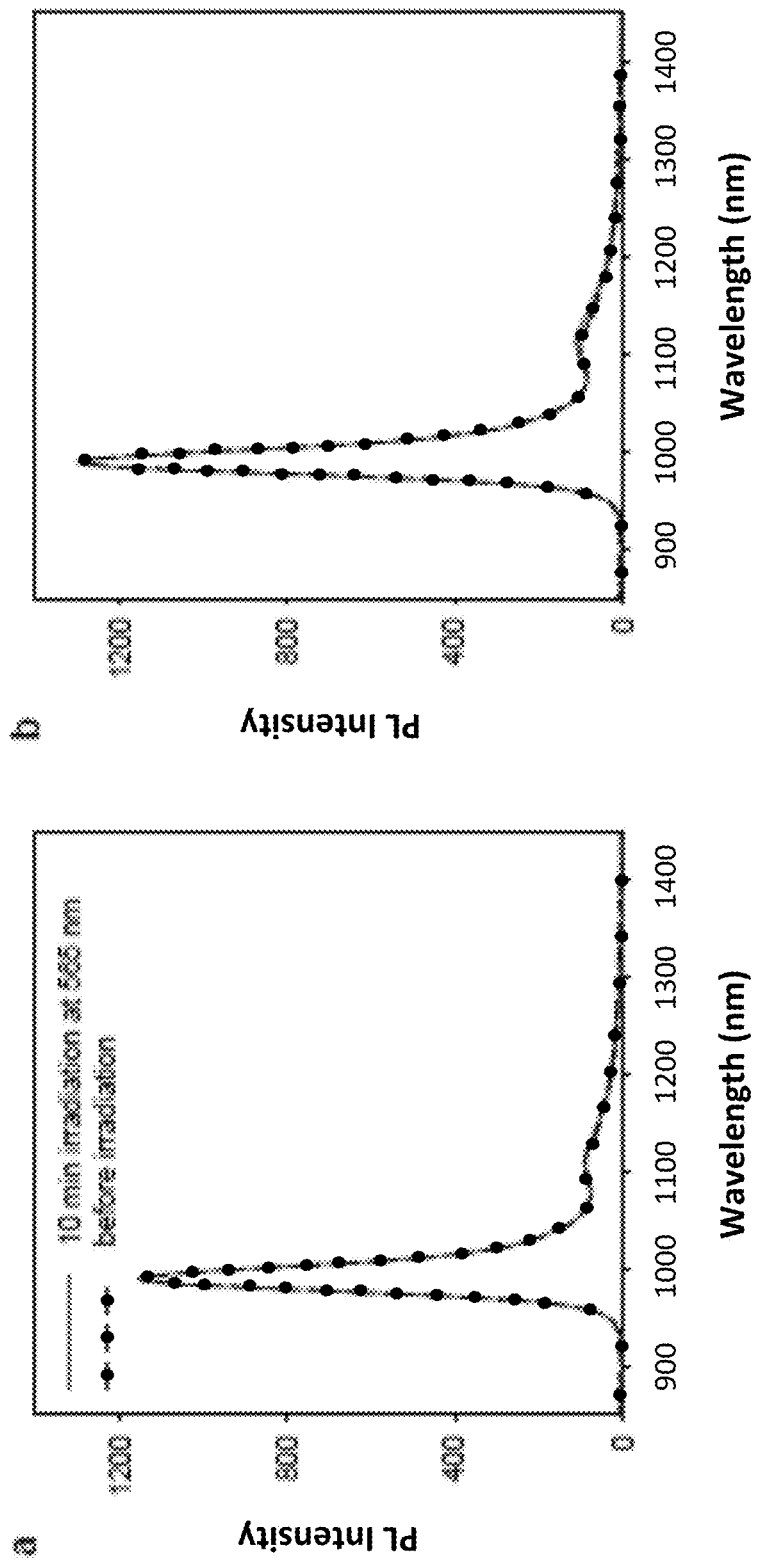
FIG. 28 illustrate PL spectra before and after irradiation, showing (Panel a) 10 min irradiation of (6,5)-SWCNT solution alone, or (Panel b) by adding just sodium bicarbonate and no 4-iodoaniline to the solution does not create new PL emission. The small PL peak at 1115 nm originates from the phonon sideband of the E$_{11}$ excitons.

During 10 minutes of continuous irradiation, $E_{11}^-$ continuously increased while the Eu emission diminished (FIG. 25). Excitation-emission maps of the pristine and functionalized (6,5)-SWCNT samples demonstrate that the $E_{11}$ and $E_{11}^-$ emission peaks are correlated with the $E_{22}$ transition of the (6,5)-SWCNT (FIG. 26, Panel a). This new defect emission was accompanied by an increase in the Raman D/G ratio of the functionalized (6,5)-SWCNTs (FIG. 27), which confirms the covalent attachment of aryl groups to the sp² carbon lattice (Piao, Y. et al. (2013) "*Brightening of carbon nanotube photoluminescence through the incorporation of sp3 defects*," Nat. Chem 5(10):840-845). Irradiation of the SWCNT solution alone or by adding just sodium bicarbonate (without 4-iodoaniline) does not generate the defect PL (FIG. 28).

It was found that this light-driven creation of aryl quantum defects is significantly more efficient than the alternative arylation method using diazonium chemistry (Piao, Y. et al. (2013) "*Brightening of carbon nanotube photoluminescence through the incorporation of sp3 defects*," Nat. Chem 5(10):840-845). After light irradiation for only 10 minutes, the $E_{11}^-$ emission is already brighter than $E_{11}$ (FIG. 26). This high defect creation efficiency may be due to electron-transfer (from the photoexcited SWCNT) promoted generation of aryl radicals.

Calculating the Reaction Rate of the Light Activated Arylation Reaction

A diffusion limited exciton contact-quenching model (Miyauchi, Y. et al. (2013) "*Brightening of excitons in carbon nanotubes on dimensionality modification*," Nat. Photonics 7:715-719) was used to calculate the reaction rate of the light activated arylation reaction based on the results from the continuous irradiation experiment. The number of photons ($N_{11}$) emitted from the $E_{11}$ state is related to the PL intensity of $E_{11}$ ($I_{11}$) by $N_{11} \approx aI_{11}$, where a is a constant. Under continuous irradiation, the $E_{11}^-$ to $E_{11}$ PL intensity ratio, $I_{11}^-/I_{11}$ (t), is proportional to the number of fluorescent quantum defects at reaction time t. $N_{11}$ is proportional to the PL quantum yield ($\eta_{11}$) and the number of $E_{11}$ excitons generated after photoabsorption ($N_{abs}$). The number of $E_{11}$ photons in the unfunctionalized SWCNTs (No) can be calculated by:

$$N_0 = N_{abs}\eta_{11}. \quad \text{eq. 1}$$

Considering the diffusion of photogenerated 1D excitons and successive trapping by the local defect state ($E_{11}^-$), the number of photons emitted from the $E_{11}^-$ state ($N_{11}^-$) is expressed as:

$$N_{11}^- = N_{abs}\eta_{11}^- \frac{k_{dif}}{k_i + k_{dif}} \frac{n_{11}^-}{n_q + n_p + n_{11}^-} \quad \text{eq. 2}$$

in which $\eta_{11}^-$ is the PL quantum yield of a single fluorescent aryl defect site; $k_{dif}$ is the effective decay rate of the Eu excitons due to exciton diffusion and successive trapping at the local quenching sites (including intrinsic quenching sites, physisorbed aryl molecules, and aryl defects); and $n_q$, $n_p$, and $n_{11}-$ are the number of defects on the SWCNT, induced by intrinsic quenching sites, physisorption of aryl iodide, and fluorescent quantum defects, respectively. The factor $k_i$ is the effective decay rate for all possible mechanisms of exciton recombination other than the diffusion-limited mechanism. In the present calculation, the contribution of $k_i$ ($k_i \ll k_{dif}$) was ignored, and therefore $k_{dif}/(k_i + k_{dif}) \sim 1$. Only the trapped $E_{11}$ exciton at a local defect can radiatively decay as $E_{11}^-$ PL.

Therefore, by combining eq. 1 and 2, eq. 3 is obtained as follows:

$$\frac{N_0}{N_{11}^-} = \frac{\eta_{11}}{\eta_{11}^-} \frac{n_q + n_p + n_{11}^-}{n_{11}^-} \quad \text{eq. 3}$$

Meanwhile, the light activated arylation of SWCNTs may be expressed as:

$$SWCNT(sp^2 \text{ carbon}) + ArI \rightarrow SWCNT \ldots ArI(physisorbed) \quad \text{eq. 4}$$

$$SWCNT \ldots ArI \xrightarrow{h\nu} SWCNT-Ar(sp^3 \text{ defect}) \quad \text{eq. 5}$$

The rate constant of aryl iodide (ArI) physisorption to the SWCNT sidewall (eq. 4) is defined as $k_p$ and the rate constant of covalent attachment of physisorbed ArI as an $sp^3$ aryl defect is defined as $k_c$. Thereby, eq. 3 may be re-written using the rate constants of the chemical reactions:

$$\frac{N_0}{N_{11}^-} = \frac{\eta_{11}}{\eta_{11}^-} \frac{n_q + k_p t + k_c t}{k_c t} \quad \text{eq. 6}$$

Considering the linear correlation between the number of photons and the detected PL intensity, eq. 7 is obtained:

$$\frac{I_o}{I_{11}^-} = \frac{\eta_{11}}{\eta_{11}^-}\left(\frac{n_q}{k_c}\frac{1}{t} + \frac{k_p}{k_c} + 1\right) \quad \text{eq. 7}$$

By fitting the time dependent intensity ratio with eq. 7 (FIG. 29), it was derived that $(k_p/k_c)(\eta_{11}/\eta_{11}^-)$ is ~8.6 and $(n_q/k_c)(\eta_{11}/\eta_{11}^-)$ is ~77. The literature values of $\eta_{11}^-$ and $n_q$ (4 quenching defects in a 0.36 μm long SWCNT) were adapted for the calculations (Hertel, T. et al. (2010) "*Diffusion Limited Photoluminescence Quantum Yields in 1-D Semiconductors: Single-Walled Carbon Nanotubes,*" ACS Nano 4(12):7161-7168).

Figure 30:
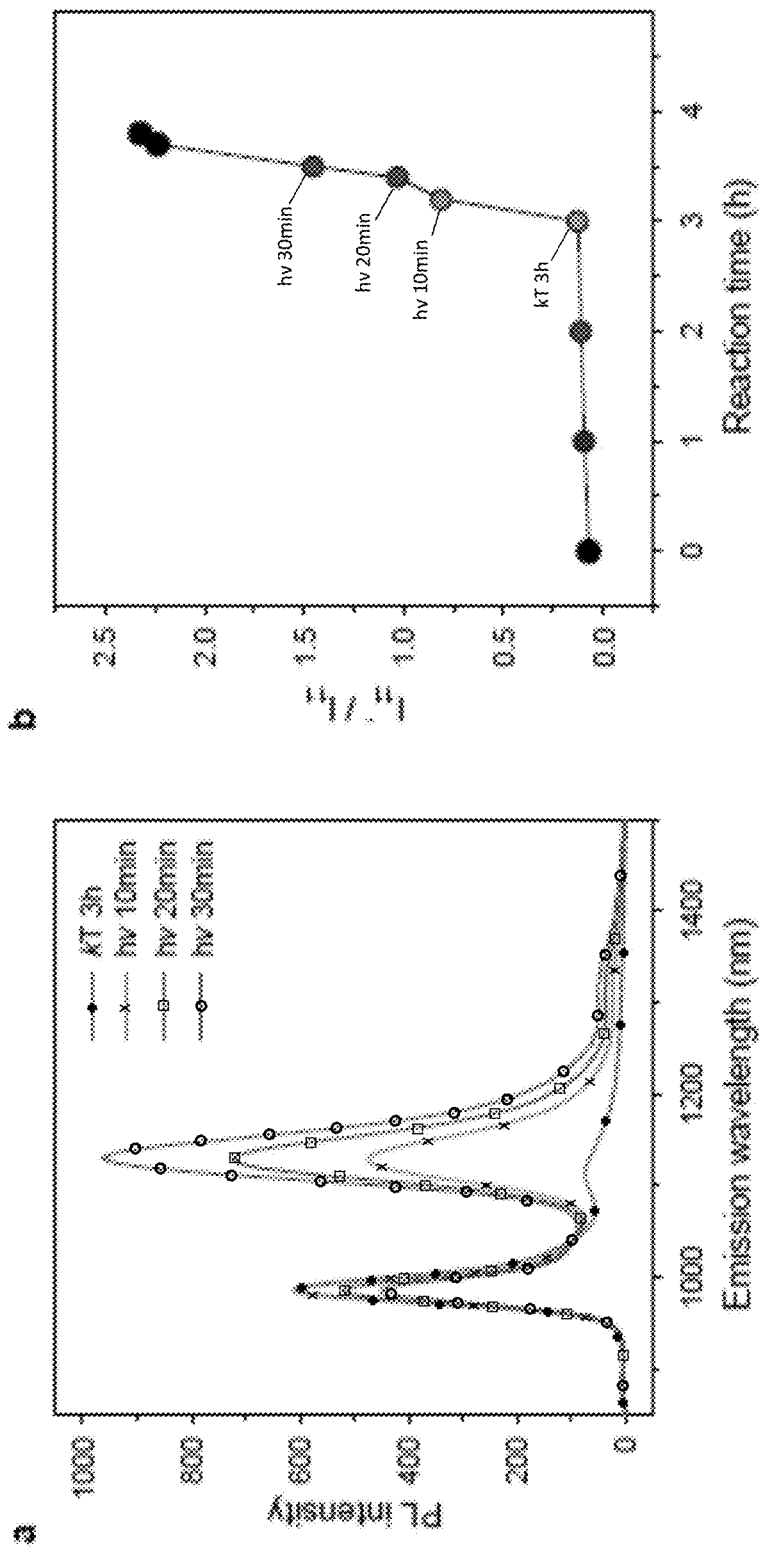
FIG. 30 illustrates the use of light to drive the reaction. Panel a: The photoluminescence spectra of the (6,5)-SWCNT and 4-iodoaniline mixture after it was protected from light and the temperature was elevated to 70° C. for 3 h and then subsequently exposed to 565 nm light for 10-30 min. Panel b: The evolution of the integrated E$_{11}^{-1}$/E$_{11}$ area ratio (I$_{11}^-$/I$_{11}$) over time during the heating and subsequent irradiation periods. No reaction occurred during the heating phase as evidenced by the absence of defect PL. The defect PL, however, immediately evolved upon 565 nm light irradiation.
Figure 31:
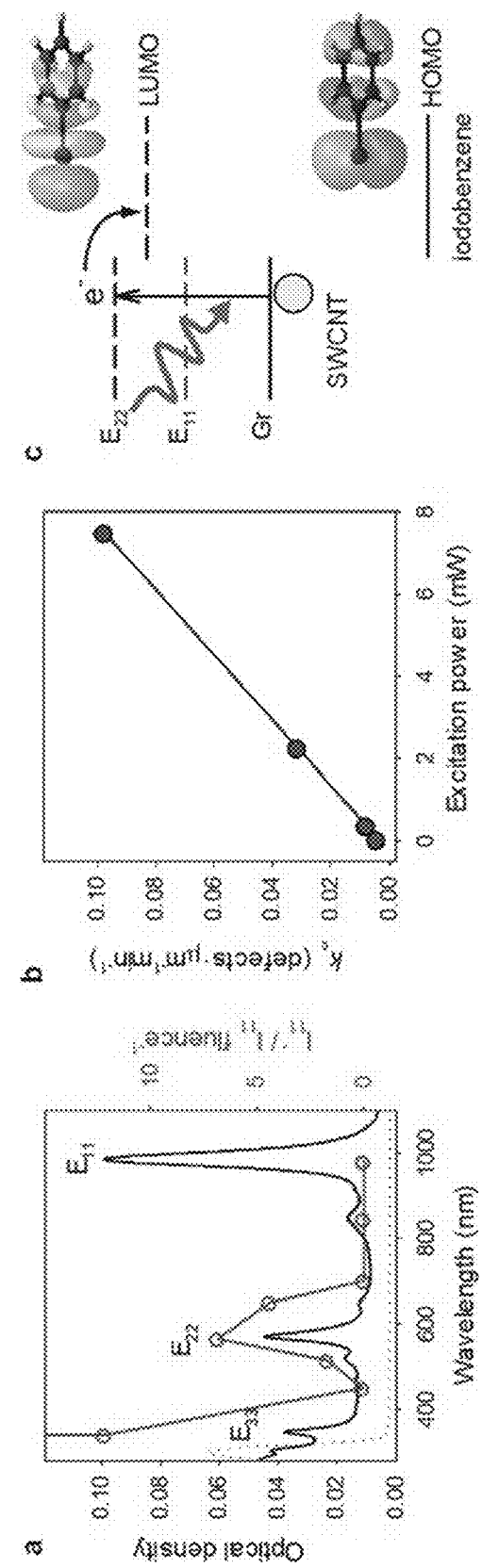
FIG. 31 illustrates the light-induced electron transfer driving the reaction. Panel a: The degree of functionalization estimated by I$_{11}^-$/I$_{11}$ (circles) closely follows the (6,5)-SWCNT absorption spectrum (black line trace). High reaction efficiencies were observed when the wavelength of the irradiating light resonated with the electronic transitions (E$_{22}$ and E$_{33}$) of the (6,5)-SWCNTs. Panel b: The reaction rate (k$_c$) demonstrates a linear relationship (R$^2$=0.999) with the irradiation power. Panel c: The electronic structures of (6,5)-SWCNTs and iodobenzene depict the electron transfer mechanism from the valence band of the (6,5)-SWCNT to the LUMO of iodobenzene.
Figure 32:
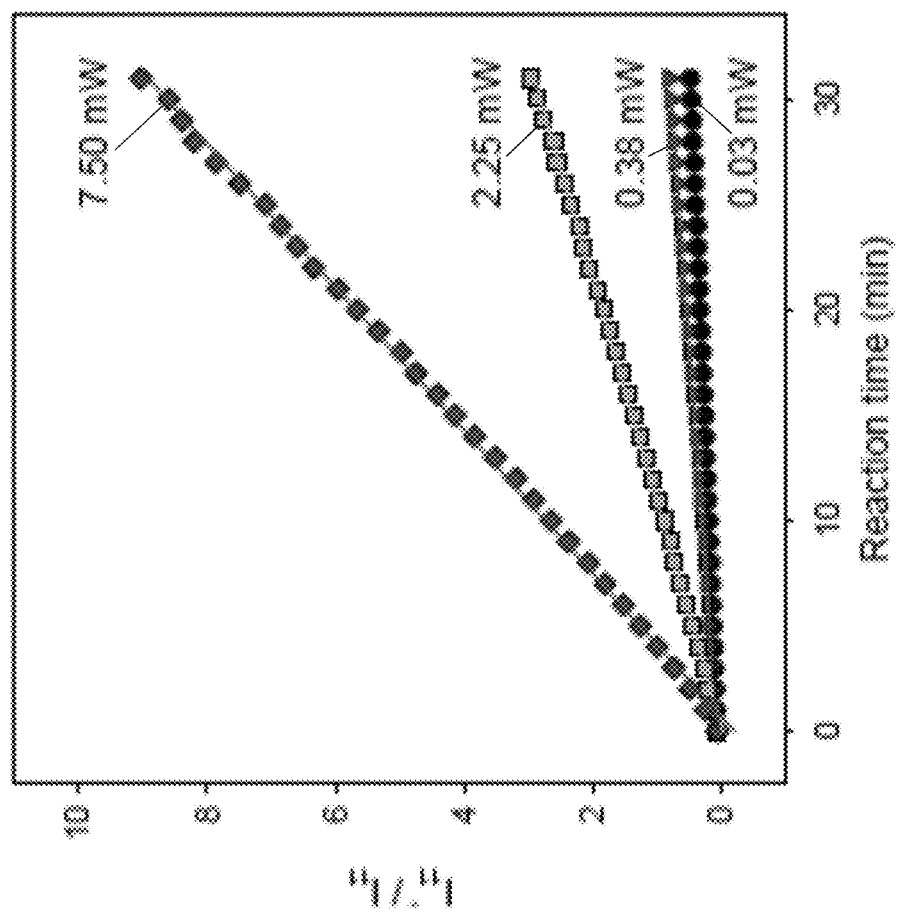
FIG. 32 illustrates the irradiation power affecting the degree of functionalization. The evolution of the $I_{11}^-/I_{11}$ ratio over time at various photon fluences of 565 nm light. Regardless of the photon fluence, the evolution of the PL intensity was highly linear with the irradiation time ($R^2$=0.999).

Additionally, the correlation plotted in FIG. 30 (Panel b), FIG. 31 (Panel b), and FIG. 32, and the reaction rate of the light activated reaction was obtained from the following series of equations:

$$N_{11}(t) = N_{abs}\eta_{11}^* \quad \text{eq. 8}$$

$$\eta_{11}^* \propto \frac{k_{1D}(T)}{D(T)} \frac{1}{(n_q + n_p + n_{11}^-)^2} \quad \text{eq. 9}$$

$$\frac{I_{11}^-(t)}{I_{11}(t)} = \eta_{11}^- \frac{k_{dif}}{k_1 + k_{dif}} \frac{n_{11}^-}{n_q + n_p + n_{11}^-}\left[\frac{C}{n_q + n_p + n_{11}^-}\right]^{-2} \quad \text{eq. 10}$$

$$\propto n_{11}^-(n_q + n_p + n_{11}^-) \quad \text{eq. 11}$$

$$\approx n_{11}^- \cdot n_q, \text{ where } n_q \gg n_p + n_{11}^- \quad \text{eq. 12}$$

in which $N_{11}$ and $\eta_{11}^*$ are the number of photons emitted from $E_{11}$ state and the En quantum yield in functionalized SWCNT; C in eq. 10 accounts for the temperature dependent radiative decay rate of 1D excitons (km); and D is the diffusion constant of 1D excitons.

Figure 29:
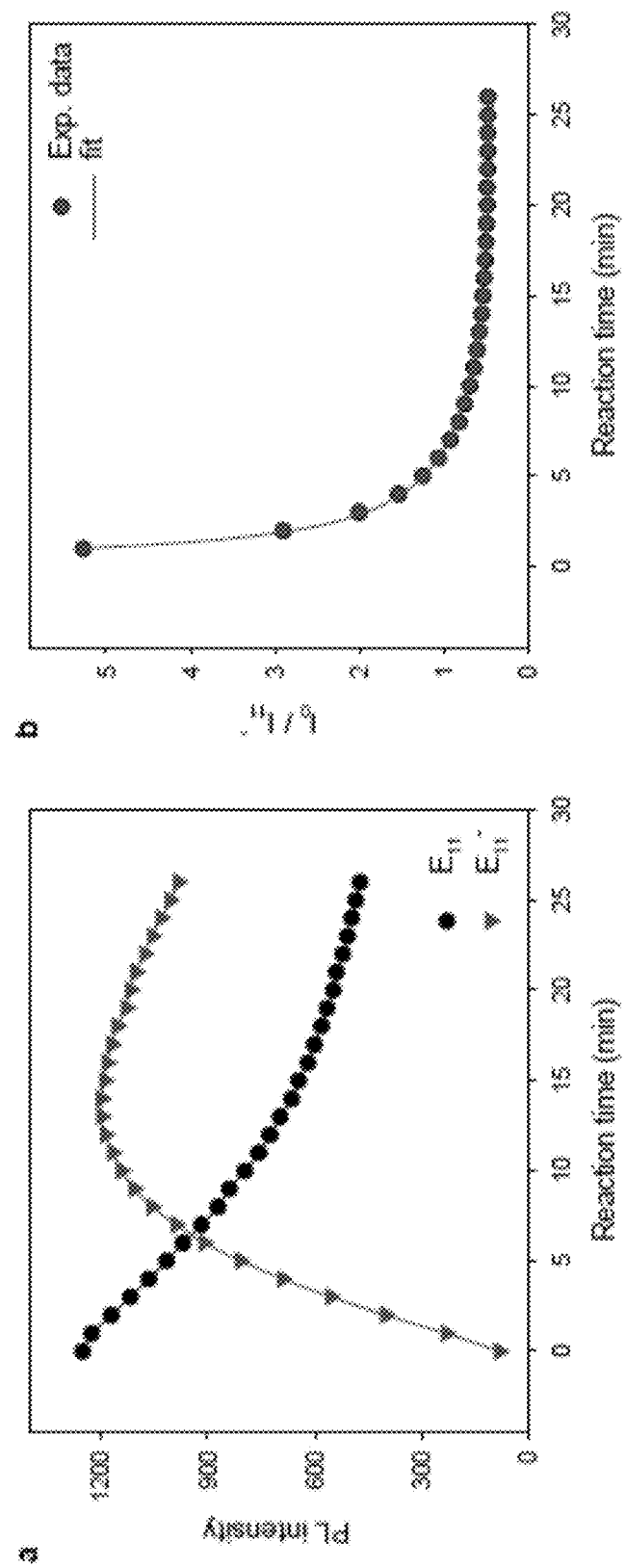
FIG. 29 illustrates that kinetics of the photochemical arylation of (6,5)-SWCNT with 4-iodoaniline. Panel a: Evolution of the E$_{11}$ and E$_{11}^-$ emissions. The intensity of the E$_{11}^-$ emission reached a maximum after 13 min of continuous irradiation with 565 nm light while the E$_{11}$ emission continued to decrease. Panel b: The relation between I$_0$/I$_{11}^-$ and the reaction time (dots) was used to extract the light-activated reaction rate by fitting the data with eq. 7 (line).

If the first term, $n_q$ in eq. 11 is significantly larger than $n_p + n_{11}^-$, the intensity ratio $I_{11}^-(t)/I_{11}(t)$ is proportional to the number of fluorescent quantum defects at the reaction time t. The fitting of experimental results (FIG. 29) confirms that the assumption is valid during the initial reaction time. The number of fluorescent quantum defects at reaction time t corresponds to the product of the reaction rate ($k_c$) and t. Based on this model, we can determine from the experimental data that the rate constant of this light-induced arylation reaction ($k_c$) is 0.098 defects·μm$^{-1}$min$^{-1}$ at 7.5 mW of 565 nm light (FIG. 29).

Photochemical Reaction Mechanism

In contrast to the high reaction rate under 565 nm light, the arylation chemistry is thermally inert and does not occur in the absence of light. When the bulk solution temperature was heated at 70° C. for 1 h with protection from light, no reaction occurred, as shown by the absence of the defect $E_{11}^-$ PL (FIG. 26, Panels a and c). The slight decrease in the Eu PL intensity after heating can be attributed to physisorbed aryl halide (Cognet et al. (2007) "*Stepwise quenching of exciton fluorescence in carbon nanotubes by single-molecule reactions,*" Science 316:1465-1468) and SWCNT aggregation (Wang, D & Chen, L. (2007) "*Temperature and pH-Responsive Single-Walled Carbon Nanotube Dispersions,*" Nano Lett. 7(6):1480-1484). However, once the heated solution was exposed to light, the reaction immediately evolved (FIG. 30).

Given that only (6,5)-SWCNTs absorb 565 nm light in this system (FIG. 24, Panel b), it was verified that SWCNTs were the source of photo-reactivity. The (6,5)-SWCNT solution was continuously irradiated for 10 min at selected wavelengths ranging from ultraviolet (UV) to the near-IR. The reaction was found to strongly depend on the wavelength of light used to drive the reaction (FIG. 31, Panel a). To quantitatively compare at each wavelength, we normalized $I_{11}^-/I_{11}$ ratios after 10 min irradiation, which are correlated with the number of fluorescent quantum defects created by the reaction via the excitation fluence. The results indicate that reaction rate closely follows the absorption spectrum of (6,5)-SWCNTs, with the greatest rate of reaction occurring at the wavelength where the irradiating light resonates with the $E_{22}$ and $E_{33}$ electronic transitions of the (6,5)-SWCNTs. These observations unambiguously confirm that the SWCNT itself is targeted by light to drive the reaction. Interestingly, for irradiation wavelengths longer than 700 nm, no defect PL evolved. The molar extinction coefficient of (6,5)-SWCNTs is the highest at 980 nm (FIG. 24, Panel b) among the selected irradiation wavelengths. Despite this, the bonding reaction does not occur by excitation at 980 nm and similar photon fluxes, which indicates that the photon energy at this wavelength is too low to overcome the reaction barrier. This strong dependence on the exciting photo-energy is a hallmark characteristic of photochemistry that involves electron transfer.

To further verify the electron transfer nature of this photochemistry, a mixture of 4-iodoaniline and (6,5)-SWCNTs was excited with 565 nm light at various photon fluences spanning over two orders of magnitude. At each irradiation power, $I_{11}^-/I_{11}$ increased linearly ($R^2$=0.999) with exposure time (FIG. 32), indicating a stable and nearly constant reaction rate within the observed time period. Even at an irradiation power reaching 0.03 mW, which accounts for just 0.4% of the typical power utilized for this study (7.5 mW), the light-activated arylation reaction still takes place, though at a slower rate. The reaction rate ($k_c$ at any irradiation power can be obtained by applying the aforementioned diffusion limited 1D-0D kinetic model to the fluence-dependent PL evolution results (FIG. 32). In doing so, it was determined that was linear ($R^2$=0.999) with the irradiation power (FIG. 31, Panel b). This threshold free, linear relationship with the fluence further supports a photochemical rather than photothermal mechanism for the reaction between SWCNTs and 4-iodoaniline upon irradiation. The Stark-Einstein law states that for each photon of light absorbed by a chemical system, only one molecule is activated for subsequent reaction, and therefore the photochemistry reaction rate is proportional to the number of incident photons of a given frequency. In contrast, such a linear relationship does not exist in the case of the photothermal effect where optically-induced heating is used to activate the reaction. Under low photon fluence, the photogenerated heat would be inadequate to drive the reaction thermally, whereas photochemically even a single photon can overcome the reaction barrier by pumping the electron to a sufficiently high energy level.

Figure 33:
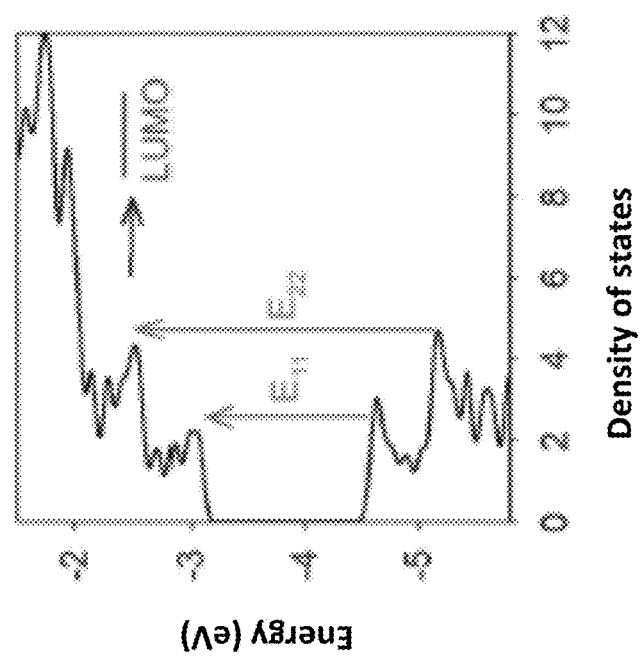
FIG. 33 illustrates the density functional theory (DFT) calculations showing the lowest unoccupied molecular orbital (LUMO) for physisorbed iodobenzene on a 10 nm (6,5)-SWCNT. Panel a: The density of states versus energy plot of 10 nm long (6,5)-SWCNT and the LUMO of physisorbed iodobenzene. The π-π stacking between iodobenzene and SWCNT lowers the LUMO of iodobenzene. Panel b: LUMO of physisorbed iodobenzene that exhibits the electronic coupling with LUMO+29 of (6,5)-SWCNT. Isocontour is 0.002.
Figure 33:
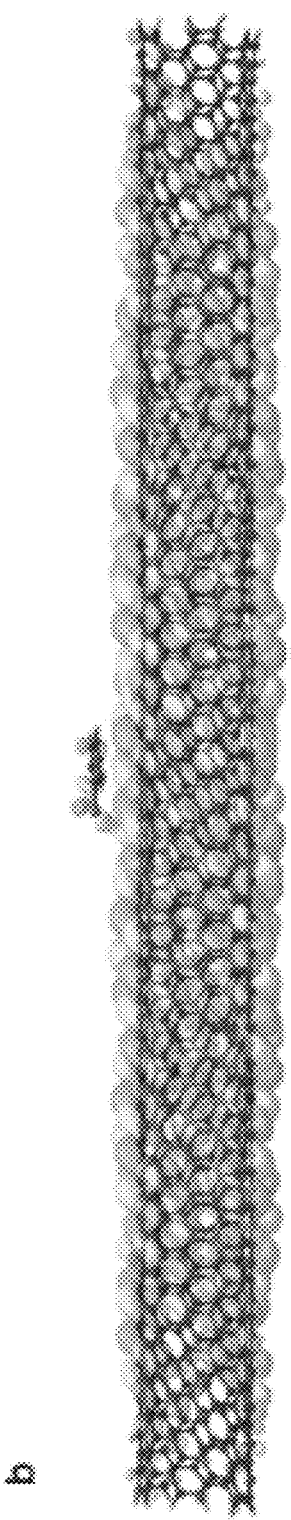

As shown by the data and experiments, a reaction mechanism provides for photoinduced electron transfer between the SWCNT and the aryl halide (FIG. 31, Panel c, and FIG. 33). For (6,5)-SWCNTs, strong light absorption from the valence to conduction bands occurs between the van Hove singularities. Upon absorption of a photon that resonates with the electronic transitions of the SWCNT, the photoinduced electron in the valence band can then be transferred to the lowest unoccupied molecular orbital (LUMO) of the physisorbed 4-iodoaniline to produce a 4-iodoaniline radical anion, which dissociates into an iodine anion and an aniline radical. The aniline radical readily grafts to the SWCNT, converting an $sp^2$ hybridized carbon to $sp^a$. Such an electron transfer mediated decomposition of aryl halides and subsequent covalent functionalization to the $sp^2$ carbon lattice has been studied by electrochemical methods (Koefoed, L. et al. (2017) "*Covalent Modification of Glassy Carbon Surfaces by Electrochemical Grafting of Aryl Iodides*," Langmuir 33(13):3217-3222). As shown by the present experiments, the photoinduced electron behaves like an electrochemically injected electron to drive this photochemical reaction.

This electron-transfer mechanism is further supported by density functional theory (DFT) calculations (FIG. 31, Panel c, and FIG. 33), in which it was determined that the LUMO of iodobenzene lies 0.58 eV above the valence band of the (6,5)-SWCNT, but was lower than the second van Hove singularities of the conduction band (De Blauwe, K. et al. (2010) "*Combined experimental and ab initio study of the electronic structure of narrow-diameter single-wall carbon nanotubes with predominant (6,4),(6,5) chirality*," Phys. Rev. B 82:125444; Hertel, T. et al. (2010) "*Diffusion Limited Photoluminescence Quantum Yields in 1-D Semiconductors: Single-Walled Carbon Nanotubes*," ACS Nano 4(12):7161-7168). Given the relatively low energy of the (6,5)-SWCNT's valence band, the uphill transfer of an electron from this energy level to the iodobenzene LUMO is unlikely to occur at room temperature, which is in agreement with the dark control wherein no functionalization was observed. To realize the proposed electron transfer, electrons must be promoted from the valence band to higher excited states. This finding is consistent with the observed wavelength-dependent reaction efficiency. Although the $E_{22}$ to $E_{11}$ relaxation is the fast and dominating pathway for an excited SWCNT, a small possibility of intermolecular electron transfer is sufficient to drive the covalent functionalization due to the photochemical nature. Such conclusion is in agreement with the observed reaction rate (0.098 defects $\mu m^{-1}$ $min^{-1}$), which is relatively insignificant compared to the number of photons absorbed by the nanotube. It is also noted that the electronic transition of the SWCNTs cannot occur by raising temperature alone, as the energy barrier for electron transfer is high (178 kJ/mol), which explains the absence of reaction even at raised solution temperatures when light was not applied (FIGS. 26 and 30).

Figure 34:
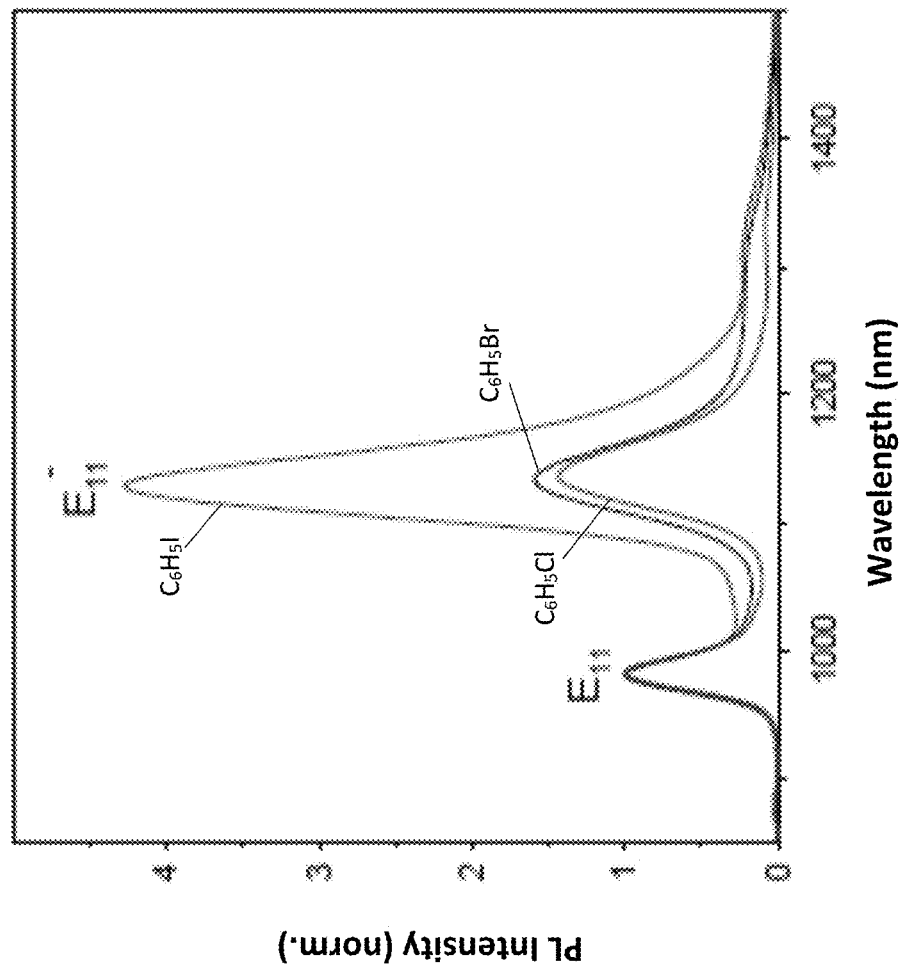
FIG. 34 illustrates the PL spectra of (6,5)-SWCNTs functionalized by different aryl halides ($C_6H_5X$, X=Cl, Br, or I) under 20 min irradiation of 565 nm light at 7.5 mW. Each PL spectra is normalized to the En PL. Fluorescent quantum defects can be created by irradiation from virtually any aryl halide precursor except aryl fluoride.

This light-activated reaction of SWCNTs is not limited to aryl iodides. Fluorescent quantum defects may be created by irradiation from virtually any aryl halide precursor except aryl fluoride (FIG. 34). The reaction efficiency follows the trend of the leaving group ability, with I>Br>Cl>F. Although the $E_{11}$ and $E_{11}^-$ vary around their peak positions slightly (by 7.5 meV) due to the different dielectric environments, the energy difference between $E_{11}$ and $E_{11}^-$ ($\Delta E_{optical}$) remains unchanged for aryl defects of the same chemical nature (e.g., 157 meV for (6,5)-SWCNT-$C_6H_5$).

Molecularly Tunable Defect Emission

Figure 35:
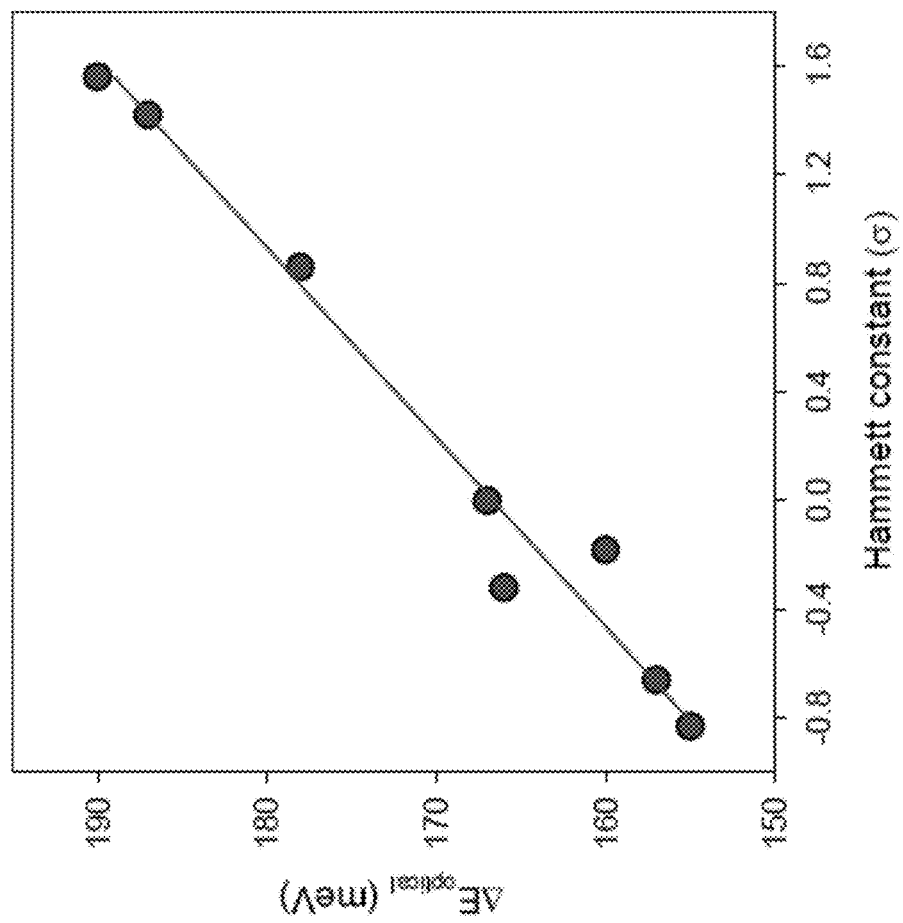
FIG. 35 illustrates the molecularly tunable emission energy of the defect PL. The new defect photoluminescence can be controlled by changing the terminating groups of the aryl halide. The energy difference between $E_{11}$ and $E_{11}^-$ ($\Delta E_{optical}$) is linearly correlated to the electron withdrawing ability of the moieties, which can be quantified with the Hammett constant.

The defect PL is molecularly tunable by changing the terminating groups of the aryl halides (Table 6 and FIG. 35). Table 6 presents the tunability of the defect PL wavelength. By changing the terminating groups of the aryl halides, 32 meV tunability is achieved in $\Delta E_{optical}$ for (6,5)-SWCNTs. The molecular tunability is linearly correlated to the electron withdrawing ability of the functional groups, which can be quantified using the Hammett constant (σ) (Hansch, C. et al. (1977) "*Substituent constants for correlation analysis*," J. Med. Chem. 20:304) (FIG. 35), which is consistent with previously demonstrated diazonium chemistry (Piao, Y. et al. (2013) "*Brightening of carbon nanotube photoluminescence through the incorporation of sp3 defects*," Nat. Chem 5(10):840-845). Moreover, this arylation chemistry benefits from a wider choice of functional groups as compared to diazonium chemistry (e.g., enabling the incorporation of amine functional groups, which could be used to link nanotubes to complex molecules that cannot be prepared as diazonium salts).

TABLE 6

Tunable defect PL in (6,5)-SWCNTs strongly depends on the Hammett substituent constant (σ) of the terminating moieties of the aryl defects.

| Moiety | Hammett constant (σ)[a] | $E_{11}$ (nm) | $E_{11}^-$ (nm) | ΔEoptical (meV) |
|---|---|---|---|---|
| 4-N(CH$_3$)$_2$ | −0.83 | 990 | 1130 | 155 |
| 4-NH$_2$ | −0.66 | 990 | 1132 | 157 |
| 3,5-(NH$_2$)$_2$ | −0.32 | 990 | 1141 | 166 |
| 4-NHC$_2$H$_4$CONH$_2$ | −0.18 | 985 | 1128 | 160 |
| H | 0 | 984 | 1134 | 167 |
| 1,2,3,4,5-F$_5$[b] | 0.83 | 984 | 1146 | 178 |
| 2,4-(NO$_2$)$_2$[b] | 1.37 | 985 | 1157 | 187 |
| 3,5-(NO$_2$)$_2$ | 1.42 | 983 | 1154 | 187 |

[a]The Hammett constants of the aryl moieties were calculated as a summation of σ$_{ortho}$, σ$_{meta}$ and σ$_{para}$ values.
[b]The moieties in the ortho position were assumed to be 0.75 times their effect in the para position, σ$_{ortho}$ = 0.75 · σ$_{para}$ (Charton, M. (1960) "*The Application of the Hammett Equation to Ortho-Substituted Benzene Reaction Series*," Can. J. Chem. 38(12):2493-2499).

Figure 36:
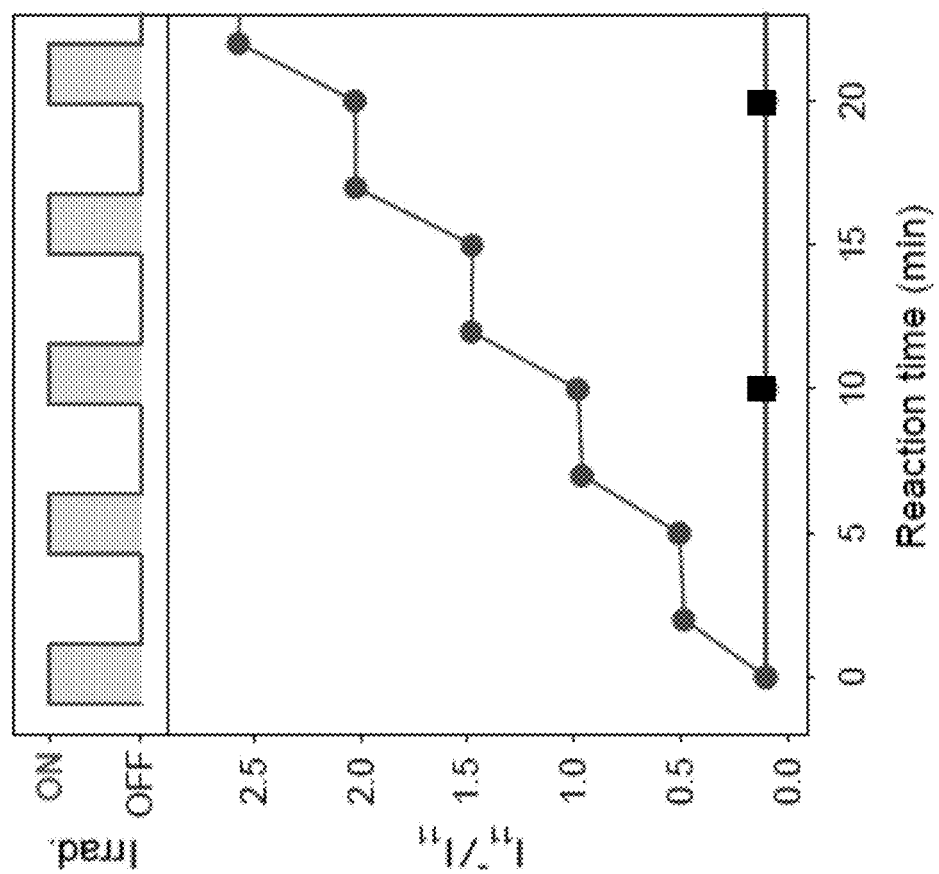
FIG. 36 illustrates precisely controlled synthesis of quantum defects using light in accordance with disclosed methods. The circle data points display the $I_{11}^-/I_{11}$ ratio for a mixture of (6,5)-SWCNTs and 4-iodoaniline that was irradiated for 2 min at 565 nm (ON) and then left for 3 min without irradiation (OFF) in an alternating fashion. The square data points correspond to the thermal control.

This photochemical mechanism enables precise control of the chemical creation of quantum defects with light. To demonstrate this control, a light-switching experiment was conducted to show how the reaction can be readily modulated. The light was switched ON for 2 min, followed by 3 min OFF. This alternating on-off cycle was repeated for up to 45 times. The evolution of the SWCNT PL during the first four on-off cycles are shown in FIG. 36, in which the ratio of $I_{11}^-/I_{11}$ increases significantly during the light exposure periods but stops completely when the light is turned off, demonstrating step-wise reaction progress these conditions. Furthermore, the slope of the PL evolution during each ON cycle is constant, indicating a consistent reaction rate at different cycles within the studied time window.

Programmably Coded Quantum Emitters

As demonstrated herein, fluorescent quantum defects can be programmably patterned into individual SWCNT by the disclosed light activated reaction. Many polymers are known to wrap the carbon nanotube tightly due to the strong non-covalent interactions with the carbon nanotube surface and therefore are used to disperse tubes in various solvent. However, those polymers are not able to introduce quantum defect to the carbon nanotube due to the lack of reactive groups. By synthetically incorporating halide containing moieties into those polymer chains with controlled distance, these modified polymers create quantum defect patterns in the carbon host using the disclosed light activated reaction of the present invention. This is possible because the polymer wrapping brings the aryl halide to the vicinity of the nanotube surface, which enables the electron transfer and covalent bonding formation upon the resonant irradiation of the carbon nanotube.

Figure 37:
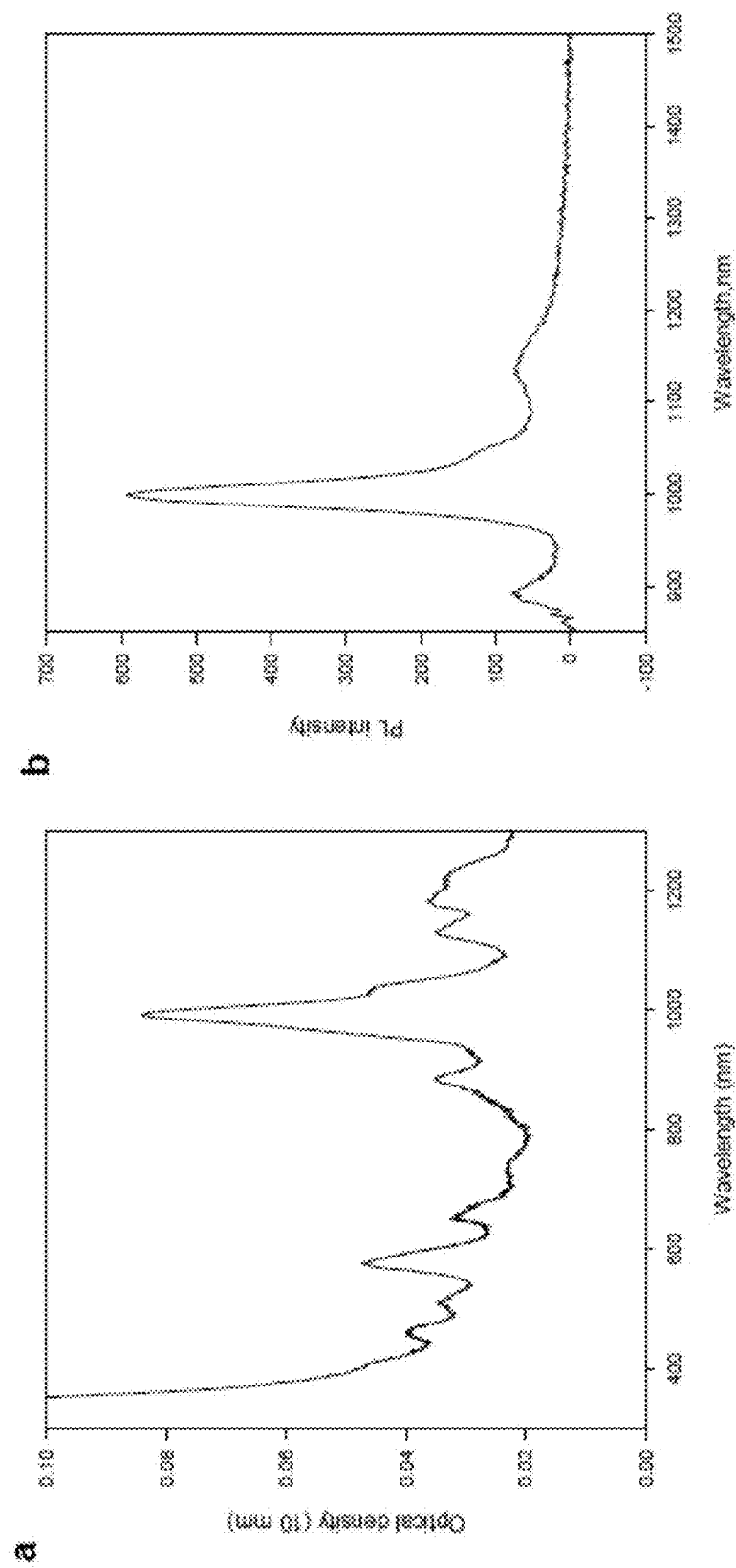
FIG. 37 illustrates the absorption (Panel a) and photoluminescence (Panel b) spectra of the DNA dispersed (6,5) enriched SWCNTs solution.
Figure 38:
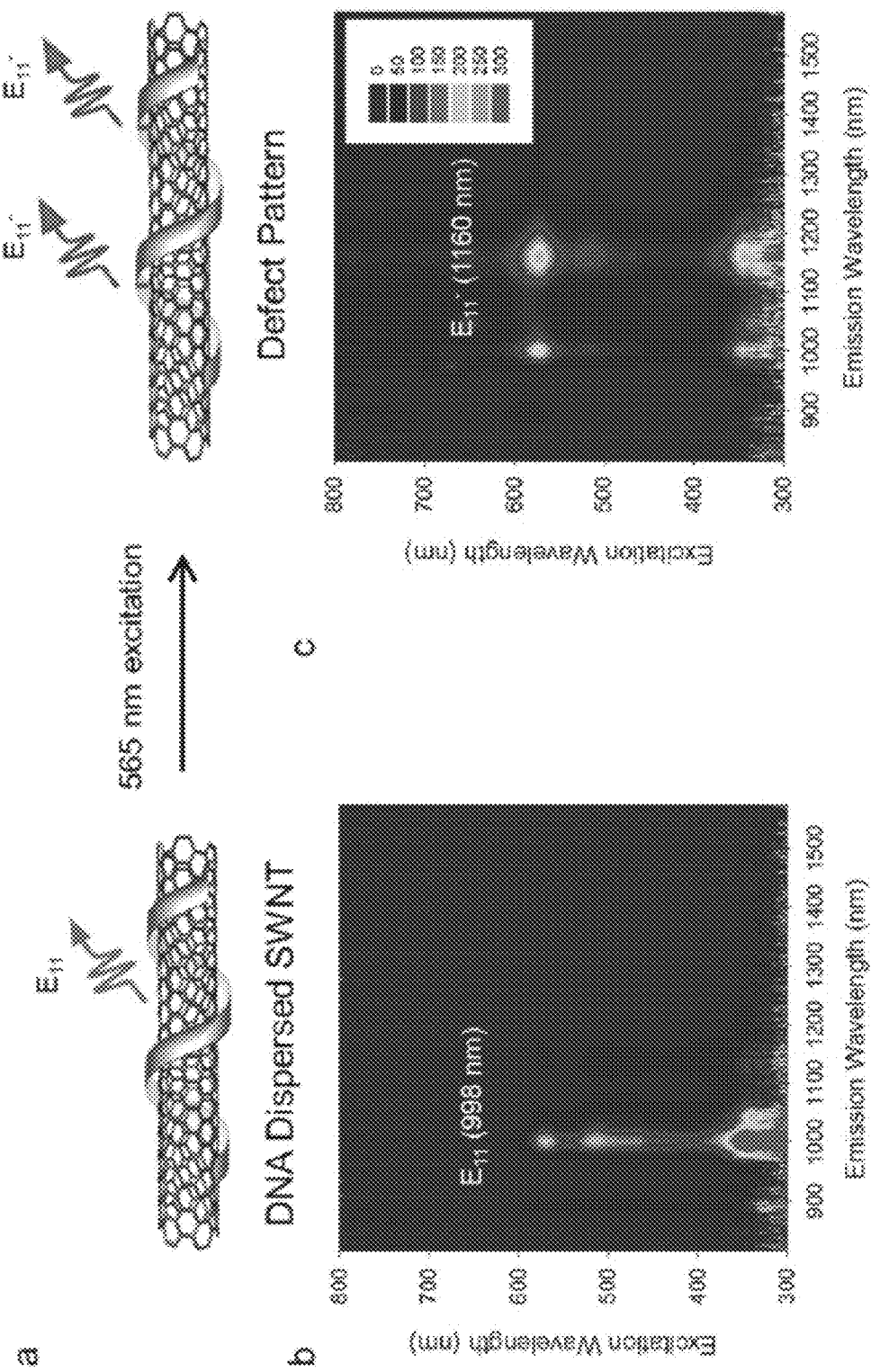
FIG. 38 illustrates schematically the light-triggered photochemical reaction for creating a quantum defect pattern in a single tube using a modified DNA sequence (Panel a). The excitation and emission map of the DNA dispersed (6,5) SWNT enriched solution before (Panel b) and after (Panel c) exposure to 565 nm light.

In support thereof, a DNA sequence containing two binding sites was designed that can be activated by light. DNA is a versatile and low-cost biopolymer that can be easily synthesized to have desired sequence and modification. Here, a sequence (5'-TTA TAT TAT ATT-3') (SEQ ID NO: 1) was adopted that is known to selective wrap (6,5)-SWCNTs and replaced the $4^{th}$ and $7^{th}$ thymine (T) from the 5' end with 5-IododexoyUridine (5I-dU) to generate a new sequence (5'-TTA (5I-dU)AT (5I-dU)AT ATT-3') (SEQ ID NO: 2). Other suitable oligonucleotide sequences include: 5'-GTT GT(5I-dU) GT(5I-dU) G-3' (SEQ ID NO: 3); 5'-TT (5I-dU) ATT TA(5I-dU) TTA T-3' (SEQ ID NO: 4); or 5'-T(5I-dU)A TTA T(5I-dU) A TTG TT-3' (SEQ ID NO: 5). We note that T and 5I-dU have similar structure, so the replacement was less likely to affect the interaction between the carbon nanotube and the DNA. Indeed, the absorption spectrum and photoluminescence spectrum of the DNA dispersed (6,5)-SWCNT showed the carbon nanotube was stabilized as individual particle (FIG. 37). While the DNA dispersed (6,5)-SWCNTs fluoresce at 998 nm ($E_{11}$), exposure to the 565 nm light induced a new PL peak ($E_{11}^-$) at 1160 nm, which is 173.5 meV red-shifted from the $E_{11}$ emission (FIG. 38). The appearance of the new defect PL confirms the creation of quantum defects by the photochemical reaction between the carbon nanotube surface and the 5I-dU moieties in the DNA sequences that wrapped the nanotube. The relative position of two adjacent defect sites is controlled by the distance between the two 5I-dU moieties in a DNA, and therefore can be programmed synthetically.

Thus, programmably coded quantum emitters and the photochemical creation of molecularly tunable, aryl quantum defects in semiconducting SWCNTs have been demonstrated. The reaction is efficiently driven by optically exciting the host in the presence of a halide-containing aryl molecule. As shown, the chemistry does not depend on the solution temperature, but strongly correlates with the photon energy used to drive the reaction. This photochemical mechanism was further supported by DFT calculations, which revealed a consistent energy diagram. As demonstrated herein, the reaction occurs by electron transfer from the excited nanotube to a physically absorbed aryl halide, producing an aryl radical that locally bonds to the carbon lattice in a covalent manner. Unlike photothermal effects, this photochemical mechanism makes it possible to spatially confine the reaction.

As also demonstrated, the quantum defects may be synthetically created stepwise with light. This photochemistry provides for the ability to photolithographically pattern molecularly tunable, fluorescent quantum emitters for applications, e.g., in near-IR imaging (Hong, G. et al. (2015) "*Carbon Nanomaterials for Biological Imaging and Nanomedicinal Therapy*," Chem. Rev. 115(19):10816-10906), chemical sensing (Kwon, H. et al. (2015) "*Optical Probing of Local pH and Temperature in Complex Fluids with Covalently Functionalized, Semiconducting Carbon Nanotubes*," J. Phys. Chem. 119(7):3733-3739; Shiraki, T. et al. (2016) "*Near infrared photoluminescence modulation of single-walled carbon nanotubes based on a molecular recognition approach*," Chem. Commun. (Camb.) 52(88):12972-12975), photonics (He, X. et al. (2017) "*Tunable room-temperature single-photon emission at telecom wavelengths from sp3 defects in carbon nanotubes*," Nat. Photonics 11:577-582), and solid-state quantum electronics (Aharonovich, I. et al. (2016) "*Solid-state single photon emitters*," Nat. Photonics 10:631-641).

In some experiments, (6,5)-SWCNT were utilized as a model system. Other CNTs suitable for use with the present invention include, e.g., (6,5)-SWCNTs, (10,6)-SWCNTs, (10,9)-SWCNTs, (10, 3)-SWCNTs, (6,4)-SWCNTs, and (7,5)-SWCNTs. In addition, the methodologies are extendable to other CNTs having different chiralities, e.g., when the energy levels of the semiconductor host and the halide-containing aryl molecule match such that electron transfer is possible. Energy match for this photochemical chemistry enables selective functionalization of a specific semiconductor host chirality within a mixture, (e.g., SWCNTs, which is preferred for nanotube sorting). Given the demonstrated quantitative photochemical nature, such light control also addresses the challenge of controlling the local atomic configurations of quantum defects (He, X. et al. (2017) "*Low-Temperature Single Carbon Nanotube Spectroscopy of sp3 Quantum Defects.*" ACS Nano 10.1021/acsnano.7b03022; Shiraki, T. et al. (2017) "*Near infrared photoluminescence modulation by defect site design using aryl isomers in locally functionalized single-walled carbon nanotubes*," Chem. Commun. 53:12544-12547).

Thus, while the invention has been described in connection with exemplary embodiments and experiments thereof, it will be understood that it is capable of further modifications and this application is intended to cover any variations, uses, or adaptations of the invention following, in general, the principles of the invention and including such departures from the present disclosure as come within known or customary practice within the art to which the invention pertains and as may be applied to the features hereinbefore set forth.

All identified publications and references are herein incorporated by reference to the same extent as if each individual publication was specifically and individually indicated to be incorporated by reference in its entirety.

What is claimed is:

1. A quantum emitter, comprising:
a semiconductor host;
a fluorescent quantum defect incorporated into said semiconductor host via optically reacting said semiconductor host with a molecule comprising a photochemically activatable moiety that generates a radical that covalently bonds to said semiconductor host.

2. The quantum emitter of claim 1, which comprises a plurality of fluorescent quantum defects spatially, chemically and/or electronically correlated in said semiconductor host.

3. The quantum emitter of claim 1, wherein said semiconductor host is selected from the group consisting of a carbon nanotube (CNT), a graphene nanoribbon, and a carbon nitride.

4. The quantum emitter of claim 3, wherein said carbon nanotube is a single-walled carbon nanotube (SWCNT) or a double-walled carbon nanotube (DWCNT).

5. The quantum emitter of claim 4, wherein said carbon nanotube is a SWCNT selected from the group consisting of a (6,5)-SWCNT, a (10,6)-SWCNT, a (10,9)-SWCNT, a (10,3)-SWCNT, a (6,4)-SWCNT, and a (7,5)-SWCNT.

6. The quantum emitter of claim 1, wherein said molecule is a halide-containing molecule.

7. The quantum emitter of claim 6, wherein said halide is iodine, bromine, or chlorine.

8. The quantum emitter of claim 1, wherein said molecule is an oligonucleotide.

9. The quantum emitter of claim 8, wherein said oligonucleotide is a DNA molecule or an RNA molecule.

10. The quantum emitter of claim 8, wherein said oligonucleotide comprises at least one 5-IododexoyUridine (5I-dU).

11. The quantum emitter of claim 8, wherein said oligonucleotide comprises between 1 and about 1000 nucleotide residues.

12. The quantum emitter of claim 11, wherein said oligonucleotide comprises between 3 and about 100 nucleotide residues.

13. The quantum emitter of claim 12, wherein said oligonucleotide comprises between about 5 and about 20 nucleotide residues.

14. The quantum emitter of claim 10, wherein said oligonucleotide comprises a sequence selected from the group consisting of: SEQ ID NO: 2; SEQ ID NO: 3; SEQ ID NO: 4; and SEQ ID NO: 5.

15. A photochemical method of synthesizing a quantum emitter, comprising the step of:
irradiating a solution comprising a semiconductor host and a molecule comprising a photochemically activatable moiety, thereby exciting the semiconductor host and reducing the molecule to generate a radical,
wherein the radical covalently bonds to the semiconductor host to create a fluorescent quantum defect thereon.

16. The photochemical method of claim 15, wherein said step of irradiating comprises exposing the solution to radiation having a wavelength of between about 100 nm and about 1400 nm.

17. The photochemical method of claim 15, wherein said step of irradiating comprises exposing the solution to visible light.

18. The photochemical method of claim 17, wherein the visible light has a wavelength of 565 nm, 765 nm, 892 nm, or 644 nm.

19. The photochemical method of claim 15, wherein said step of irradiating comprises exposing the solution to radiation having a wavelength that resonates with an electronic transition(s) of the semiconductor host.

20. The photochemical method of claim 15, wherein said step of irradiating comprises exposing the solution to ultraviolet radiation or near-infrared radiation.

21. The photochemical method of claim 15, wherein a plurality of fluorescent quantum defects is created in the semiconductor host.

22. The photochemical method of claim 21, wherein said step of irradiating comprises exposing the solution to patterned radiation, thereby creating a spatially patterned array of fluorescent quantum defects in the semiconductor host.

23. The photochemical method of claim 15, wherein the molecule comprises at least one halide and aromatic moieties, and wherein the at least one halide is directly bonded to at least one of the aromatic moieties.

24. The photochemical method of claim 23, wherein the at least one halide is selected from the group consisting of iodine, bromine, and chlorine.

25. The photochemical method of claim 23, wherein the aromatic moieties are selected from the group consisting of benzene, aniline, nitrobenzene, and benzene sulfonic acid.

26. The photochemical method of claim 15, wherein the molecule comprises at least one halide and aromatic heterocycles, and wherein the at least one halide is bonded to at least one of the aromatic heterocycles.

27. The photochemical method of claim 26, wherein the at least one halide is selected from the group consisting of iodine, bromine, and chlorine.

* * * * *